US006965142B2

(12) United States Patent
Diorio et al.

(10) Patent No.: US 6,965,142 B2
(45) Date of Patent: Nov. 15, 2005

(54) FLOATING-GATE SEMICONDUCTOR STRUCTURES

(75) Inventors: Christopher J. Diorio, Shoreline, WA (US); Todd E. Humes, Shoreline, WA (US)

(73) Assignee: Impinj, Inc., Seattle, WA (US)

( * ) Notice: Subject to any disclaimer, the term of this patent is extended or adjusted under 35 U.S.C. 154(b) by 251 days.

(21) Appl. No.: 10/192,773

(22) Filed: Jul. 9, 2002

(65) Prior Publication Data

US 2003/0206437 A1 Nov. 6, 2003

Related U.S. Application Data

(63) Continuation-in-part of application No. 09/699,059, filed on Oct. 27, 2000, now Pat. No. 6,452,835, which is a continuation of application No. 09/201,327, filed on Nov. 30, 1987, now Pat. No. 6,144,581, which is a division of application No. 08/882,717, filed on Jun. 25, 1997, now Pat. No. 5,898,613, which is a continuation-in-part of application No. 08/845,018, filed on Apr. 22, 1997, now Pat. No. 5,990,512, and a continuation-in-part of application No. 08/721,261, filed on Sep. 26, 1996, now Pat. No. 5,875,126, and a continuation-in-part of application No. 08/690,198, filed on Jul. 26, 1996, now Pat. No. 5,825,063, which is a continuation-in-part of application No. 08/399,966, filed on Mar. 7, 1995, now Pat. No. 5,627,392.

(60) Provisional application No. 60/016,464, filed on Apr. 29, 1996, provisional application No. 60/022,360, filed on Apr. 24, 1996, provisional application No. 60/006,795, filed on Nov. 15, 1995, and provisional application No. 60/004,566, filed on Sep. 29, 1995.

(51) Int. Cl.$^7$ ............................................. H01L 29/788
(52) U.S. Cl. ....................... 257/315; 257/316; 257/321; 257/239; 257/261; 438/201; 438/211; 438/257; 438/594
(58) Field of Search ................................ 257/239, 261, 257/315, 316, 317, 318, 319, 320, 321, 314–323; 438/201, 211, 257, 262, 263, 264, 594

(56) References Cited

U.S. PATENT DOCUMENTS

| 3,893,151 A | 7/1975 | Bosselaar et al. .............. 357/23 |
| 4,420,871 A | 12/1983 | Scheibe ........................ 29/571 |
| 4,622,656 A | 11/1986 | Kamiya et al. .............. 365/185 |

(Continued)

FOREIGN PATENT DOCUMENTS

| EP | 0 298 618 | 1/1989 | |
| EP | 0 562 257 | 3/1992 | ......... H01L/27/115 |
| WO | 00/60672 | 10/2000 | ......... H01L/29/788 |

OTHER PUBLICATIONS

Diorio, et al., "A Floating–Gate MOS Learning Array with Locally Computed Weight Updates", IEEE Transactions on Electron Devices, vol. 44, No. 12, Dec. 1997, pp. 1–10.

(Continued)

*Primary Examiner*—David Nelms
*Assistant Examiner*—Long Tran
(74) *Attorney, Agent, or Firm*—Thelen Reid & Priest LLP; David B. Ritchie

(57) ABSTRACT

Hot-electron injection driven by hole impact ionization in the channel-to-drain junction of a p-channel MOSFET provides a new mechanism for writing a floating-gate memory. Various pFET floating-gate structures use a combination of this mechanism and electron tunneling to implement nonvolatile analog memory, nonvolatile digital memory, or on-line learning in silicon. The memory is nonvolatile because the devices use electrically isolated floating gates to store electronic charge. The devices enable on-line learning because the electron injection and tunneling mechanisms that write the memory can occur during normal device operation. The memory updates and learning are bidirectional because the injection and tunneling mechanisms add and remove electrons from the floating gate, respectively. Because the memory updates depend on both the stored memory and the pFETs terminal voltages, and because they are bidirectional, the devices can implement on-line learning functions.

30 Claims, 40 Drawing Sheets

U.S. PATENT DOCUMENTS

| | | |
|---|---|---|
| 4,783,783 A | 11/1988 | Nagai et al. |
| 4,816,883 A | 3/1989 | Baldi ......................... 357/23.5 |
| 4,822,750 A | 4/1989 | Perlegos et al. .............. 437/52 |
| 4,935,702 A | 6/1990 | Mead et al. .................... 330/9 |
| 4,953,928 A | 9/1990 | Anderson et al. .......... 357/23.5 |
| 5,059,920 A | 10/1991 | Anderson et al. ........... 330/253 |
| 5,068,622 A | 11/1991 | Mead et al. ................. 330/253 |
| 5,099,156 A | 3/1992 | Delbrü ck et al. ....... 307/529 |
| 5,103,116 A | 4/1992 | Sivilotti et al. .......... 307/272.2 |
| 5,146,106 A | 9/1992 | Anderson et al. ........... 307/246 |
| 5,160,899 A | 11/1992 | Anderson et al. ........... 330/288 |
| 5,166,562 A | 11/1992 | Allen et al. ................. 307/571 |
| 5,319,268 A | 6/1994 | Lyon et al. ................. 307/529 |
| 5,331,215 A | 7/1994 | Allen et al. ................. 307/201 |
| 5,336,936 A | 8/1994 | Allen et al. ................. 307/201 |
| 5,345,418 A | 9/1994 | Challa ......................... 365/185 |
| 5,376,813 A | 12/1994 | Delbruck et al. ........... 257/288 |
| 5,463,348 A | 10/1995 | Sarpeshkar et al. ......... 330/253 |
| 5,517,044 A | 5/1996 | Koyama |
| 5,541,878 A | 7/1996 | LeMoncheck et al. . 365/185.03 |
| 5,553,030 A | 9/1996 | Tedrow et al. .............. 365/226 |
| 5,627,392 A | 5/1997 | Diorio et al. ............... 257/315 |
| 5,633,518 A * | 5/1997 | Broze ......................... 257/314 |
| 5,650,346 A * | 7/1997 | Pan et al. .................... 438/201 |
| 5,666,307 A | 9/1997 | Chang .................... 365/185.03 |
| 5,687,118 A * | 11/1997 | Chang .................... 365/185.19 |
| 5,706,227 A | 1/1998 | Chang et al. .......... 365/185.18 |
| 5,710,563 A | 1/1998 | Vu et al. ..................... 341/161 |
| 5,734,288 A | 3/1998 | Dolazza et al. ............. 327/337 |
| 5,736,764 A | 4/1998 | Chang ......................... 257/318 |
| 5,761,121 A | 6/1998 | Chang et al. .......... 365/185.14 |
| 5,763,912 A | 6/1998 | Parat et al. ................. 257/315 |
| 5,777,361 A | 7/1998 | Parris et al. ................ 257/322 |
| 5,777,926 A | 7/1998 | Trinh et al. ............. 365/185.19 |
| 5,796,656 A | 8/1998 | Kowshik et al. ....... 365/185.23 |
| 5,798,967 A | 8/1998 | Sarin et al. ............ 365/185.21 |
| 5,801,994 A | 9/1998 | Chang et al. .......... 365/185.29 |
| 5,825,063 A | 10/1998 | Diorio et al. ............... 257/316 |
| 5,841,165 A | 11/1998 | Chang et al. ............... 257/318 |
| 5,875,126 A | 2/1999 | Minch et al. .......... 365/185.01 |
| 5,898,613 A | 4/1999 | Diorio et al. .......... 365/185.03 |
| 5,901,084 A | 5/1999 | Ohnakado .............. 365/185.18 |
| 5,914,894 A | 6/1999 | Diorio et al. .......... 365/185.03 |
| 5,933,039 A | 8/1999 | Hui et al. |
| 5,939,945 A | 8/1999 | Thewes et al. |
| 5,944,837 A | 8/1999 | Talreja et al. ............... 713/600 |
| 5,966,329 A | 10/1999 | Hsu et al. ............... 365/185.18 |
| 5,972,804 A | 10/1999 | Tobin et al. |
| 5,982,669 A | 11/1999 | Kalnitsky et al. ...... 365/185.28 |
| 6,055,185 A | 4/2000 | Kalnitsky et al. ...... 365/185.18 |
| 6,081,451 A | 6/2000 | Kalnitsky et al. ...... 365/185.18 |
| 6,125,053 A | 9/2000 | Diorio et al. .......... 365/185.03 |
| 6,134,182 A | 10/2000 | Pilo et al. |
| 6,137,721 A | 10/2000 | Kalnitsky et al. ...... 365/185.18 |
| 6,137,722 A | 10/2000 | Kalnitsky et al. ...... 365/185.18 |
| 6,137,723 A | 10/2000 | Bergemont et al. .... 365/185.18 |
| 6,137,724 A | 10/2000 | Kalnitsky et al. ...... 365/185.18 |
| 6,144,581 A | 11/2000 | Diorio et al. .......... 365/185.03 |
| 6,166,954 A | 12/2000 | Chern .................... 365/185.14 |
| 6,190,968 B1 | 2/2001 | Kalnitsky et al. ........... 438/259 |
| 6,208,557 B1 | 3/2001 | Bergemont et al. .... 365/185.15 |
| 6,320,788 B1 | 11/2001 | Sansbury et al. |
| 6,384,451 B1 | 5/2002 | Caywood |
| 6,407,870 B1 | 6/2002 | Hurevich et al. |
| 6,479,863 B2 | 11/2002 | Caywood |
| 6,534,816 B1 | 3/2003 | Caywood |
| 6,580,642 B1 | 6/2003 | Wang |

OTHER PUBLICATIONS

Diorio, et al, "A High–Resolution Non–Volatile Analog Memory Cell", IEEE Intl. Symp. On Circuits and Systems, vol. 3, 1995, pp. 2233–2236.

Grey, et al., "Analysis and Design of Analog Integrated Circuits", Second Edition, University of California, Berkeley, 1984, pp. 66–71.

Hasler, et al., "An Autozeroing Amplifier Using PFET Hot–Electron Injection", IEEE, 1996.

Hasler, et al., "An autozeroing Floating–Gate Amplifier", IEEE Journal of Solid State Circuits, Draft Copy, pp. 1–15.

Hasler, et al., "Single Transistor Learning Synapses", Cambridge, MA, The MIT Press, 1995, pp. 817–824.

Hasler, et al., "Single Transistor Learning Synapse with Long Term Storage", IEEE, 1995, pp. 1660–1663.

Hochet, et al., "Implementation of a Learning Kohonen Neuron Based on a New Multilevel Storage Technique", IEEE Journal of Solid–State Circuits, vol. 26, No. 3, Mar. 1991, pp. 262–267.

Hollis, et al., "A Neural Network Learning Algorithm Tailored for VLSI Implementation", IEEE Transactions on Neural Networks, vol. 5, No. 5, Sep. 1994, pp. 784–791.

Hu, et al., "Hot–Electron–Induced MOSFET Degradation-Model, Monitor, and Improvement", IEEE Transactions on Electron Devices, vol. ED–32, No. 2, Feb. 1985, pp. 375–385.

Ismail, et al., "Neural Information Processing II", Analog VLSI Signal and Information Processing, 1994, pp. 358–413.

R. Colin Johnson, "Mead Envisions New Design Era", Electronic Engineering Times, Jul. 17, 1995, p. 1, 37 and 38.

R. Colin Johnson, "Neural Team Bares Silicon Brain", Electronic Engineering Times, Jul. 3, 1995, pp. 30–31.

Lazzaro, et al., "Systems Technologies for Silicon Auditory Models", IEEE, Jun. 1994, pp. 7–15.

Lazzaro, et al., "Winner–Take–All Networks of O(N) Complexity", 1989, pp. 703–711.

Leblebici, et al., "Hot–Carrier Reliability of MOS VLSI Circuits", University of Illinois, Oxide Degradation Mechanisms, 1993, pp. 46–49.

Masuoka, et al., "Reviews and Prospects of Non–Volatile Semiconductor Memories", IEICE Transactions, vol. E–74, No. 4, Apr. 1991, pp. 868–874.

Mead, "Differentiators", Chapter 10, Analog VLSI and Neural Systems, 1989, pp. 163–173.

Mead, et al., "MOS Devices and Circuits", Introduction to VLSI Systems, 1980, pp. 1–5.

Minch, et al., "A vMOS Soft–Maximum Current Mirror", Computation and Neural Systems, IEEE, 1995, pp. 2249–2252.

Minch, et al., "Translinear Circuits Using Subthreshold Floating–Gate MOS Transistors", Analog Integrated Circuits and Signal Processing, 9, 1996, pp. 167–179.

Ohsaki, et al., "A Single Poly EEPROM Cell Structure for Use in Standard CMOS Processes", IEEE Journal of Solid-State Circuits, vol. 29, No. 3, Mar. 1994, pp. 311–316.

Sanchez, "Review of Carrier Injection in the Silicon/Silicon–Dioxide System", IEE Proceedings–G, vol. 138, No. 3, Jun. 1991, pp. 377–389.

Sarpeshkar, et al., "A Low–Power Wide–Linear–Range Transconductance Amplifier", Analog Integrated Circuits and Signal Processing, vol. 13, No. 1–2, May–Jun. 1997, pp. 123–151.

Sarpeshkar, et al., "White Noise in MOS Transistors and Resistors", Circuits and Devices, IEEE, Nov. 1993, pp. 23–29.

Tsividis, et al., "Continuous–Time MOSFET–C Filters in VLSI", IEEE Transactions on Circuits and Systems, vol. CAS–33, No. 2, Feb. 1986, pp. 125–140.

Umezawa, et al., "A 5–V–Only Operation 0.6-$\mu$m Flash EEPROM with Row Decoder Scheme in Triple–Well Structure", IEEE Journal of Solid–State Circuits, vol. 27, No. 11, Nov. 1992, pp. 1540–1546.

Vittoz, "Dynamic Analog Techniques" 1985, Design of MOS VLSI Circuits for Telecommunications, Prentice Hall, pp. 145–170.

Vittoz, "Dynamic Analog Techniques", Design of Analog-Digital VLSI Circuits for Telecommunications and Signal Processing, Chapter 4, 1994, pp. 97–124.

Vittoz, "Continuous–Time filters", Design of Analog–Digital VLSI Circuits for Telecommunications and Signal Processing, Chapter 6, 1994, pp. 177–211.

L. Richard Carley, "Trimming Analog Circuits Using Floating–Gate Analog MOS Memory", IEEE Journal of Solid-State Circuits, 1989, pp 1569–1575.

* cited by examiner

FLOATING-GATE SEMICONDUCTOR STRUCTURES

CROSS-REFERENCE TO RELATED APPLICATIONS

This application is a continuation-in-part of U.S. patent application Ser. No. 09/699,059 filed Oct. 27, 2000 in the names of Christopher J. Diorio and Carver A. Mead, now U.S. Pat. No. 6,452,835 issued on Sep. 17, 2002 and commonly owned herewith. That application is, in turn, a continuation of U.S. patent application Ser. No. 09/201,327 filed Nov. 30, 1998, now U.S. Pat. No. 6,144,581 issued on Nov. 7, 2000. U.S. patent application Ser. No. 09/201,327 is a divisional of U.S. patent application Ser. No. 08/882,717 filed Jun. 25, 1997, now U.S. Pat. No. 5,898,613 issued on Apr. 27, 1999 which is, in turn, a continuation-in-part of: (1) U.S. patent application Ser. No. 08/690,198 filed Jul. 26, 1996, now U.S. Pat. No. 5,825,063 issued on Oct. 20, 1998; (2) U.S. patent application Ser. No. 08/721,261 filed Sep. 26, 1996, now U.S. Pat. No. 5,875,126 issued on Feb. 23, 1999; and (3) U.S. patent application Ser. No. 08/845,018 filed Apr. 22, 1997, now U.S. Pat. No. 5,990,512 issued on Nov. 23, 1999. U.S. Pat. No. 5,990,512 claims the benefit of: (1) U.S. Provisional Patent Application Ser. No. 60/016,464 filed Apr. 29, 1996 and (2) U.S. Provisional Patent Application Ser. No. 60/022,360 filed Jul. 24, 1996 (as do its progeny) and is a continuation-in-part of: (1) U.S. patent application Ser. No. 08/399,966 filed Mar. 7, 1995, now U.S. Pat. No. 5,627,392; (2) U.S. patent application Ser. No. 08/721,261 filed Sep. 26, 1996, now U.S. Pat. No. 5,875,126; and (3) U.S. patent application Ser. No. 08/690,198 filed Jul. 26, 1996, now U.S. Pat. No. 5,825,063. U.S. Pat. No. 5,875,126 claims the benefit of U.S. Provisional Patent Application Ser. No. 60/004,566 filed Sep. 29, 1995 (as do its progeny). U.S. Pat. No. 5,986,927 issued on Nov. 16, 1999, from U.S. patent application Ser. No. 09/189,595 filed Nov. 10, 1998 is a divisional of U.S. patent application Ser. No. 08/721,261. U.S. Pat. No. 5,898,613 claims the benefit of U.S. Provisional Patent Application Ser. No. 60/022,360 filed Jul. 24, 1996 (as do its progeny) and is a continuation-in-part of U.S. patent application Ser. Nos. 08/845,018 filed Apr. 27, 1997, U.S. Pat. No. 5,990,512 and 08/721,261 filed Sep. 20, 1996, U.S. Pat. No. 5,875,126. U.S. Pat. No. 5,825,063 claims the benefit of U.S. Provisional Patent Application Ser. No. 60/006,795 filed Nov. 15, 1995 (as do its progeny) and is a continuation-in-part of U.S. patent application Ser. No. 08/399,966 filed Mar. 7, 1995, now U.S. Pat. No. 5,627,392 issued on May 6, 1997. U.S. Pat. No. 5,914,894 issued on Jun. 22, 1999, based on U.S. patent application Ser. No. 09/088,655 filed Jun. 1, 1998, and is a divisional of U.S. patent application Ser. No. 08/690,198. U.S. Pat. No. 6,125,053 issued on Sep. 26, 2000, based on U.S. patent application Ser. No. 09/201,677 filed Nov. 30, 1998, is a divisional of U.S. patent application Ser. No. 08/882,717.

STATEMENT OF GOVERNMENT RIGHTS IN THE INVENTION

The present invention was made with support from the United States Government under grant number N00014-89-J-1675 awarded by the Office of Naval Research of the Department of the Navy and under grant number N00014-89-J-3083 awarded by the Advanced Research Projects Agency of the Department of Defense. The United States Government may have certain rights in the invention.

FIELD OF THE INVENTION

The present invention is directed to the field of floating gate semiconductor structures.

BACKGROUND OF THE INVENTION

The scaling of silicon integrated-circuit processing to deep-submicron feature sizes poses significant challenges for SOC (systems-on-a-chip) design. On the positive side, scaling increases the density and speed of digital CMOS (complementary metal oxide semiconductor). On the negative side, scaling burdens analog CMOS with low transistor-breakdown voltages, poor transistor matching, and limited dynamic range. SOC applications typically require deep-submicron CMOS for the digital circuitry, but have analog inputs and/or outputs. To enable mixed-signal SOC applications, engineers need a simple way to design precision analog circuits side-by-side with digital logic, in standard digital CMOS processes. One approach that holds huge promise is to use self-tuning transistors that adapt locally to improve circuit performance. If engineers had a simple means to incorporate local parallel adaptation in their silicon chips, they could greatly advance SOC performance and applications. Unfortunately, large-scale local learning in silicon has so far eluded researchers. A primary reason is the lack of a simple way to enable nonvolatile analog on-line adaptation in CMOS circuits.

Prior art floating gate transistors, which use electrical charge stored on a floating polysilicon gate embedded in an insulator such as silicon dioxide, provide suitable nonvolatile analog storage. The charge on such a floating gate is known to remain fixed for periods of many years. Although the advantages of using floating gate transistors as memory elements are well known, their application to silicon learning networks and analog memory cells has been limited. The principal reason has been the lack of suitable bidirectional and self-convergent mechanisms for writing the analog memory. Because the gate of a floating gate transistor is completely embedded within an insulator, writing the memory involves moving charge carriers through this insulator. Many mechanisms are known which will move electrons through an insulator. Two are tunneling and hot-electron injection.

The difficulty in transporting electrons across the barrier presented by the silicon/oxide interface is depicted in FIG. 1. Surmounting the barrier 10 requires that an electron possess more than about 3.1 eV of energy. At room temperature the probability that semiconductor electrons will possess this energy is exceedingly small. Alternatively, an electron could tunnel through this barrier; however, at the oxide thicknesses required for nonvolatile storage the tunneling probability is also exceedingly small.

Fowler-Nordheim (FN) tunneling involves applying a voltage across the oxide 12, as shown in FIG. 2 which enhances the probability of an electron tunneling through it. Tunneling current versus oxide voltage for a 400 Å $SiO_2$ gate oxide typical of a 2 micron MOS (metal oxide semiconductor) process is shown in FIG. 3. Bidirectional currents through the oxide are required to achieve the learning and unlearning functions necessary in a silicon learning cell, and the writing and erasing necessary in an analog memory cell. Although the tunneling process has no preferred direction, bidirectional tunneling requires either dual polarity high voltages, or a single polarity high voltage and a means for pulling the floating gate to this voltage when adding electrons, and pulling it near ground when removing them. Both approaches are unattractive. The dual polarity solution requires a negative voltage much lower than the substrate potential; the single polarity solution does not support simultaneous memory reading and writing or self-convergent memory writes.

Single polarity bidirectional tunneling is often used in writing digital EEPROMs (electrically eraseable programmable read-only memories). Since writing the memory involves pulling the floating gate either to the supply voltage or to ground, the EEPROM cell cannot be read during the write process. Excess charge is typically added to the floating gate to compensate for this lack of memory state feedback. Although excess charge is acceptable when writing a binary valued "digital" memory, where the exact quantity of charge is irrelevant once it exceeds the amount necessary to completely switch the device to one of its two binary states, uncertainty in the amount of charge applied to an analog memory cell may result in significant memory error. Because the memory-write process is not self-convergent, analog EEPROMs use iterative writes. This need has not been satisfied adequately by commercial nFET (n-channel field effect transistor) EEPROMs, primarily because conventional EEPROM transistors do not permit simultaneous memory reading and writing. Most analog EEPROM implementations require iterative writes: first the memory is written, then it is read; the written and read values then are compared, and the error is used to write a correction. This cycle is repeated until the error is within prescribed bounds.

Hot-electron injection is a process whereby electrons near the surface of a semiconductor acquire more than about 3.1 eV of energy, typically by acceleration in an electric field, and then surmount the silicon/oxide barrier. Once in the silicon dioxide conduction band, an electric field applied across the oxide carries these electrons to the floating gate. There are a number of ways of accomplishing hot-electron injection.

One source for a high electric field is the collector-to-base depletion region of either a vertical or lateral bipolar junction transistor (BJT). An example of a lateral BJT used in a similar application is shown in U.S. Pat. No. 4,953,928 to Anderson, et al. Although this device is suitable for analog learning applications, each learning cell requires both an injection BJT and a MOSFET (metal oxide semiconductor field effect transistor), the former to effect hot-electron injection and the latter to read the stored charge. A reduction in the number of transistors per cell would be highly desirable.

Another source for a high electric field is in the channel region of a split-gate n– type MOSFET. Split-gate injectors, as shown and described in U.S. Pat. No. 4,622,656 to Kamiya, et al., contain two partially overlapping gate regions at very different voltages. The resulting surface potential drops abruptly at the interface between the two gates, creating a high electric field localized in this small region of the transistor channel. Unfortunately, since the control gate modulates the injection rate but does not receive the injected charge, the memory cannot be both written and read simultaneously. Such a device is acceptable for digital EEPROMs but is unsuitable for analog learning cell or analog memory applications.

A third source for high electric field is the drain to source voltage dropped across the channel region of an above-threshold sub-micron n– type MOSFET. The disadvantage of this device is that in order to achieve injection, both the drain and gate voltages must exceed approximately 2.5 volts which results in high channel current and consequent high power consumption.

A fourth source for high electric field is the drain to channel depletion region formed in an n– type MOSFET. In a conventional MOSFET, as depicted in FIGS. 4–5, this field only exists when the drain-to-source voltage exceeds 2.5 volts and the transistor is operated at or near its subthreshold regime. Since subthreshold MOSFET gate voltages are typically less than one volt, electrons injected into the gate oxide encounter a large electric field directed towards the transistor drain, opposing their transport to the floating gate. The resulting charge transfer to the floating gate is negligibly small as can be seen in the FIG. 5 energy band diagram of the transistor of FIG. 4.

Accordingly, there is a need for an improved silicon analog memory cell (useable as well for digital value storage) which can be written and erased, written and read simultaneously, and realized in a single device.

Additionally, implementations which are suitable in standard logic CMOS processes are preferable. A logic CMOS process is any silicon process capable of fabricating p– type and n– type FETs with the minimal number of processing steps. Additional steps, for example double-polysilicon processes, increase the cost of fabricating such memory devices.

BRIEF DESCRIPTION OF THE INVENTION

Hot-electron injection driven by hole impact ionization (IHEI) in the channel-to-drain junction of a p-channel MOSFET provides a new mechanism for writing a floating-gate memory. Various pFET floating-gate structures use a combination of this mechanism and electron tunneling to implement nonvolatile analog memory, nonvolatile digital memory, or on-line learning in silicon. The memory is nonvolatile because the devices use electrically isolated floating gates to store electronic charge. The devices enable on-line learning because the electron injection and tunneling mechanisms that write the memory can occur during normal device operation. The memory updates and learning are bidirectional because the injection and tunneling mechanisms add and remove electrons from the floating gate, respectively. Because the memory updates depend on both the stored memory and the pFETs terminal voltages, and because they are bidirectional, the devices can implement on-line learning functions.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 12A is an electrical schematic diagram of an example circuit; FIG. 12B is a plot of the output of a SPICE simulation showing the pFET's drain voltage $V_d$ and drain current $I_d$ during a write. First, electrons are tunneled off the floating gate so $I_d$<$I_{ref}$ (not shown in the simulation), then tunneling is stopped, then writing begins. Switch $SW_1$ is closed at t=0, causing $V_d$ to drop, electrons to inject onto the floating gate, and $I_d$ to rise. As $I_d$ approaches $I_{ref}$, $V_d$ rises, turning off the injection. $I_d$ reaches 99% of its final value in 140 μs. The memory is read by applying $V_d$=1.7V and measuring $I_d$, with an accuracy that depends on the circuit details but can be better than 1%. The simulation parameters were $V_{dd}$=6V, C=5 fF, $I_{ref}$=10 μA.

DETAILED DESCRIPTION

Figure 1:
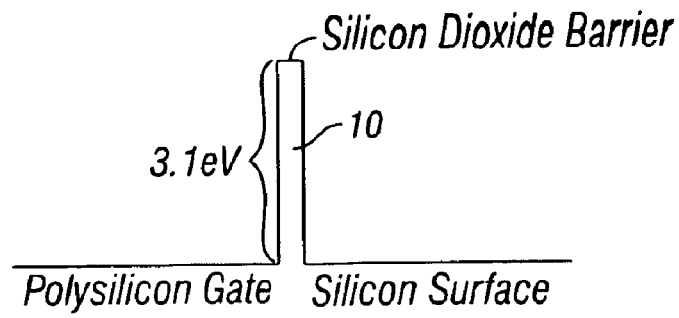
FIG. 1 is an energy band diagram showing the potential barrier faced by a conduction electron at a silicon/oxide interface.
Figure 2:
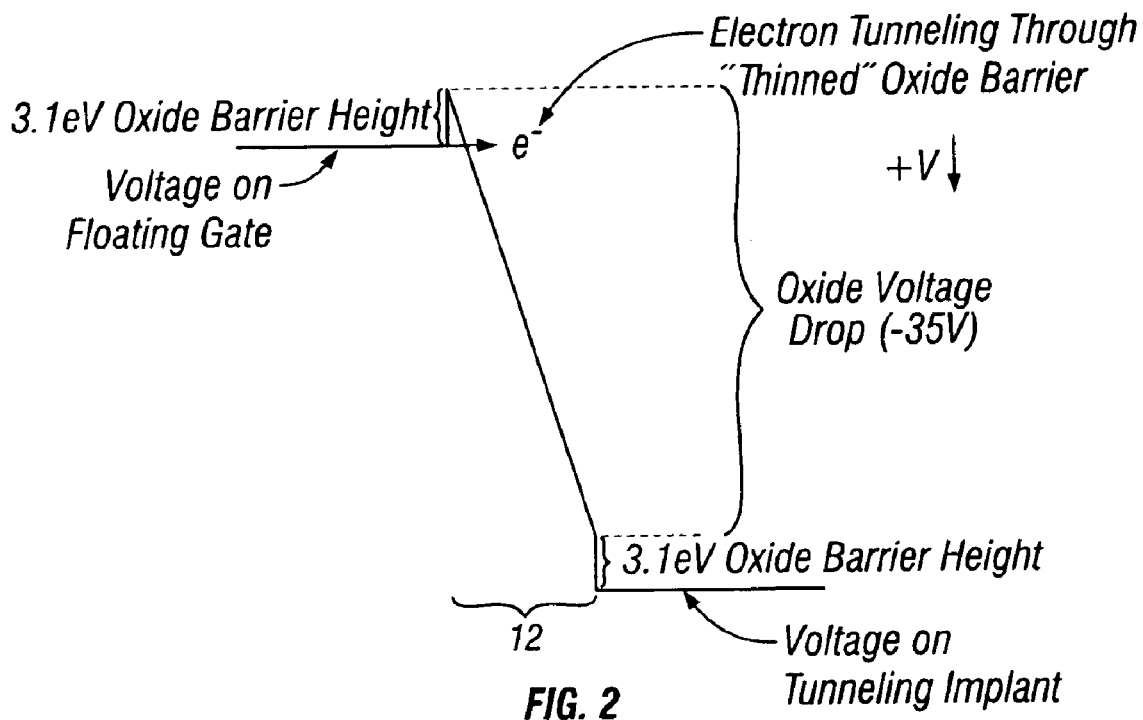
FIG. 2 is an energy band diagram showing the potential faced by an electron in silicon attempting to pass through a silicon dioxide barrier in the presence of a Fowler-Nordheim tunneling potential.
Figure 3:
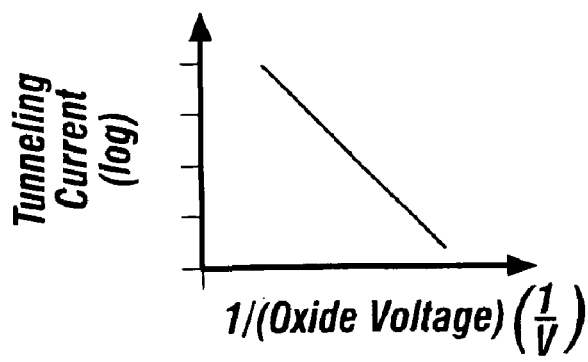
FIG. 3 is a diagram showing a semi-log plot of tunneling current versus oxide voltage for a gate oxide tunneling junction.

Embodiments of the present invention are described herein in the context of floating gate semiconductor structures. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

As used herein, the symbol n+ indicates an n– doped semiconductor material typically having a doping level of n– type dopants on the order of $10^{21}$ atoms per cubic centimeter. The symbol n– indicates an n– doped semiconductor material typically having a doping level on the order of $10^{17}$ atoms per cubic centimeter. The symbol p+ indicates a p– doped semiconductor material typically having a doping level of p– type dopants on the order of $10^{21}$ atoms per cubic centimeter. The symbol p– indicates a p– doped semiconductor material typically having a doping level on the order of $10^{17}$ atoms per cubic centimeter. Those of ordinary skill in the art will now realize that the devices described herein may be formed on a conventional semiconductor substrate or they may as easily be formed as a thin film transistor (TFT) above the substrate, or on an insulator (SOI) or on glass (SOG). Such persons of ordinary skill in the art will now also realize that a range of doping concentrations around those described above will also work. Essentially, any process capable of forming pFETs and nFETs will work. Doped regions may be diffusions or they may be implanted.

The present invention is directed to a family of devices we call synapse transistors that implement long-term nonvolatile analog memory, allow bidirectional memory updates, learn from an input signal without interrupting the ongoing computation, and facilitate local, long-term adaptation in silicon. These synapse transistors enable, among other things, self-tuning analog circuits in digital CMOS, silicon circuits that learn autonomously and various forms of memory storage.

While synapse transistors cannot model the complex behavior of a neural synapse completely, they do implement long-term local learning: their output depends not only on a present input, but also on a history of prior inputs. Synapse transistors allow the fabrication of silicon chips that learn and adapt locally and autonomously, in a fashion similar to that used by biology to tune its circuits. Using them it is possible to build both precision analog circuits, and artificial learning networks, in digital CMOS.

A pFET Synapse Transistor

A synapse transistor is a conventional transistor with the following additional attributes: (1) nonvolatile analog weight storage, (2) locally computed bidirectional weight updates, and (3) simultaneous memory reading and writing. Floating-gate MOSFETs are used herein as the basis for synapse transistors. Synapse transistors use floating-gate charge to represent the nonvolatile analog weight, electron tunneling and hot-electron injection to modify the floating-gate charge bidirectionally, and allow simultaneous memory reading and writing by nature of the mechanisms used to write the memory. Various versions of a pFET synapse are described herein in detail because of its compatibility with standard digital CMOS processing.

Figure 6:
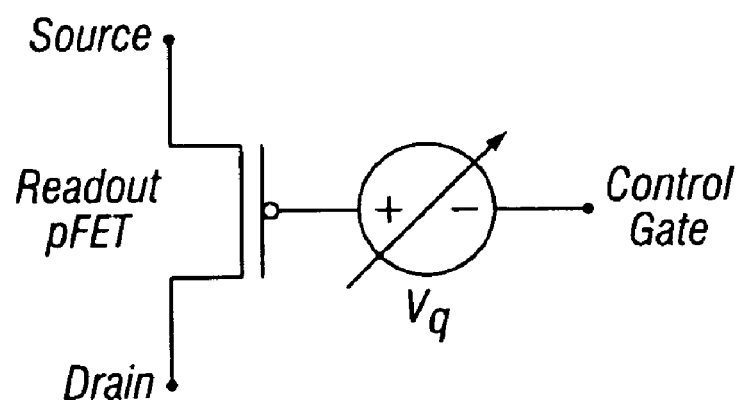
FIG. 6 is a simplified circuit model for a pFET synapse. Electron tunneling and injection modify the gate offset voltage $V_q$.
Figure 7A:
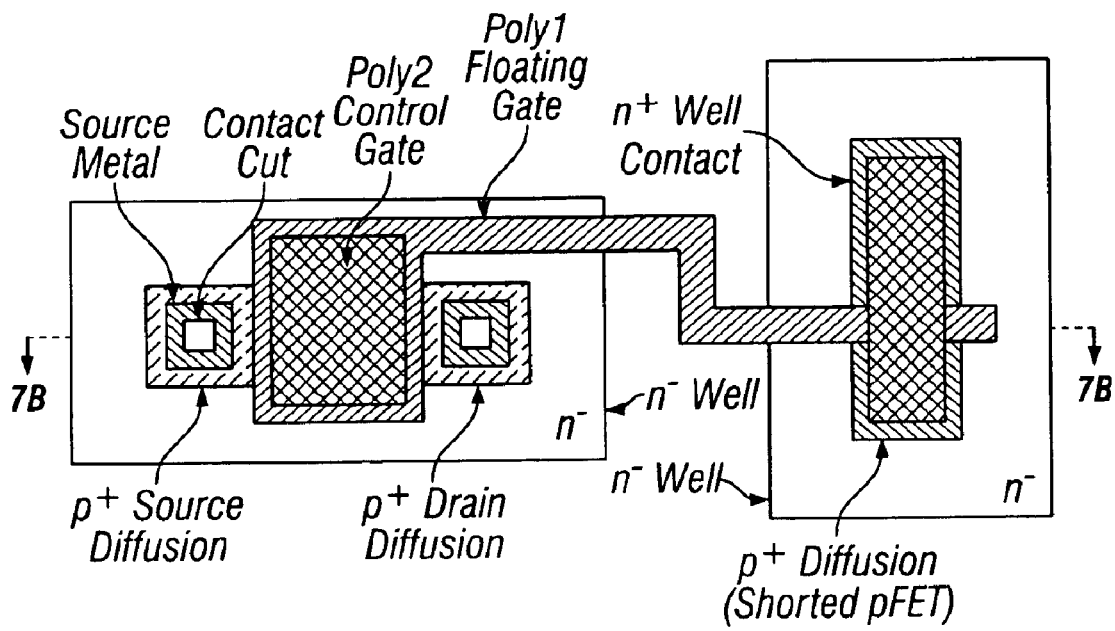
FIG. 7 is A pFET synapse, showing the electron tunneling and injection locations. The three diagrams (7A, 7B and 7C) are aligned vertically. The vertical is exaggerated in FIG. 7B, and subthreshold operation ($I_s$<100 nA) is assumed with the device implemented in a 0.35 μm process. Although the gate oxide's band diagram projects vertically; to better illustrate the injection process it is rotated by 90° and drawn in the channel direction. Synapse weight is decreased by tunneling electrons to the tunneling junction; it is increased by injecting electrons from the drain region to the floating gate. In this embodiment the tunneling junction comprises a shorted pFET in an n– well, for two reasons. First, a lightly doped n– well can accommodate high positive voltages without pn-junction breakdown to substrate. Second, a shorted pFET in an n– well is a valid structure (that satisfies design rules) in any CMOS process.
Figure 7B:
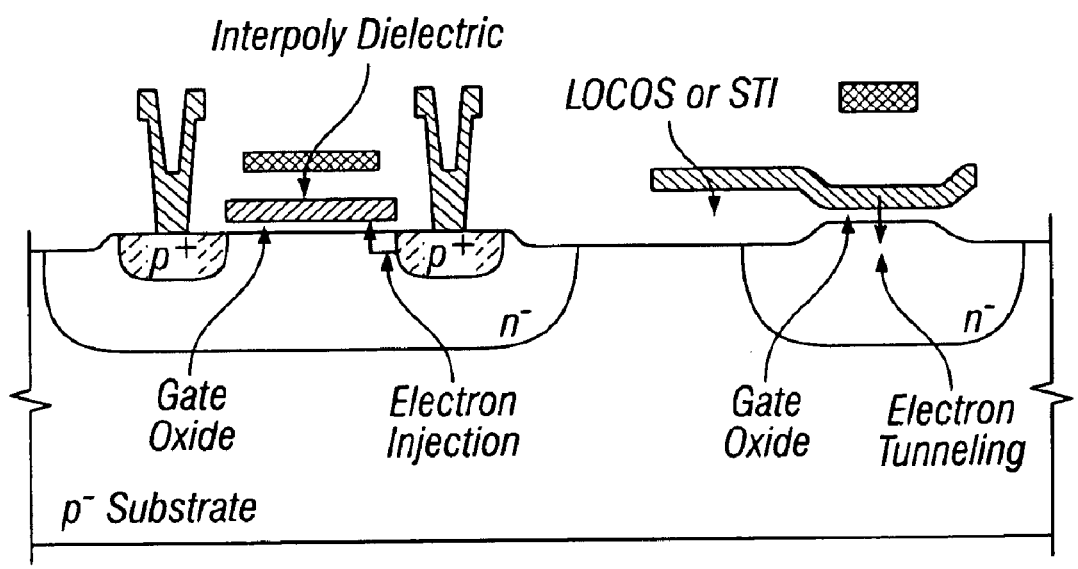
Figure 7C:
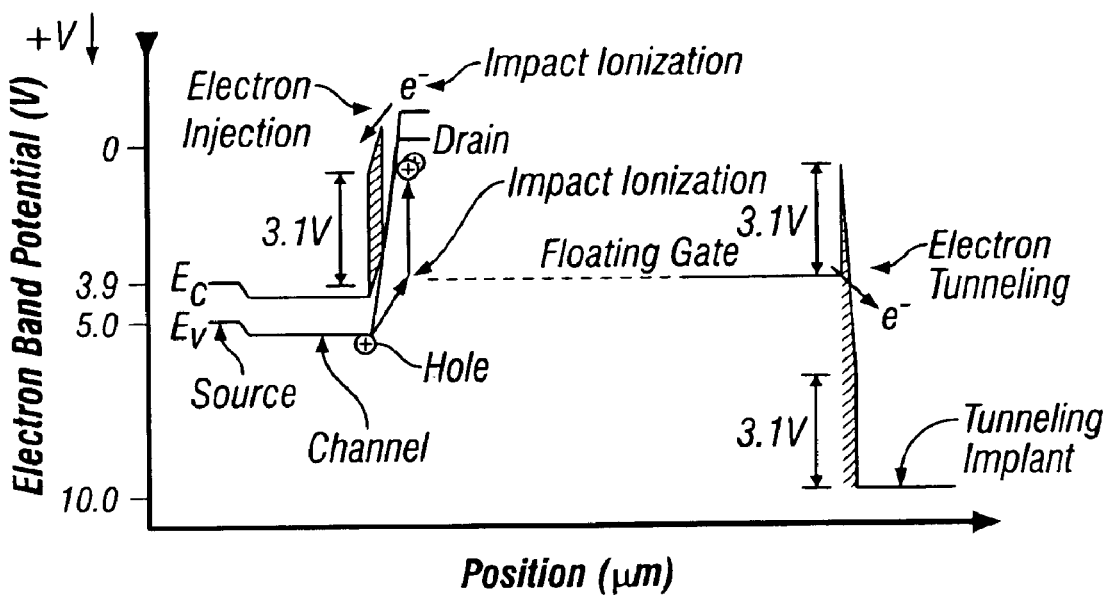

A conceptual model for a pFET synapse in illustrated in FIG. 6, and the layout and band diagram of one embodiment of a pFET synapse is illustrated in FIG. 7. (Later on a large number of variants on this basic design are explained in detail). The synapse transistor of FIG. 7 comprises two MOSFETs: The first (on the left) is a readout transistor; the second (on the right), with shorted drain and source, forms a tunneling junction. From the control-gate's perspective, removing electrons from or adding electrons to the floating gate shifts the readout pFET's threshold voltage bidirectionally. The synapse uses Fowler-Nordheim (FN) tunneling to remove electrons from its floating gate, and impact-ionized hot-electron injection (IHEI) to add electrons to the floating gate. In accordance with this embodiment, each MOSFET is disposed in its own n– well of a p– substrate. A double poly process is used which provides a capacitively coupled control gate. P+ doped regions are used for the source and drain of the readout transistor. Portions A, B and C of FIG. 7 are aligned vertically to show, respectively, a top view, a side cross-sectional view, and an electron band diagram.

Key features of this synapse are (A) the readout transistor remains a fully functional p-channel MOSFET; (B) high voltages applied to the tunneling junction tunnel electrons off the floating gate; (C) large drain-to-source voltages cause IHEI at the drain, injecting electrons onto the floating gate.

In accordance with the FIG. 7 embodiment, signal inputs are applied to the second-level polysilicon (poly2) control gate, which, in turn, couples capacitively to the first-level polysilicon (poly1) floating gate (see FIG. 7). From the control gate's perspective the transistor remains a conventional p-channel MOSFET, albeit with reduced coupling to the channel because of the intervening poly1 capacitor.

If the MOSFET is operated in its subthreshold regime, the synapse transistor is well suited for neural network applications. The reason is that a subthreshold floating-gate pFET performs a multiply operation as follows:

$$I_s = I_o e^{\frac{\kappa V_{sfg}}{U_t}} = I_o e^{\frac{\kappa(Q_{sfg}+C_{in}V_{in})}{C_T U_t}} = I_o e^{\frac{Q_{sfg}}{Q_T}} e^{\frac{\kappa' V_{in}}{U_t}} \quad (1)$$

$$= W I_o e^{\frac{\kappa' V_{in}}{U_t}} \quad (2)$$

where $I_s$ is the source current, $I_o$ is a pre-exponential current, $\kappa$ is the coupling coefficient from floating gate to channel, $V_{sfg}$ is the source-to-floating-gate voltage, $Q_{sfg}$ is the floating-gate charge (source referenced), $C_T$ is the total capacitance seen by the floating gate, $U_t$ is the thermal voltage kT/q, $C_{in}$ is the input (poly1 to poly2) coupling capacitance, $V_{in}$ is the control-gate voltage, $Q_T \equiv C_T U_t/\kappa$, $\kappa' \equiv \kappa C_{in}/C_T$, and $W \equiv \exp(Q_{sfg}/Q_T)$. The synapse weight W is a learned quantity: Its value derives from the floating-gate charge, which can change with synapse use. The synapse output is the product of W and the source current of an idealized MOSFET that has a control-gate input $V_{in}$, and a coupling coefficient $\kappa'$ from the control gate to the channel.

For CMOS processes without poly2 a MOSCAP (MOS variable capacitor: implementable, for example, as a floating gate pFET with its source, drain and well contact coupled together) as an input capacitor, or, for applications that can tolerate the (small) charge leakage that occurs when a contact is added to the floating gate, the floating gate can be connected to a metal-insulator-metal (MIM) capacitor. Alternatively, sometimes no capacitor (i.e. no gate input) is required at all; in this case the synapse transistor becomes a tunable current source or a tunable conductance.

The synapse weight W is decreased by tunneling electrons from the floating gate to the tunneling junction (the shorted pFET and its associated n– well in accordance with this embodiment). Positive high voltages on the tunneling junction cause electron tunneling. The FN-tunneling process is illustrated in the energy-band diagram of FIG. 7C. A potential difference between the tunneling junction and the floating gate reduces the effective oxide thickness, facilitating electron tunneling from the floating gate, through the $SiO_2$ barrier, into the oxide conduction band. The oxide electric field then sweeps these electrons to the n– well.

Figure 8:
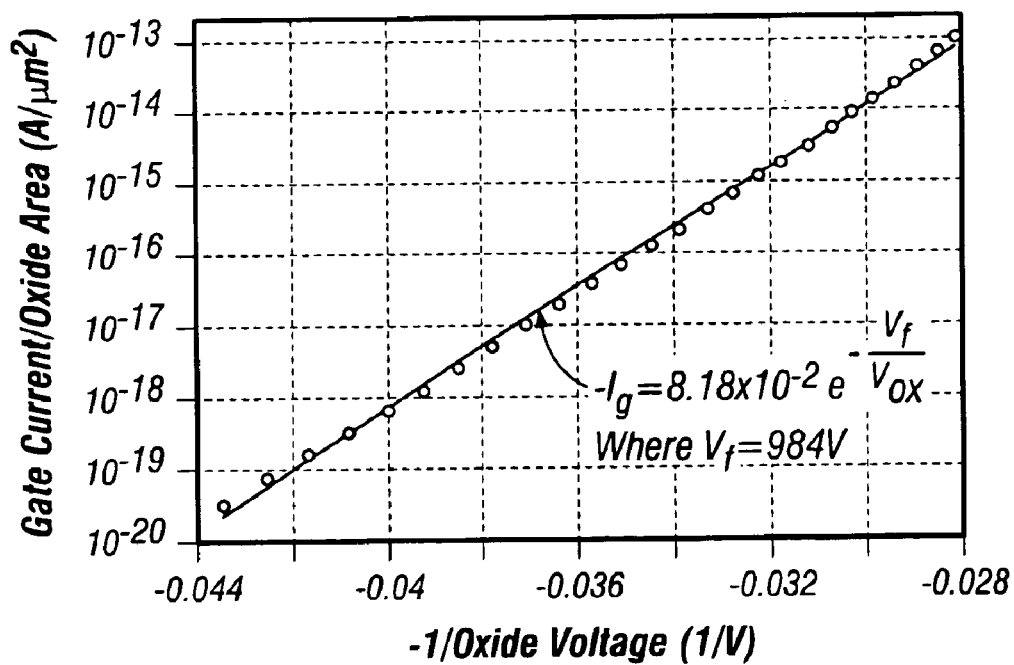
FIG. 8 illustrates tunneling (gate) current $I_g$ versus $-1/V_{ox}$, for a synapse fabricated in a 2 μm CMOS process. $V_{ox}$ is the potential between the tunneling junction and the floating gate. The gate current is normalized to the tunneling-junction (gate oxide) area.

FIG. 8 illustrates tunneling (gate) current $I_g$ versus $-1/V_{ox}$, for a synapse fabricated in a 2 $\mu$m CMOS process. $V_{ox}$ is the potential between the tunneling junction and the floating gate. The gate current is normalized to the tunneling-junction (gate oxide) area. In FIG. 8, the tunneling current (oxide current) versus the reciprocal of the voltage across the oxide is shown for synapses fabricated in 2 $\mu$m and 0.35 $\mu$m processes. These data behave as follows:

$$I_g = -I_m e^{-\frac{V_f}{V_{ox}}} \quad (3)$$

where $I_g$ is the gate current; $V_{ox}$ is the oxide voltage (well voltage minus floating-gate voltage); $V_f$ is a constant that depends primarily on oxide thickness; and $I_m$ is a pre-exponential current. $I_g$ is negative, because tunneling reduces the weight W.

The synapse weight W is increased by injecting electrons onto the floating gate. As shown in the energy-band diagram of FIG. 7C, channel holes, accelerated in the transistor's channel-to-drain depletion region, can collide with the semiconductor lattice and liberate additional electron-hole pairs. The ionized electrons, promoted to their conduction band by the collision, are expelled from the drain by the same channel-to-drain electric field. Electrons expelled with more than 3.1 eV of kinetic energy, if scattered upward into the gate oxide, can overcome the 3.1V difference in electron affinity between the Si and $SiO_2$ conduction bands, inject into the $SiO_2$, and be collected by the floating gate. Injection reduces the threshold voltage Vt of a pFET.

Figure 9:
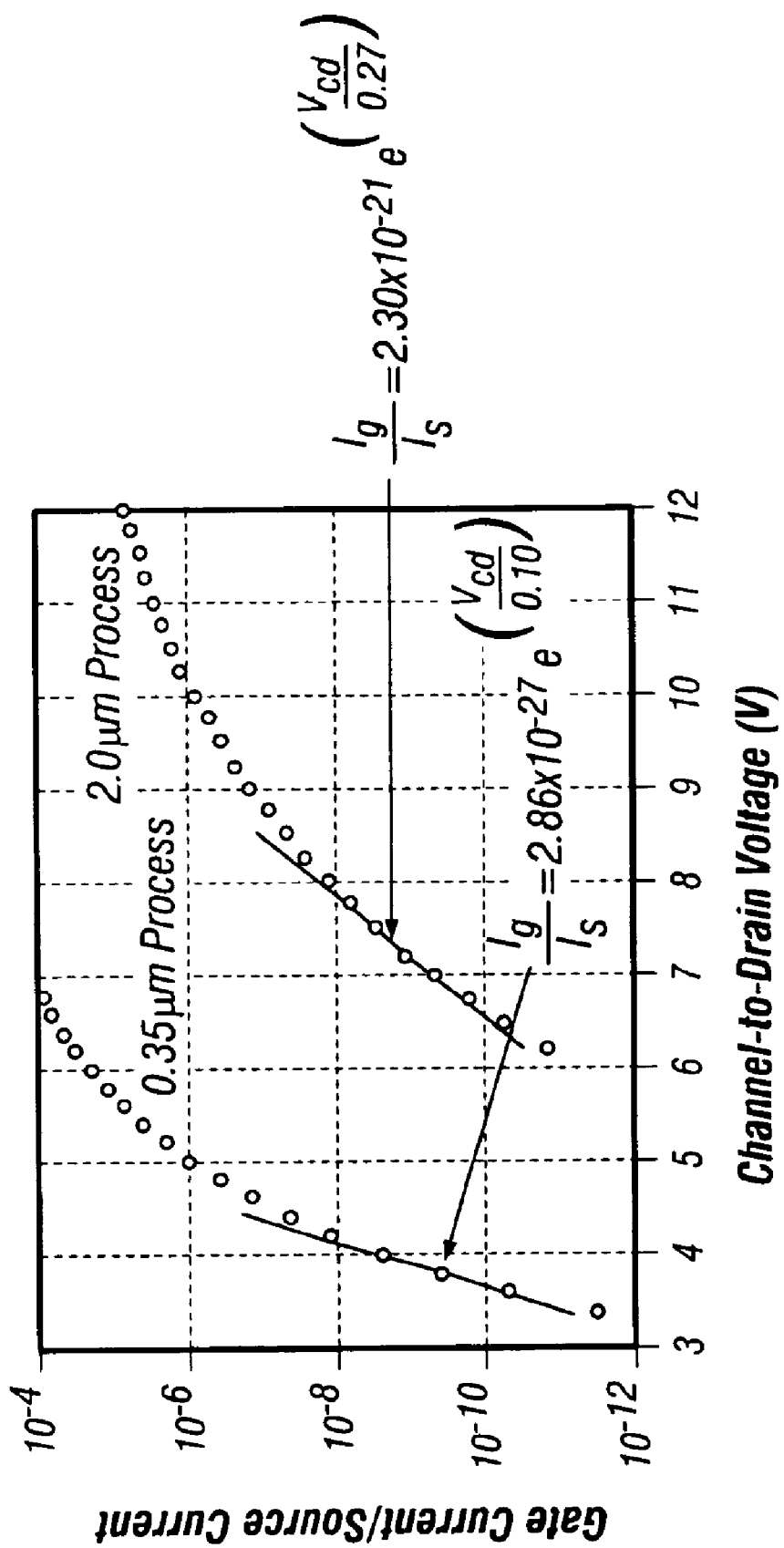
FIG. 9 is a plot of IHEI efficiency (gate current $I_g$ divided by source current $I_s$), versus channel-to-drain potential $V_{cd}$, for synapses fabricated in 2 μm and 0.35 μm processes. The drain voltage is referenced to the channel, because the hot-electron population derives from the channel-to-drain electric field. The source-to-drain voltage, $V_{sd}$, is a few hundred millivolts smaller than $V_{cd}$. In the subthreshold regime, $I_g$ increases linearly with $I_s$; consequently, these data show the IHEI efficiency for the entire subthreshold source-current range.

In FIG. 9, IHEI efficiency (defined as gate current $I_g$ divided by source current $I_s$), is plotted for synapse transistors fabricated in 2 $\mu$m and 0.35 $\mu$m processes. The data is plotted as efficiency because gate current increases linearly with source current over the entire subthreshold range; predictably, because the gate current derives from the hot-electron population, and this population, in turn, increases linearly with the source current.

Figure 4:
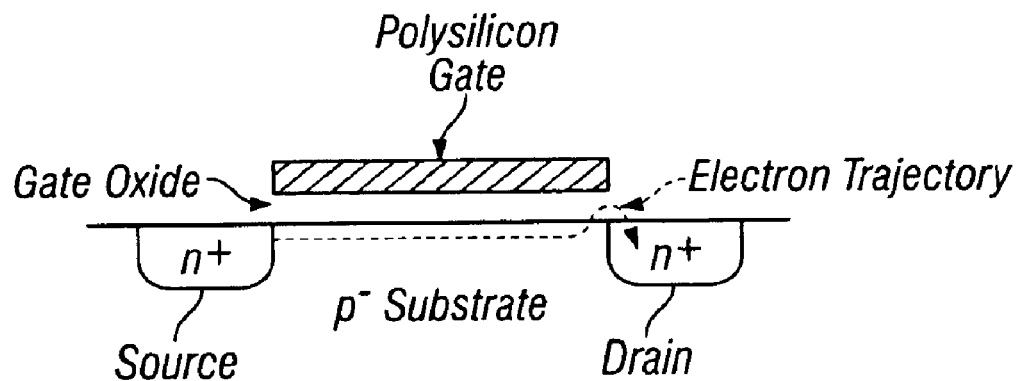
FIG. 4 is a diagram of an n– type MOSFET showing the inability to inject electrons from the channel to the gate.
Figure 5:
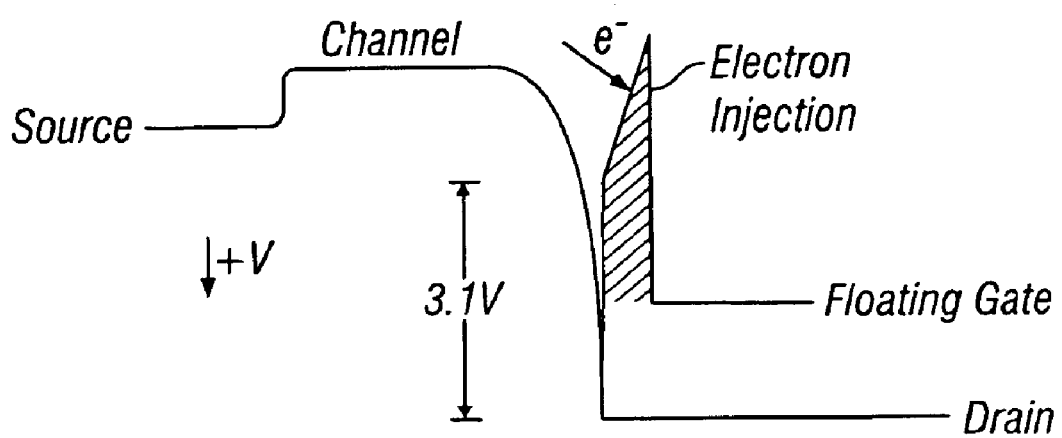
FIG. 5 is an energy band diagram of the conventional n– type MOSFET described in FIG. 4.

For a 0.35 $\mu$m synapse, when the readout transistor's source-to-drain voltage $V_{sd}$ is less than 3V, the IHEI gate current is exceedingly small, and the weight W remains nonvolatile. When $V_{sd}$ exceeds 3.5V, the gate current causes measurable changes in the synapse weight W. The data of FIG. 4 is approximated with a simple exponential:

$$I_g = \beta I_s e^{\frac{V_{cd}}{V_{inj}}} \quad (4)$$

where $I_g$ is the gate current, $I_s$ is the source current, $V_{cd}$ is the channel-to-drain potential, and $\beta$ and $V_{inj}$ are fit constants. $I_g$ is positive, because IHEI increases the weight W.

In a synapse transistor one can simultaneously (1) read the channel current; (2) raise the tunneling voltage, causing electrons to tunnel off the floating gate; and (3) lower the drain voltage, causing IHEI. A final gate-current equation is obtained by adding Eqns. (3) and (4):

$$I_g = \beta I_s e^{\frac{V_{cd}}{V_{inj}}} - I_{to} e^{-\frac{V_f}{V_{ox}}} \quad (5)$$

assuming subthreshold source currents $I_s$. The restriction to subthreshold source currents is solely for reasons of mathematical tractability. The synapse is fully functional with above-threshold source currents, but the dynamics are more complicated.

Figure 10:
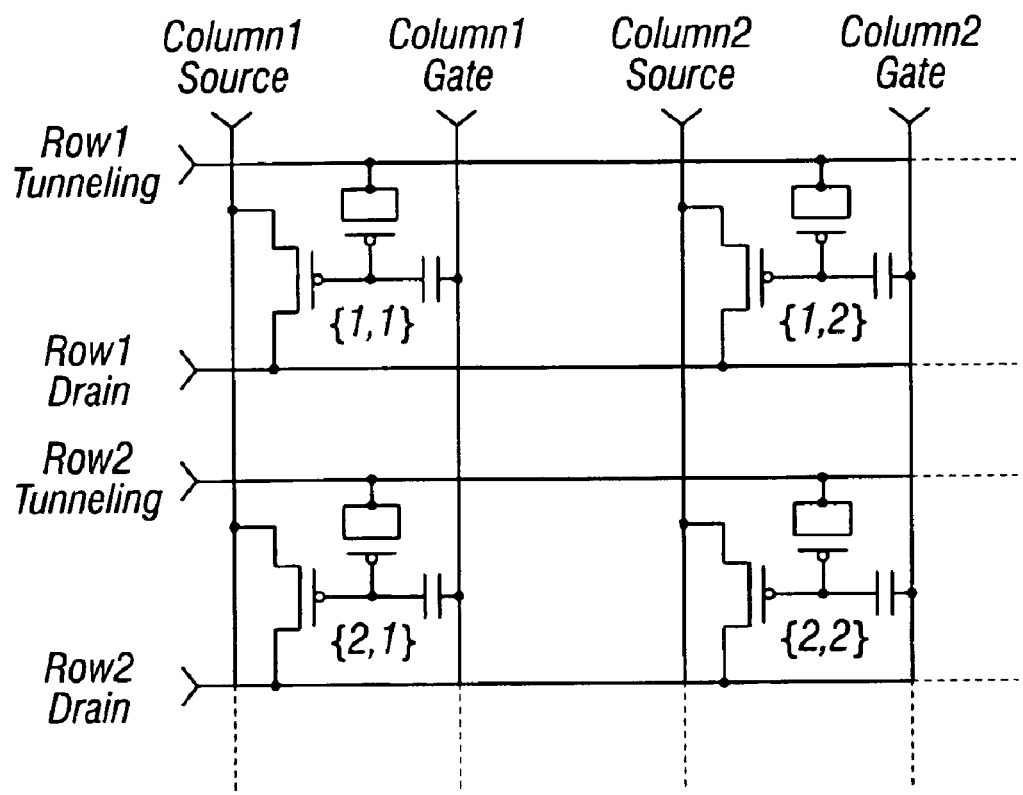
FIG. 10 is an electrical schematic diagram of a two by two synaptic array in accordance with one embodiment of the present invention. Column synapses share a common tunneling wire, meaning that they share a common tunneling well in this embodiment.

FIG. 10 is an electrical schematic diagram of a two by two synaptic array in accordance with one embodiment of the present invention. Column synapses share a common tunneling wire, meaning that they share a common tunneling well in this embodiment. In applications that use large numbers of synapse transistors, such as analog memories or neural networks, such arrays of synapses may be used rather than isolated devices. Although arrays provide dense synapse packing and simple addressing, they must not compromise the isolation between individual synapses, and must provide a means for writing and erasing synapses easily. The array shown in FIG. 10 was fabricated to (1) verify synapse isolation, and (2) to demonstrate a self-convergent technique for writing individual synapses.

Array synapses share tunneling and drain wires; consequently, tunneling or injecting one synapse can cause undesired tunneling or injection at another synapse. To measure synapse isolation, the {1,1} synapse in FIG. 10 was tunneled and injected over a 3-decade range, while measuring the crosstalk to the other synapses. Crosstalk is defined here to be the fractional change in a deselected synapse's source current divided by the fractional change in the selected synapse's source current.

Figure 11A:
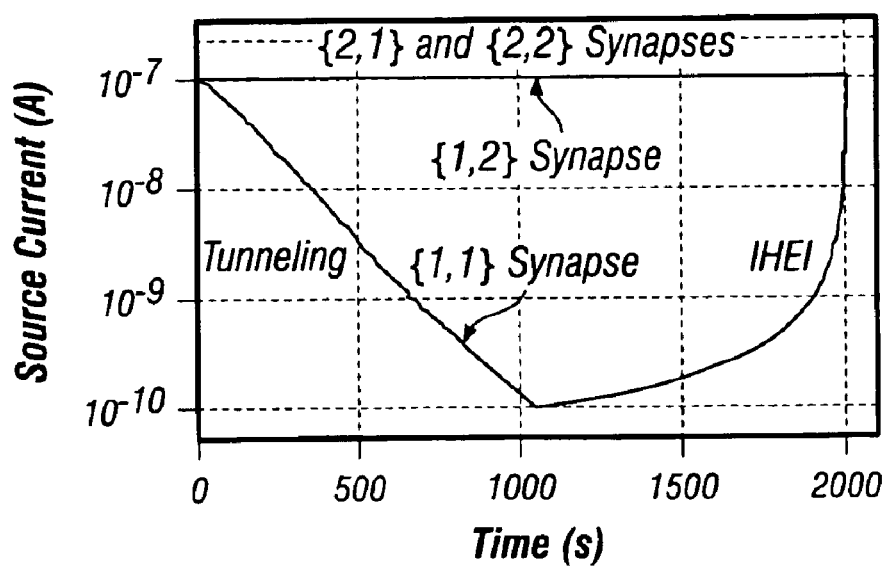
FIGS. 11A and 11B are plots of data illustrating synapse isolation in the array of FIG. 10, fabricated in a 2 μm CMOS process. To obtain the data shown in FIG. 11A, all four synapses were initialized to $I_s$=100 nA. Synapse {1,1} was then tunneled down to 100 pA, then injected back up to 100 nA, while measuring the source currents of the other three synapses. Crosstalk to the {1,2} synapse, defined as the fractional change in the {1,2} synapse's source current divided by the fractional change in the {1,1} synapse's source current, was 0.004% during tunneling, and was 0.005% during injection. To obtain the data shown in FIG. 11B, all four synapses were initialized to $I_s$=100 pA. Synapse {1,1} was then injected up to 100 nA, then tunneled back down to 100 pA. Crosstalk to the {1,2} synapse was 0.016% during injecting and 0.007% during tunneling. In both experiments, the crosstalk to the row 2 synapses was negligible.
Figure 11B:
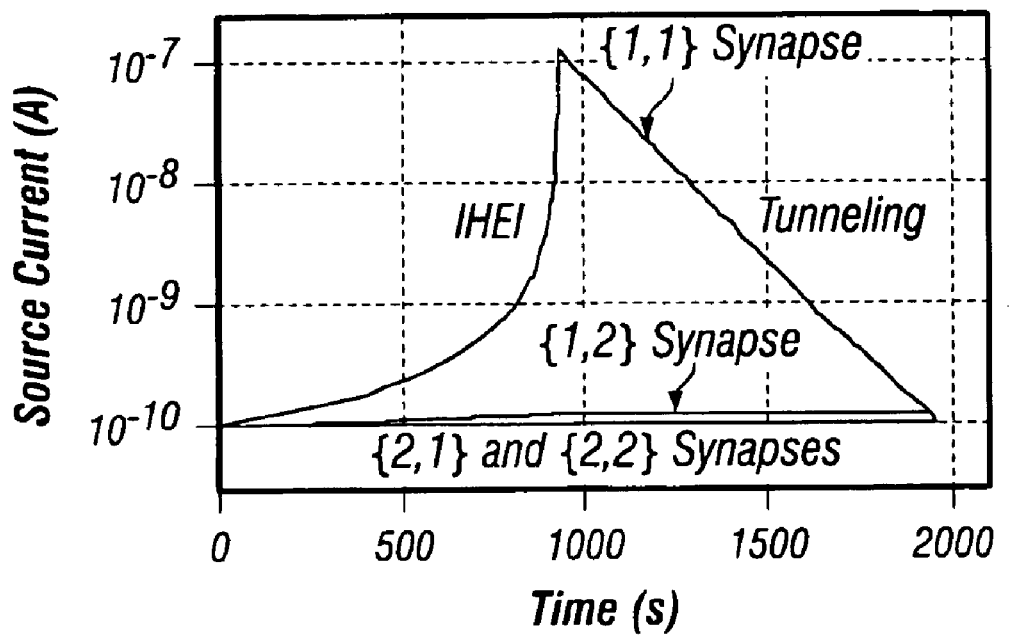

FIGS. 11A and 11B are plots of data illustrating synapse isolation in the array of FIG. 10, fabricated in a 2 $\mu$m CMOS process. To obtain the data shown in FIG. 11A, all four synapses were initialized to $I_s$=100 nA. Synapse {1,1} was then tunneled down to 100 pA, then injected back up to 100 nA, while measuring the source currents of the other three synapses. Crosstalk to the {1,2} synapse, defined as the fractional change in the {1,2} synapse's source current divided by the fractional change in the {1,1} synapse's source current, was 0.004% during tunneling, and was 0.005% during injection. To obtain the data shown in FIG. 11B, all four synapses were initialized to $I_s$=100 pA. Synapse {1,1} was then injected up to 100 nA, then tunneled back down to 100 pA. Crosstalk to the {1,2} synapse was 0.016% during injecting and 0.007% during tunneling. In both experiments, the crosstalk to the row 2 synapses was negligible.

The data in FIGS. 11A and 11B show that the crosstalk between selected and deselected synapses is less than 0.01% during tunneling, and is less than 0.02% during IHEI. The reason for this good isolation can be seen from Eqn. (5) and from the data in FIGS. 8 and 9: Both tunneling and IHEI are steep exponentials. Consequently, precise analog values can be stored in a synaptic array without significant degradation due to crosstalk.

For applications that require single-transistor, a high voltage is applied to the selected n- well row and a low voltage to the selected gate column. For applications that permit flash erasure of a column of transistors, the entire array is placed in a single n- well. To erase a column of transistors, a high voltage is applied to the n- well and a low voltage to the selected gate column. During cell erasure, if excessive tunneling occurs, the drain current may become small; when the cell is later written, the gate current will be small, and the memory write process will be slow. Therefore, all devices are preferably initialized after tunneling by (1) 25 applying the minimum programming current, (2) lowering the gate voltage until the drain current is equal to this programming current, and (3) using the write-feedback process to hold this drain-current value as the gate is ramped back up to its nominal voltage.

Figure 12A:
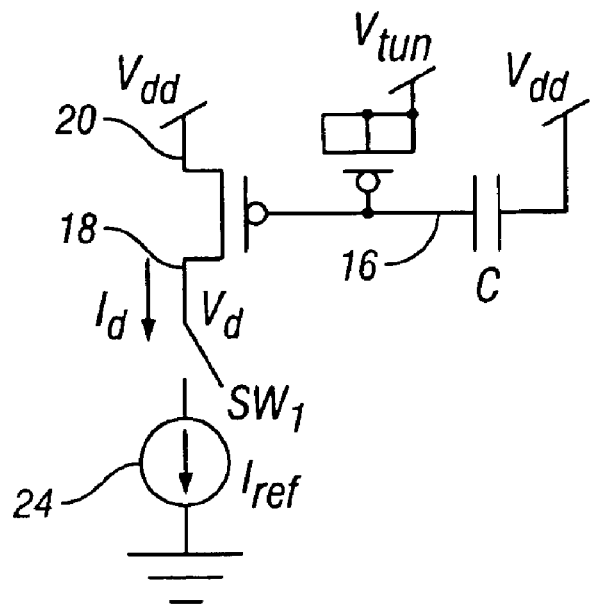
FIGS. 12A and 12B illustrate the process of self-convergent memory writes.
Figure 12B:
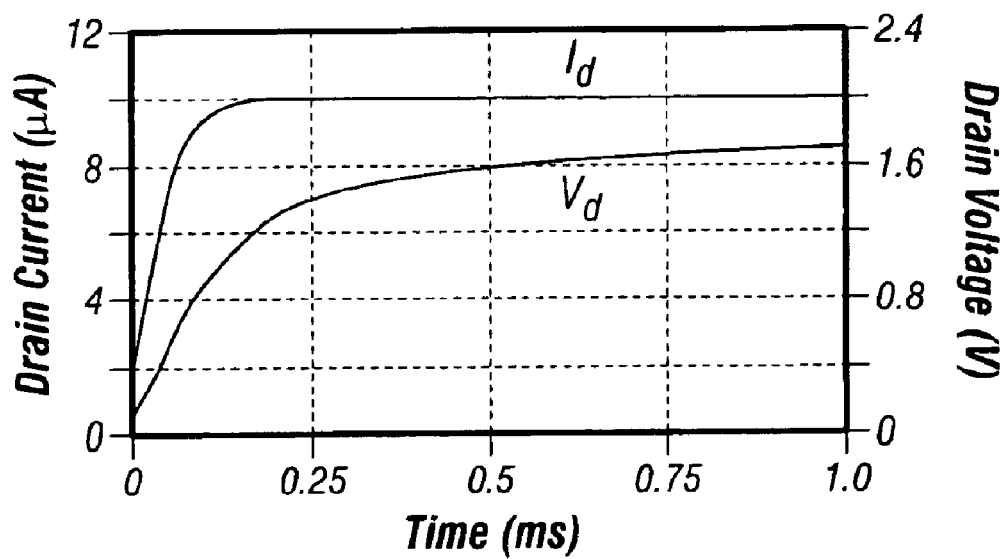

Because synapse transistors allow simultaneous memory reading and writing, negative feedback can be used to store accurate memory values. As an example, FIGS. 12A and 12B illustrate a self-convergent memory write. FIGS. 12A and 12B illustrate the process of self-convergent memory writes. FIG. 12A is an electrical schematic diagram of an example circuit; FIG. 12B is a plot of the output of a SPICE simulation showing the pFET's drain voltage $V_d$ and drain current $I_d$ during a write. First, electrons are tunneled off the floating gate so $I_d < I_{ref}$ (not shown in the simulation), then tunneling is stopped, then writing begins. Switch $SW_1$ is closed at t=0, causing $V_d$ to drop, electrons to inject onto the floating gate, and $I_d$ to rise. As $I_d$ approaches $I_{ref}$, $V_d$ rises, turning off the injection. $I_d$ reaches 99% of its final value in 140 $\mu$s. The memory is read by applying $V_d$=1.7V and measuring $I_d$, with an accuracy that depends on the circuit details but can be better than 1%. The simulation parameters were $V_{dd}$=6V, C=5 fF, $I_{ref}$=10 $\mu$A.

Memory values are stored as drain current $I_d$. The write process works as follows: Assume that, initially, $I_d$ is smaller in magnitude than the programming current $I_{ref}$. To write, apply $I_{ref}$ using switch $SW_1$. As long as $I_{ref}$ exceeds $I_d$, the synapse's drain voltage will be held low, causing electrons to inject onto the floating gate and thereby increasing $I_d$. As $I_d$ approaches $I_{ref}$, the synapse's drain voltage will rise, turning off the injection. IHEI closes a negative feedback loop around the inverting amplifier formed by the pFET and the $I_{ref}$ current source. This intrinsic feedback mechanism adapts the floating-gate charge to equalize the programming and pFET-drain currents, storing $I_{ref}$ in the synapse transistor.

Notice that the synapse in FIGS. 12A and 12B (comprising the two pFETs and the gate capacitor) is identical to an array element in FIG. 10. Consequently, self-convergent mechanisms can be used to write array synapses, by placing switches and current sources in the row-drain wires, and by using the column-gate wires to select a column for writing. The row-drain voltages are monitored using sense amplifiers, and open each switch to stop the write when its corresponding drain rises to a predetermined voltage. To read a column, lower the appropriate column-gate wire and read the drain currents of all the transistors in the column.

Synapse transistors have technological and reliability issues similar to other nonvolatile memory technologies, of which the most critical are tunneling- and injection-induced damage to the gate oxide, and charge leakage off the floating gate. Oxide damage limits the number of read/write cycles in digital flash memory and EEPROMs. Although synapse transistors are subject to the same damage mechanisms, their analog-valued weight updates are typically much slower and smaller than digital memory writes, so their oxide currents are three to six orders of magnitude smaller than in flash memories or conventional EEPROMs. Consequently, oxide damage has not been an issue, even for synapse-based circuits that use continuous tunneling and injection. Oxide trapping does decrease a synapse's weight-update rates, forcing regulation of the tunneling and injection voltages. Synapse transistor-based regulation circuits allow precise control of these voltages.

The scaling of gate oxides to less than about 70 Å thickness causes floating gates to leak. This problem is not unique to synapse transistors—it affects all nonvolatile memory devices that use floating gates. If anything, synapse transistors are far more tolerant of oxide leakage because, in most situations, they are used circuits that adapt the stored charge on an ongoing basis. If, however, a memory must be stored for years without updating, the 70 Å oxide available in most dual-gate-oxide CMOS processes is used.

Figure 13C:
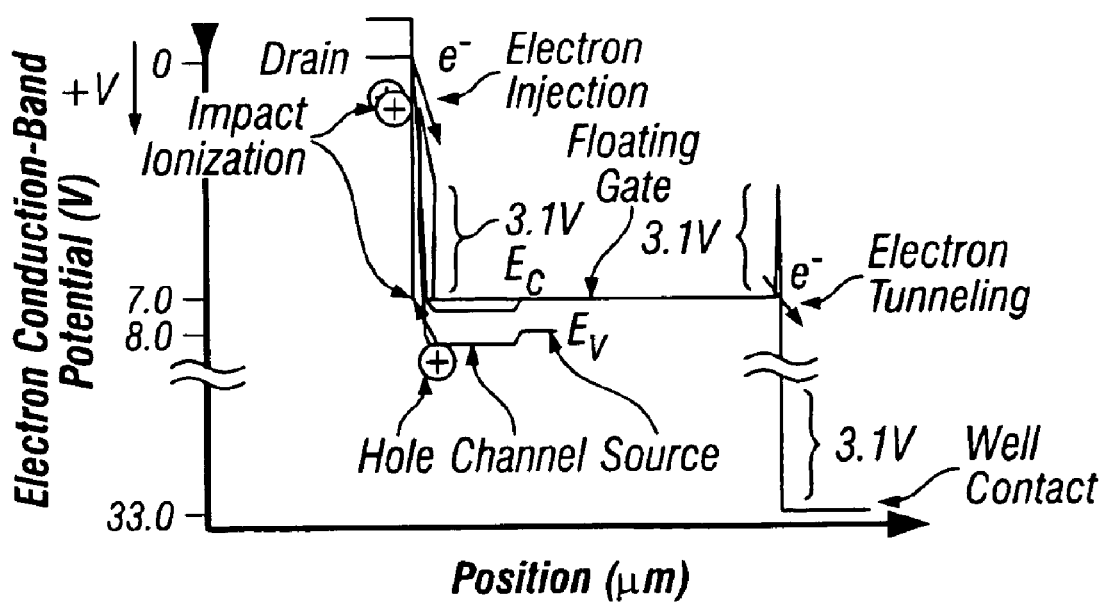
FIG. 13C is an electron band diagram of a pMOS analog EEPROM cell in accordance with one embodiment of the present invention.
Figure 13A:
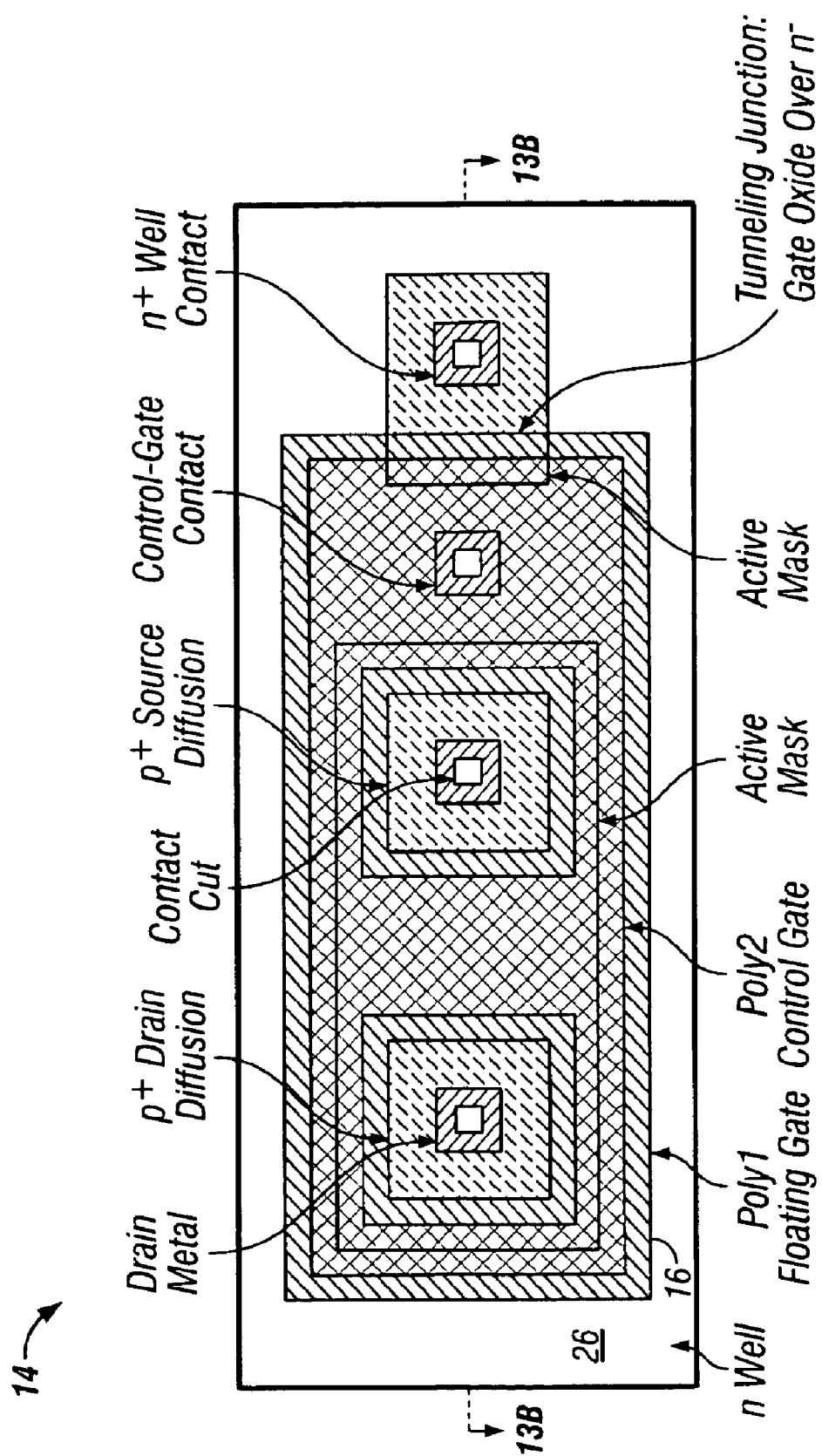
FIG. 13A is a top view of a pMOS analog EEPROM cell in accordance with one embodiment of the present invention.
Figure 13B:
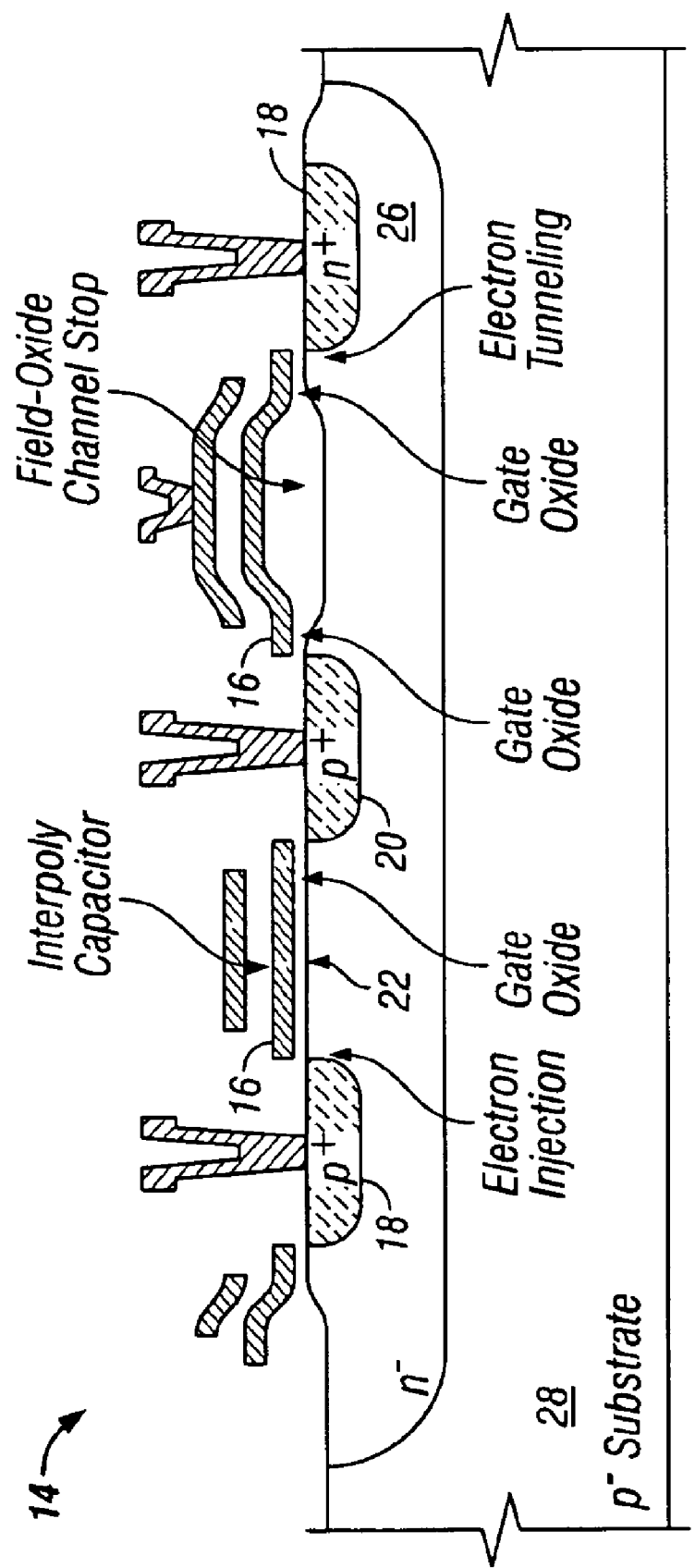
FIG. 13B is a cross sectional view taken along line 13B—13B of FIG. 13A of a pMOS analog EEPROM cell in accordance with one embodiment of the present invention.

Conventional EEPROMs typically employ n– type MOSFETs, and use Fowler-Nordheim tunneling to write the memory. Because simultaneously tunneling and reading an n– type floating-gate MOSFET is difficult, writing an analog memory usually is an iterative process. In accordance with one embodiment of the present invention a pMOS EEPROM cell permits simultaneous memory writing and reading, thereby allowing accurate, single-step analog writes. In addition, the cell may operate from a single-polarity supply, and may be fabricated in a standard n– well, double-poly CMOS process. (Single-poly versions are also provided herein). As shown in the embodiment of FIGS. 13A, 13B and 13C, memory cell 14 has three notable features: (1) it employs a fully functional p– type floating-gate MOSFET in a single n– well, (2) its polysilicon floating gate 16 abuts n+ well contact 18, and (3) its floating gate 16 surrounds completely the drain 18 and source 20 implants.

Figure 14A:
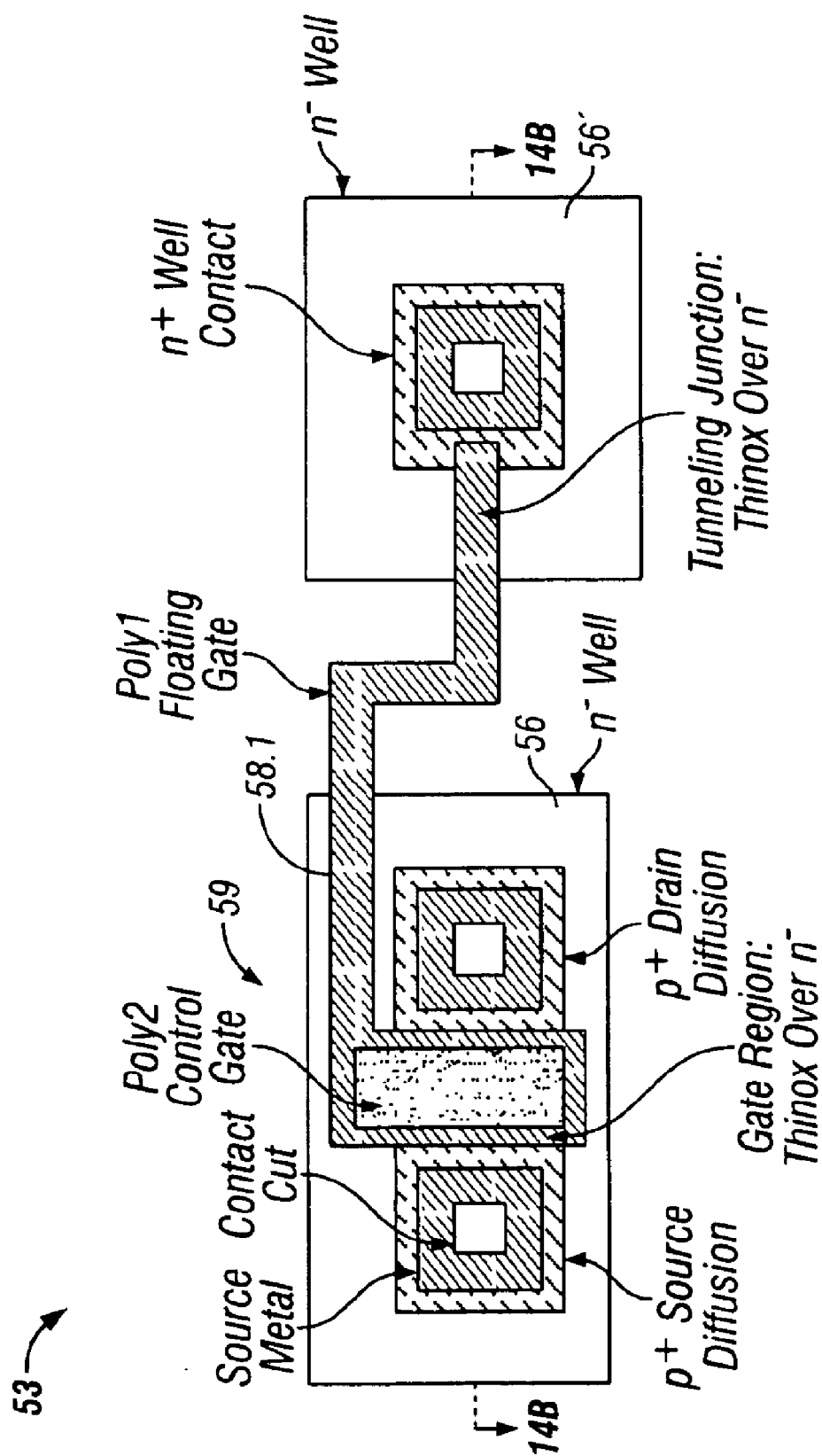
FIG. 14A is a top plan view of a pFET synapse transistor in accordance with one embodiment of the present invention useable as an EEPROM and implemented in a double layer polysilicon process.
Figure 14B:
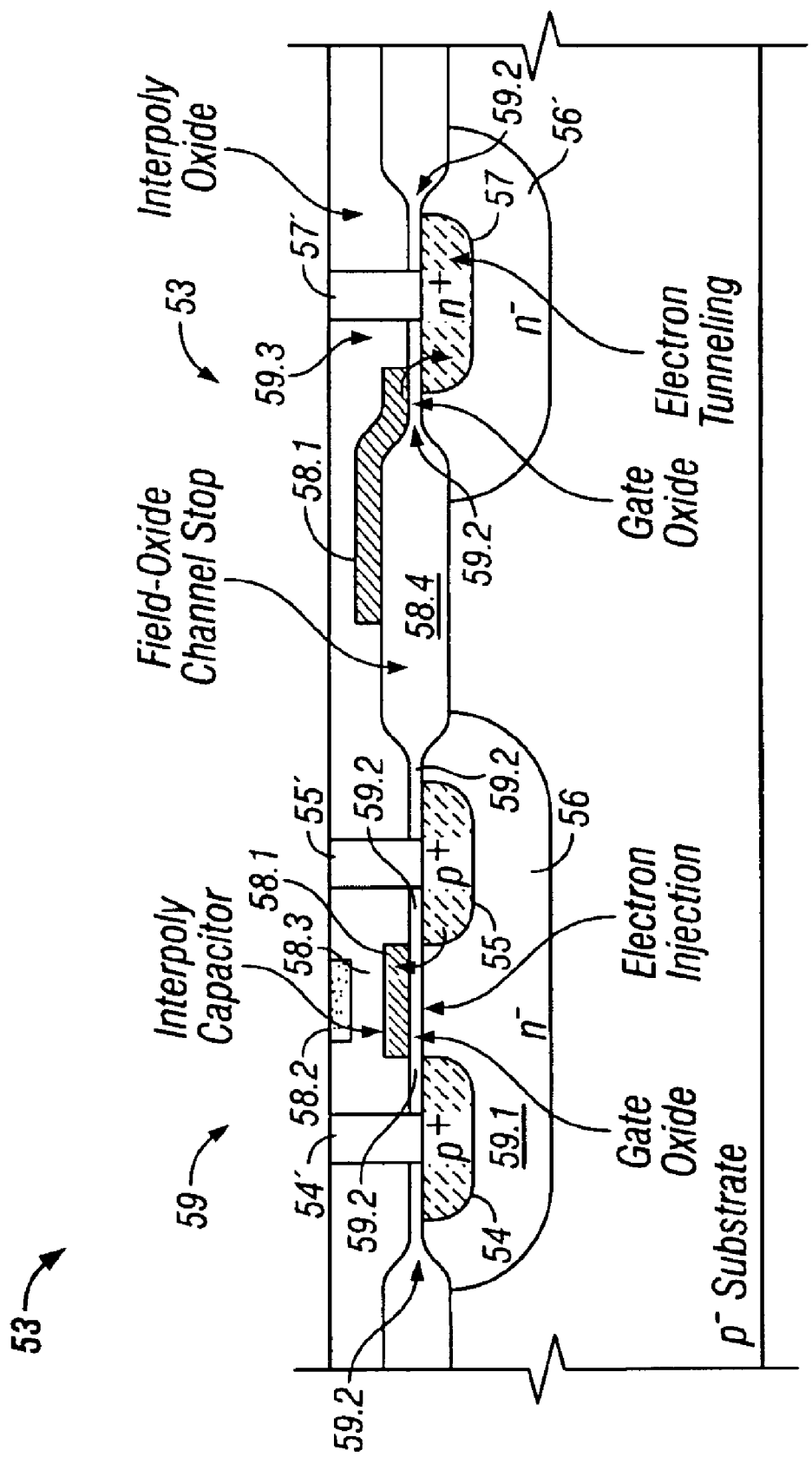
FIG. 14B is a side elevational cross-section of the pFET device of FIG. 14A taken along line 14B—14B of FIG. 14A.
Figure 14C:
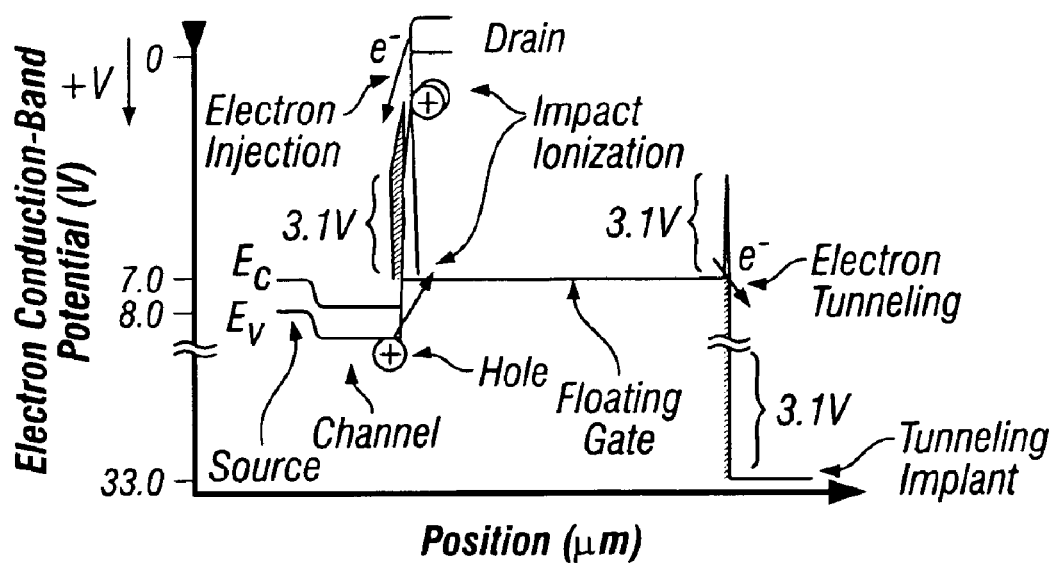
FIG. 14C is an electron conduction band diagram of the device of FIGS. 14A and 14B. The voltages in the diagram are referenced to the source potential, and subthreshold ($I_x$<100 nA) operation is assumed.

A number of other embodiments of floating gate structures are also described herein. For example, while the FIG. 13A-13C embodiment utilizes a single n– well and a double polysilicon process, many other versions are possible as well. FIGS. 14A, 14B and 14C describe a similar device where the tunneling function is disposed in a separate n– well. FIGS. 20–53 also describe single and double poly versions, horizontal and vertical versions, thin film versions and various other arrangements of the various components of these floating gate structures. It should also be noted that while analog values can be stored on these devices, common circuitry is available for using these cells to record digital values as well.

Turning now in more detail to the figures, FIGS. 13A, 13B and 13C depict a floating gate synapse transistor 14 having a single n– well 26 according to one embodiment of the present invention, showing the tunneling and injection locations. FIGS. 13A and 13C are drawn to scale; the vertical dimension in FIG. 13B has been exaggerated. All voltages are referenced to the source potential, and subthreshold source currents ($I_s$<100 nA) are assumed although above-threshold source currents are acceptable. In FIG. 13C, the gate oxide actually projects into the plane of the page; however, for clarity, it is rotated 90 degrees and drawn in the channel direction. The memory is written by hot-electron injection, and erased by FN tunneling.

Figure 15:
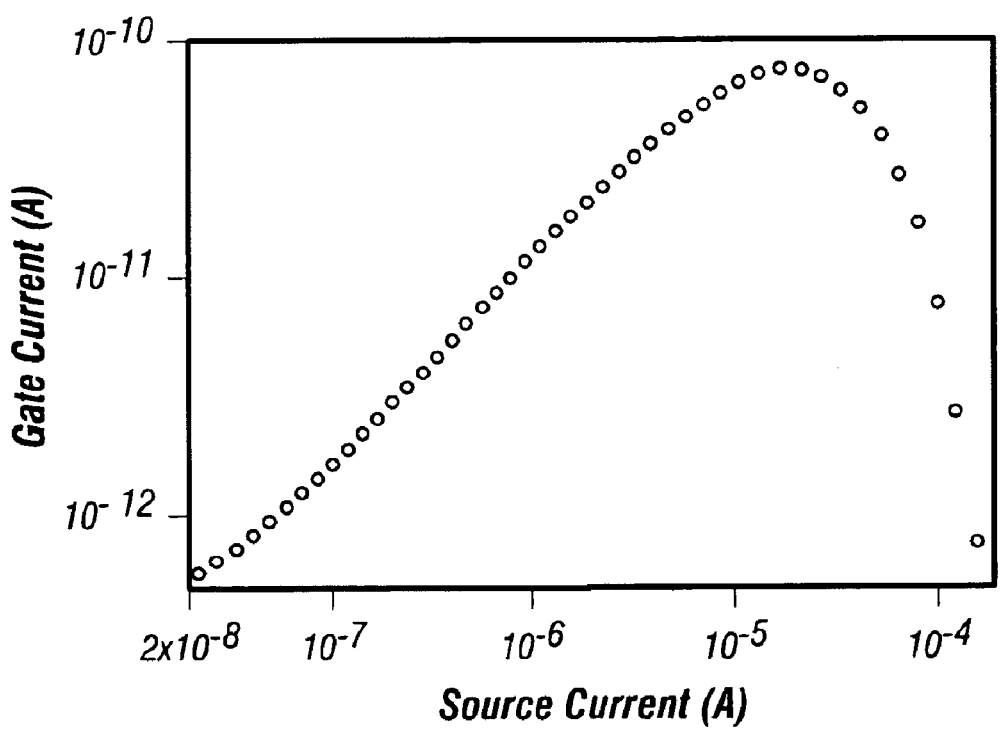
FIG. 15 is a plot of pFET gate current versus source current, for a fixed drain-to-source voltage $V_{ds}$=12V.

FIG. 15 is a plot of pFET gate current versus source current, for a fixed drain-to-source voltage $V_{ds}$=12V. For silicon-learning applications, the preferred source-current range is 1 pA<$I_s$<100 nA, as described in U.S. Pat. No. 5,990,512, referred to above. For analog EEPROM applications, the preferred source-current range is from about 20 nA to about 20 μA. Source currents smaller than 20 nA are to be avoided, because the hot-electron gate current, and therefore the memory write rate, are small. Because the pFET transconductance changes rapidly near threshold, source currents that are smaller than about 200 nA are also avoided, for reasons discussed in conjunction with FIG. 12. Above 20 μA, the potential at the drain end of the channel drops rapidly, and so does the gate current. For digital applications, the write rate may be maximized by using an $I_s$ of about 20 μA. pFETs fabricated in more modern processes will allow higher maximum source currents and faster memory-write rates.

Figure 16:
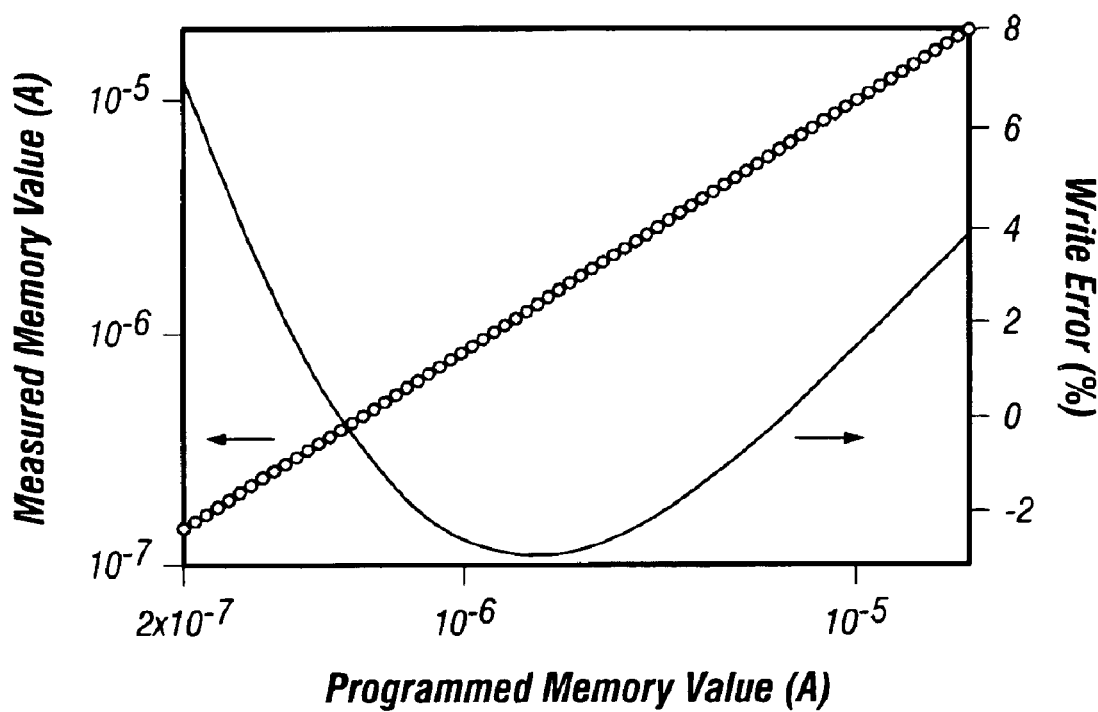
FIG. 16 is a plot of pMOS memory-cell input-output transfer function and output write error for a 1 sec write-pulse width.

FIG. 16 is a plot of pMOS memory-cell input-output transfer function and output write error, for a 1 sec write-pulse width. Here 64 logarithmically spaced drain-current values were written to transistor (1,1) (FIG. 10); log-scale currents were chosen to illustrate the memory cell's dynamic range. The drain current was reset to 100 nA prior to each write. To prevent writing the memory during reads, the drain voltages used for writing and reading must be different. Due to the intrinsic floating-gate-to-drain overlap capacitance, this voltage differential couples to the floating gate, causing an offset between the write current and the read current. Because the pFET transconductance is non-linear, this offset is nonconstant, and appears as both a gain error and a nonlinearity in the measured read-write transfer function.

Figure 17:
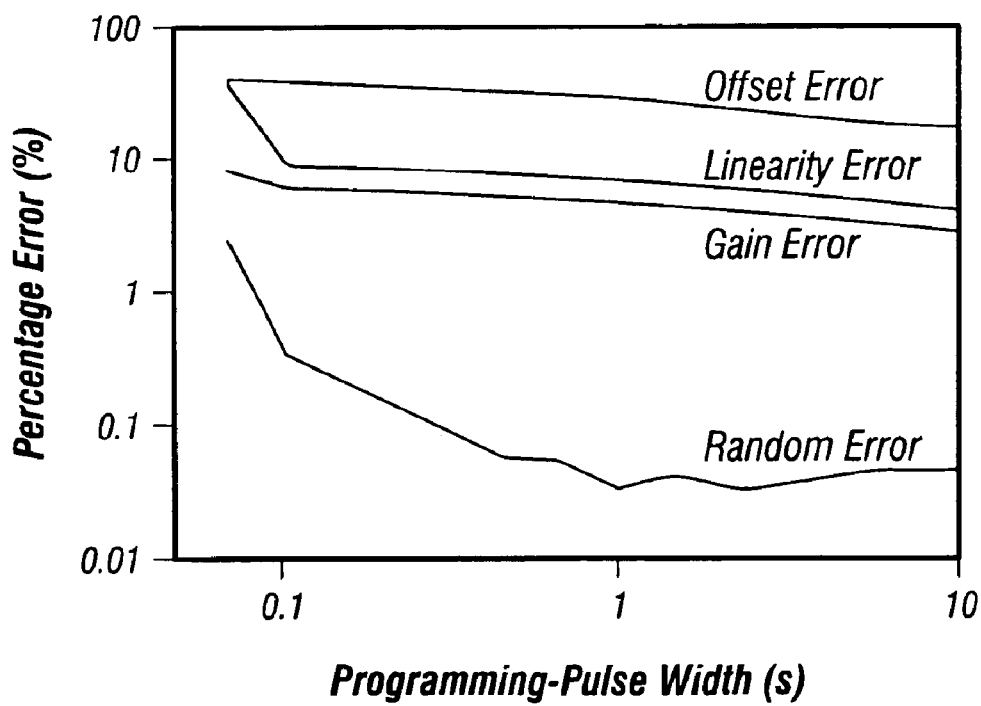
FIG. 17 is a plot of pMOS memory-cell write errors versus write-pulse width.

FIG. 17 is a plot of pMOS memory-cell write errors versus write-pulse width. The experiment of FIG. 16 was performed using write-pulse widths ranging from 68 msec to 10 sec; here, the offset error (the maximum deviation between the measured current and the programmed current), the linearity error (the maximum deviation between the measured current and the best-fit line), the gain error (the deviation of the best-fit line from unity slope), and the random error (the RMS error after removal of the nonlinearity) is plotted versus the write-pulse width. Because an oversized (1 pF) gate capacitor is employed in this example, and an off-chip current source is used to write the memory, the settling times are long. The shorter the programming pulse width, the further the drain voltage is from its settled value when the programming current is removed, and the larger the errors.

Applications

The above-described pFET EEPROM can be utilized in a number of applications. For example, the pFET EEPROM can be used in an analog sound or speech recorder. Because the pFET EEPROM is inherently an analog device and permits simultaneous reading and writing, the analog input can be converted to sampled current values and written directly to the pFET EEPROM cells. Because writing the cells is a one-step process, storing analog memories in a pFET EEPROM is far simpler than in conventional analog sound or speech recorders, some of which at present utilize nFET EEPROMS and require an iterative write process. Such nFET devices are presently manufactured by a company known as ISD (recently acquired by Windbond).

In another application, a pFET EEPROM can be used in a multilevel digital memory. If each memory cell is used, for example, to store 8-bit memory values, then with proper decoding, a 1 kilo cell memory can store 8 kilobits of digital memory. Although nFET EEPROMS have been used in multi-level memories (see, e.g., devices produced by Mitsubishi Electric Company of Japan and Intel Corporation of Santa Clara, Calif.), the additional semiconductor processing required to enable accurate multilevel writes adds significantly to the chip cost. Because the new pFET uses conventional semiconductor processing, it can achieve multilevel accuracy without additional processing cost.

In another application, a pFET EEPROM can be used as a synapse transistor. In a pFET synapse device, the pFET EEPROM will prove to be a preferred device over other pFET structures, because the layout requires substantially less layout area, thereby allowing more devices to be placed on a silicon chip.

In another application, a pFET EEPROM can be utilized in autozeroing, adaptive devices. In such devices, the pFET EEPROM will prove to be a preferred device over other pFET structures.

In another application, a pFET EEPROM can eliminate the off-chip nonvolatile memory (NVM) in conventional digital computers. Existing computers typically store their startup code in a BIOS, which may be a flash EEPROM usually located on the same printed circuit board as the microprocessor. The startup code typically is not stored on the microprocessor IC, because the MOS processing required to build nFET EEPROM cells requires added processing steps when compared to the MOS processing required to build the microprocessor. These added processing steps reduce the chip yield, increasing the microprocessor cost. Because the pFET EEPROM is fabricated in a standard process, it allows a BIOS memory to be added to a microprocessor IC without additional processing steps. This will be advantageous because locating the Bios memory on board the microprocessor IC will reduce cost, enhance speed and have no adverse effect on yield.

A further application for a pFET EEPROM is to add nonvolatile memory to existing ASIC processes. ASIC processes typically do not possess any form of nonvolatile memory for the reasons set forth above. Because the pFET EEPROM is compatible with standard MOS processing, it will allow ASIC vendors to add nonvolatile, mixed analog—digital memory to their existing processes, with no changes to the process. This change will add nonvolatile memory devices to the repertoire of cells available to ASIC designers, with endless new design possibilities.

A further application for a pFET EEPROM is to trim the performance of analog circuits, as described, for example, in "A floating-gate trimmable high-resolution DAC in standard 0.25 $\mu m$ CMOS," Miguel Figueroa, John Hyde, Todd Humes, and Chris Diorio, Proceedings of the 2001 Nonvolatile Semiconductor Memory Workshop, Monterey, Calif., pp. 46–47, 2001.

Alternative Embodiments

In a specialized process it is possible to eliminate the guard rings and use graded drain and source junctions. Graded junctions have lower E-fields, thereby preventing well-to-drain (and source) pn breakdown during tunneling. Accordingly, memories constructed in this fashion are included in the present invention.

Another alternative is to form a tunneling junction where electrons are tunneled through a gate-oxide surface to the n− well rather than at an edge of an n+ well implant (in the FIG. 13A-13C embodiment, electrons tunnel from the floating gate 16 to the n+ implant 18 at the edge thereof).

Figure 18A:
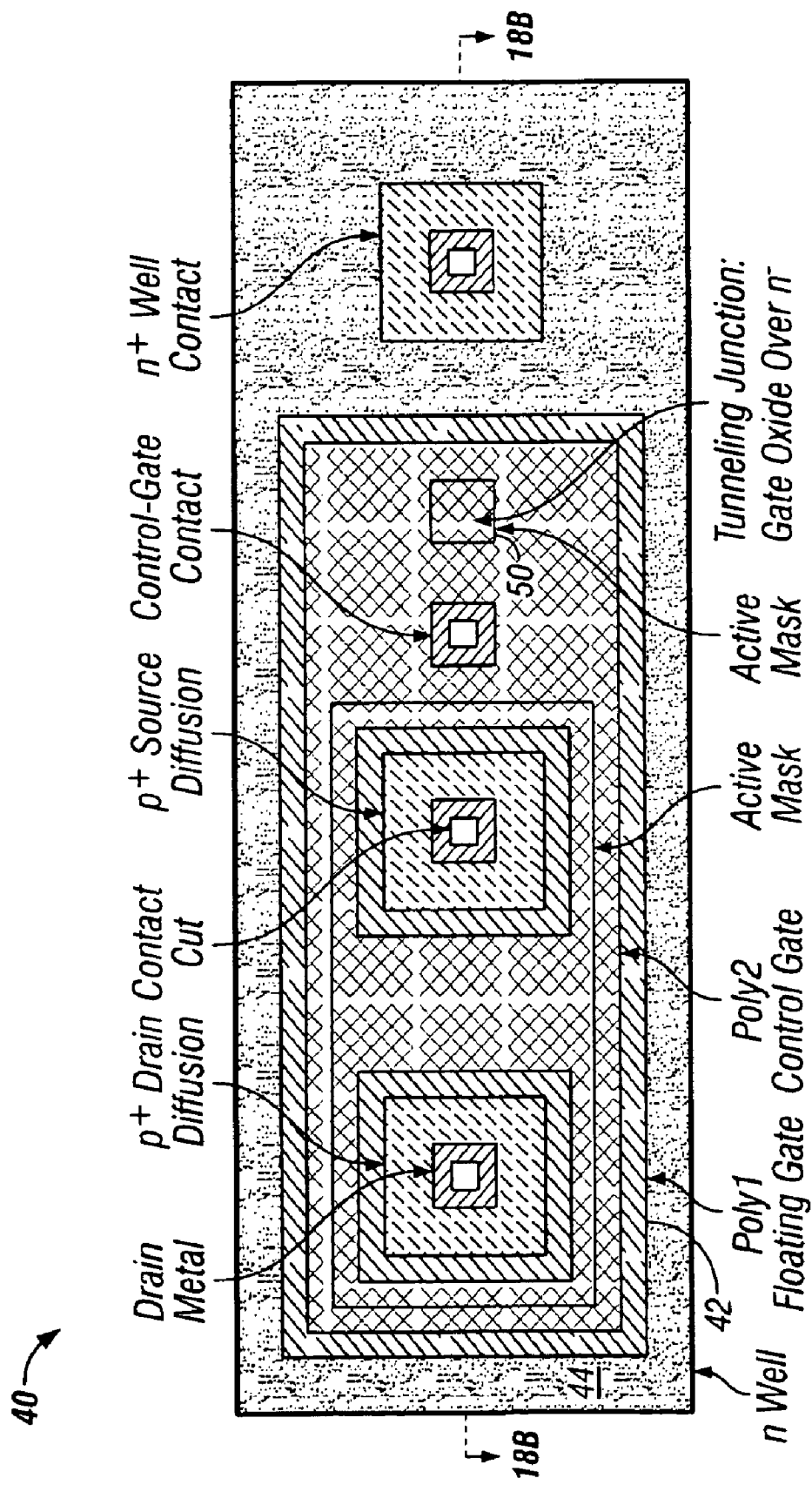
FIG. 18A is a top view of a guarded pFET synapse incorporating a bowl-shaped tunneling junction in accordance with one embodiment of the present invention.
Figure 18B:
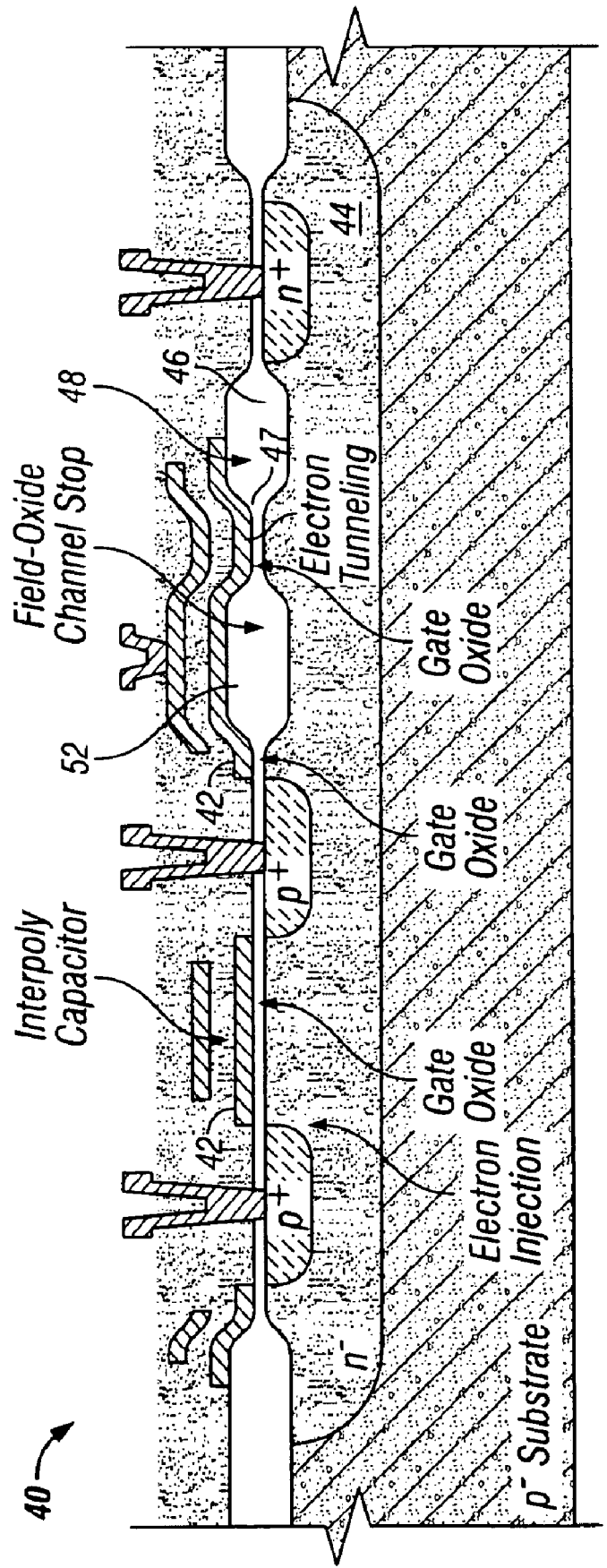
FIG. 18B is a cross-sectional view of the device of FIG. 18A taken along line 18B—18B of FIG. 18A.

To isolate the tunneling region from the pFET's source, the guarded-pFET synapse 40 shown in FIGS. 18A and 18B was built. In this device, electrons tunnel from the floating gate 42 to the n− well 44 through a tunneling junction 46 through gate-oxide surface 47.

In this embodiment the pFET's (40) floating gate 42 is extended over a region of field oxide 48, and an isolated, 4 micron by 4 micron square bowl of gate oxide 50 is placed within this field oxide region. The gate-oxide bowl 46 has n− silicon 44 beneath it, the polysilicon floating gate 42 above it, and field oxide 52 on all four sides. A relatively high voltage is applied to the n− well 44, causing electrons to tunnel from the floating gate 42, through the gate-oxide bowl 46, to the n− well The floating gate 42 depletes the n− silicon immediate potential drop from the bulk n− to the MOS surface. Consequently, bowl tunneling requires well voltages roughly 5V higher than those required to tunnel at an n+ well contact. However, because the tunneling is through a gate-oxide surface, rather than at an edge, oxide trapping is reduced.

Figure 19:
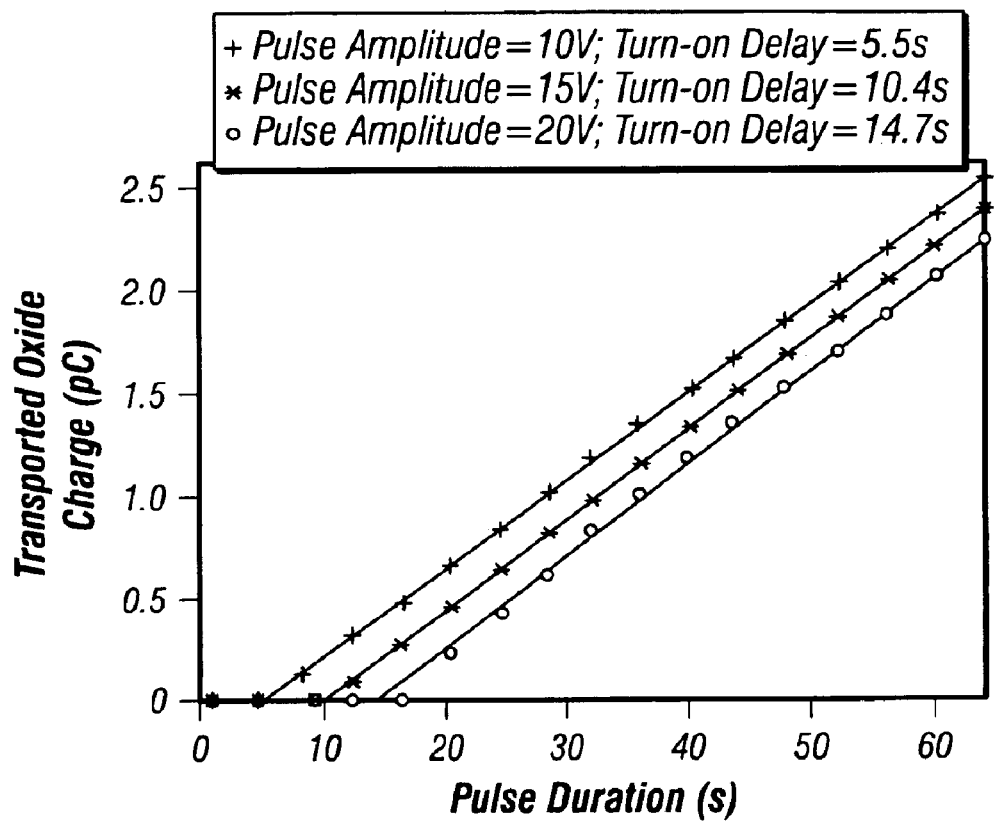
FIG. 19 is a plot of the bowl-shaped tunneling junction turn-on delay.

Although this type of tunneling junction does eliminate the pn-breakdown problem, its turn-on delay (the delay between applying a high well voltage and the onset of electron tunneling) is generally long. In FIG. 19, the amount of charge tunneled through a bowl-shaped oxide, versus the amount of time the well voltage was pulsed high, for three different well-pulse voltage amplitudes is shown. The turn-on delay can exceed ten seconds—an impracticably long time for a pulse-based learning system. The cause is the depletion region that forms at the silicon surface beneath the bowl. As a result of the voltage differential between the floating gate and the n⁻ well, the surface region beneath the gate oxide is depleted, and the depletion-region depth varies with the voltage differential between the floating gate and the well. If the well is pulsed high, holes must be provided to the silicon surface to widen this depletion region. Unfortunately, the only hole source is thermal carrier generation. Consequently, the depletion region takes many seconds to widen. Although such tunneling junctions can be used in systems for which the well-tunneling voltage is a slowly varying analog quantity, they cannot be used in systems in which synapses are pulse-tunneling. The exception is CMOS processes that have heavily-doped channel implants, for example processes that use linear capacitors. Using this heavily doped implant in a bowl-shaped tunneling junction nearly eliminates the turnon delay, allowing these junctions to be used for pulse tunneling.

In specialized processes, vendors can increase the bulk n− doping beneath the bowl-shaped oxide, i.e., they can convert that part of the n⁻ well to n⁺ to reduce the turn-on delay. While the delay will always exist, it can be reduced to the order of nanoseconds with this technique, and thus made inconsequential.

Turning now to FIGS. 14A, 14B and 14C, FIG. 14A is a top plan view of a pFET synapse transistor in accordance with one embodiment of the present invention useable as an EEPROM and implemented in a double layer polysilicon process; FIG. 14B is a side elevational cross-section of the pFET device of FIG. 14A taken along line 14B—14B of FIG. 14A; and FIG. 14C is an electron conduction band diagram of the device of FIGS. 14A and 14B. The voltages in the diagram are referenced to the source potential, and subthreshold ($I_x$<100 nA) operation is assumed.

In accordance with this embodiment of the present invention the pFET synapse transistor 53 includes a source 54 and a drain 55 formed of p+ doped regions in a first n− well 56. Source 54 has a contact 54' and drain 55 has a contact 55'. A second n− well 56' includes an n+ doped region 57 with a contact 57'. A first polysilicon layer 58.1 acts as a floating gate. A second polysilicon layer 58.2 disposed above the first polysilicon layer 58.1 forms an interpoly capacitor 58.3 with the first polysilicon layer, as shown. First n− well 56 and second n− well 56' are separated by a channel stop 58.4 which may be STI (shallow trench isolation) or LOCOS (local oxidation of silicon). An electric field between the source 54 and the drain 55 in channel 59.1 of injection transistor 59 causes IHEI near the drain 55 injecting hot electrons through gate oxide layer 59.2 and onto the floating gate 58.1. Electrons are removed by FN tunneling at tunneling junction 59.3.

Turning now to FIGS. 20–53, various alternative embodiments of the present invention are now described.

Figure 20:
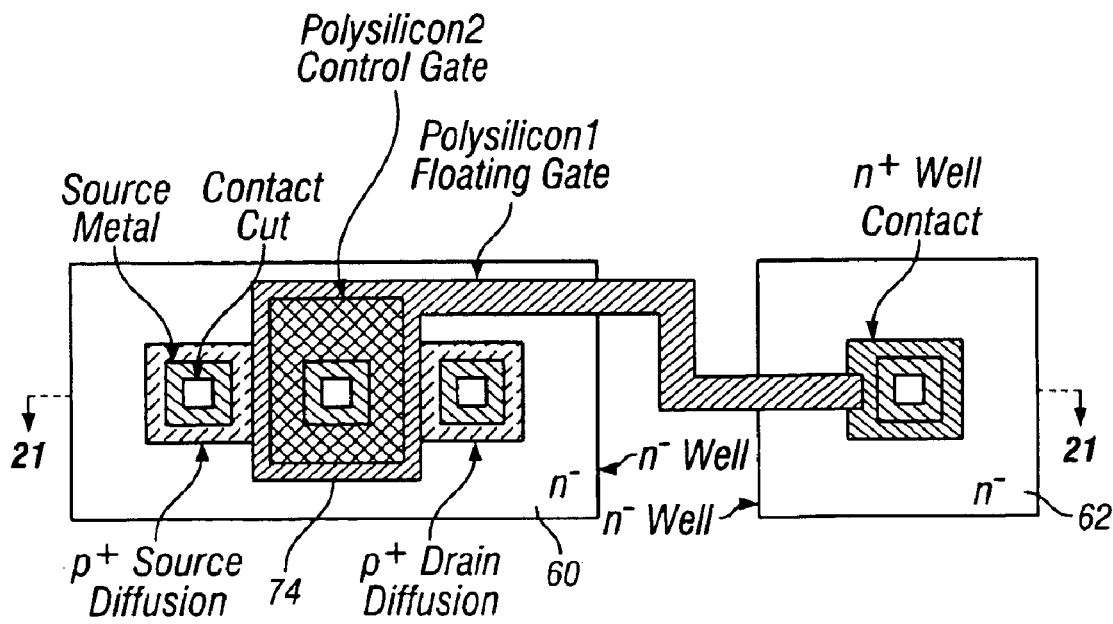
FIGS. 20 and 21 are, respectively, a top plan view and a side elevational cross-section of a two-layer polysilicon version of a device in accordance with one embodiment of the present invention. This version provides four terminals.
Figure 21:
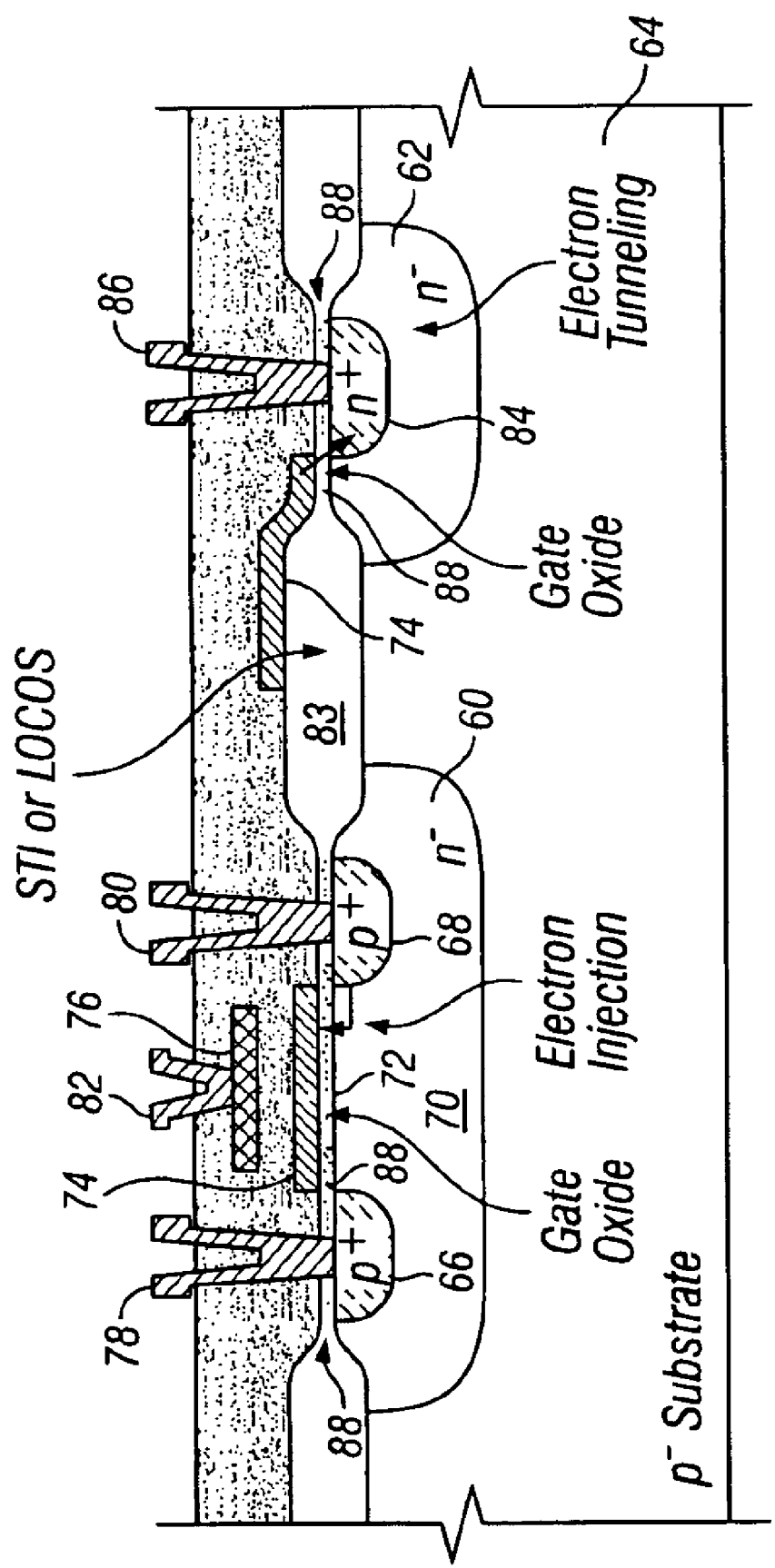

FIGS. 20 and 21 are, respectively, a top plan view and a side elevational cross-section of a two-layer polysilicon version of a device in accordance with the present invention. This version provides four terminals. The cross-sectional drawing of FIG. 21 is taken along line 21—21 of FIG. 20. In accordance with this version, a pair of n− doped wells 60, 62 are formed in a p− doped substrate 64. In the first n− well 60 are disposed a pair of p+ doped regions 66, 68 which act as source and drain, respectively. A channel 70 is formed between source 66 and drain 68. IHEI occurs near drain 68. An insulator such as a silicon gate oxide layer 72 separates channel 70 from polysilicon (poly) 1 layer 74 which serves as a floating gate. Additional insulating material separates floating gate 74 from control gate 76 formed from the poly 2 layer. Source 66, drain 68 and control gate 76 are supplied with contacts 78, 80 and 82, respectively, in a conventional manner. First n− well 60 and second n− well 62 are separate by a channel stop 83 formed with STI (Shallow Trench Isolation) or LOCOS (LOCal Oxidation of Silicon) processes. Floating gate 74 extends over second n− well 62 to an n+ region 84 used for a relatively high-voltage well contact 86 which causes tunneling between floating gate 74 and n+ region 84. An insulator such as a gate oxide layer 88 separates floating gate 74 from n− well 62 and n+ region 84, as shown.

Figure 22:
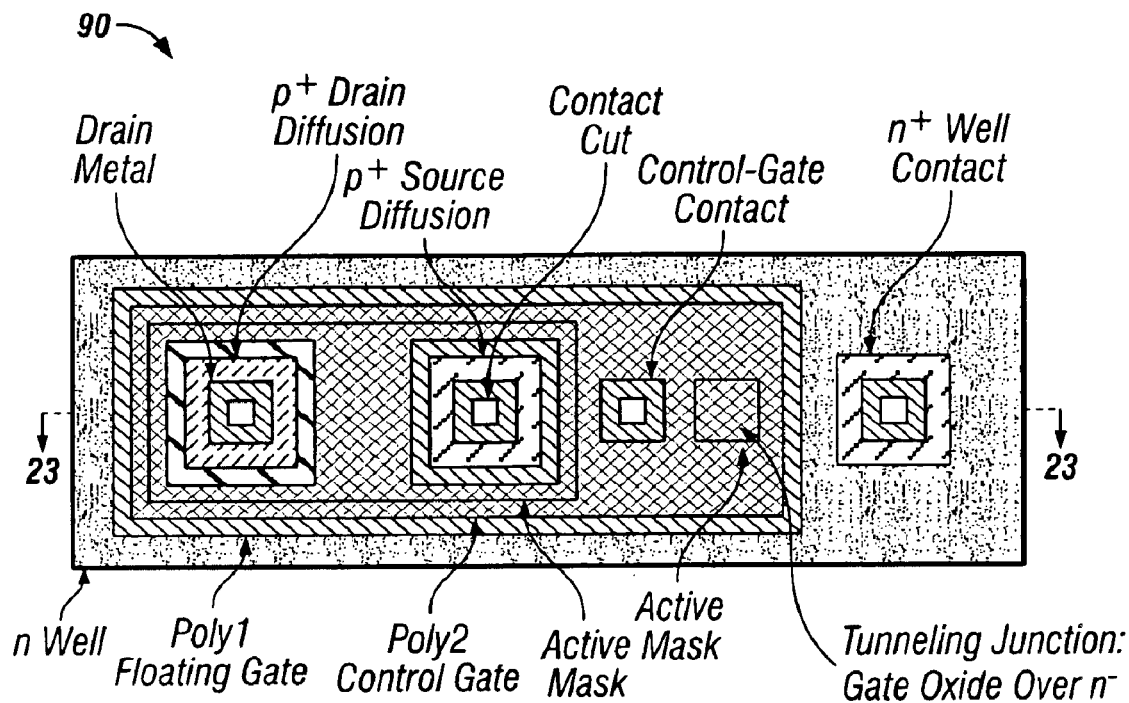
FIGS. 22 and 23 are, respectively, a top plan view and a side elevational cross-section of a two-layer polysilicon version of a device in accordance with one embodiment of the present invention. This version provides four terminals.
Figure 23:
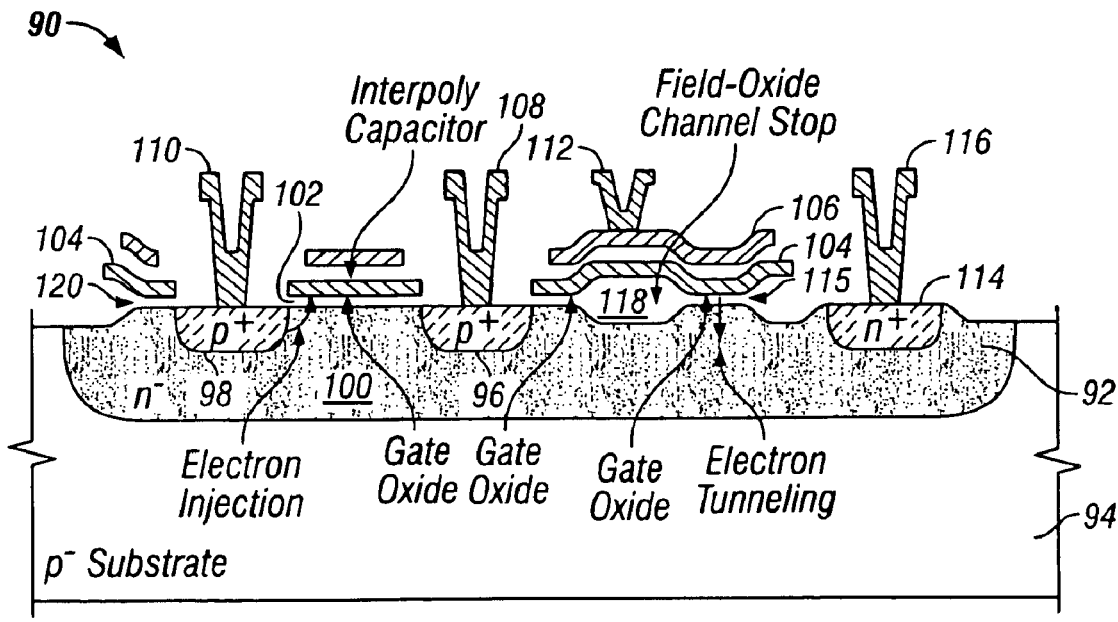

FIGS. 22 and 23 are, respectively, a top plan view and a side elevational cross-section of a two-layer polysilicon version of a device 90 in accordance with the present invention. This version provides four terminals. The cross-sectional drawing of FIG. 23 is taken along line 23—23 of FIG. 22. In accordance with this version, a single n− doped well 92 is formed in a p− doped substrate 94. In the n− well 92 are disposed a pair of p+ doped regions 96, 98 which act as drain and source, respectively. A channel 100 is formed between source 96 and drain 98. IHEI occurs near drain 96. An insulator such as a silicon gate oxide layer 102 separates channel 100 from polysilicon (poly) 1 layer 104 which serves as a floating gate. Additional insulating material separates floating gate 104 from control gate 106 formed from the poly 2 layer. Drain 96, source 98 and control gate 106 are supplied with contacts 108, 110 and 112, respectively, in a conventional manner. An n+ region 114 in n− well region 92 provides a well contact for a tunneling junction 115 for removal of electrons from floating gate 104. A contact 116 is provided for the n+ region 114. Drain region 98 and the tunneling junction 115 are separated by a channel stop 118 formed of STI or LOCOS. Floating gate 104 extends beyond the channel stop 118 but does not extend over n+ region 114. An insulator such as a gate oxide layer 120 separates floating gate 104 from n− well 92, as shown.

Figure 24:
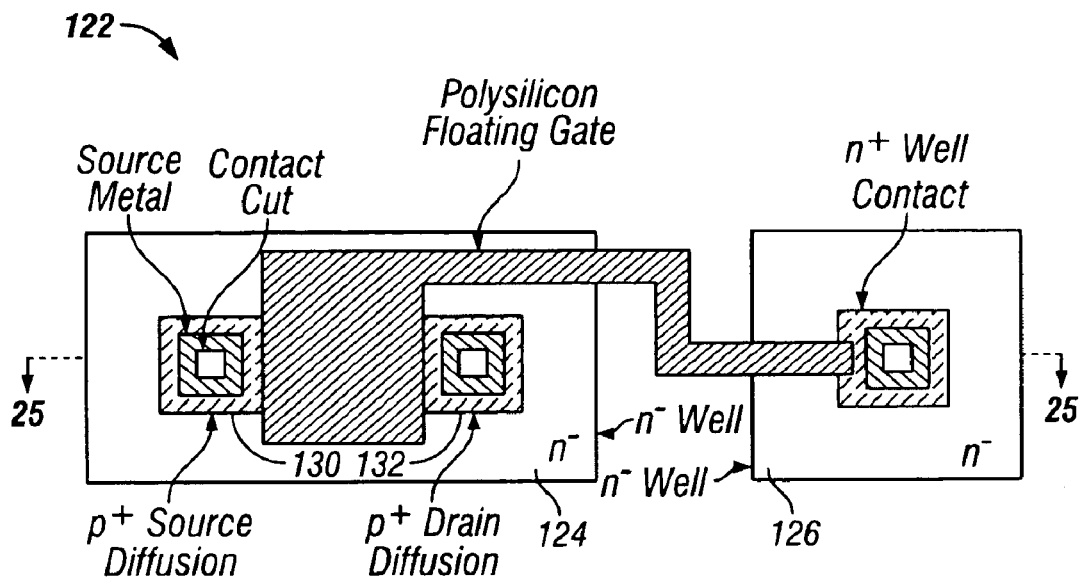
FIGS. 24 and 25 are, respectively, a top plan view and a side elevational cross-section of a single-layer polysilicon version of a device in accordance with an embodiment of the present invention. This device corresponds somewhat to the embodiment of FIGS. 20 and 21 which utilize a two polysilicon layer process. This version provides three terminals.
Figure 25:
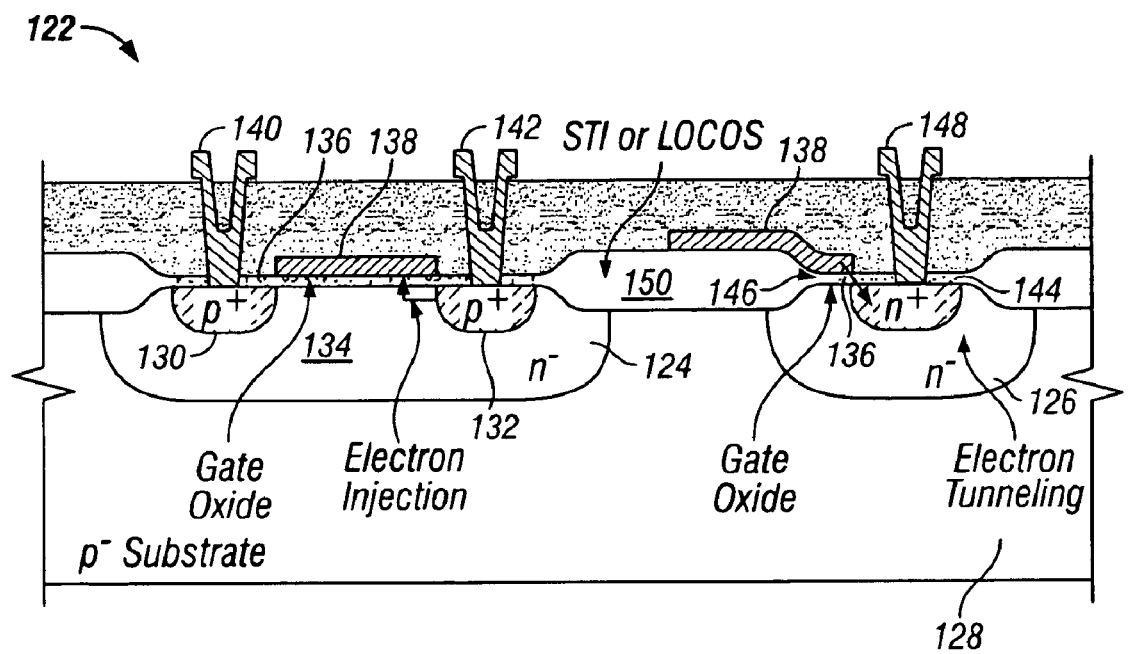

FIGS. 24 and 25 are, respectively, a top plan view and a side elevational cross-section of a single-layer polysilicon version of a device 122 in accordance with the present invention. This device corresponds somewhat to that of FIGS. 20 and 21 which utilize a two polysilicon layer process. This version provides three terminals. The cross-sectional drawing of FIG. 25 is taken along line 25—25 of FIG. 24. In accordance with this version, a pair of n− wells 124, 126 are formed in a p− doped substrate 128. In the first n− well 124 are disposed a pair of p+ doped regions 130, 132 which act as source and drain, respectively. A channel 134 is formed between source 130 and drain 132. IHEI occurs near drain 132. An insulator such as a silicon gate oxide layer 136 separates channel 134 from polysilicon layer 138 which serves as a floating gate. No control gate is required or provided in this embodiment. As a result, no second polysilicon layer is required and the fabrication process is, accordingly, simplified. Source 130 and drain 132 are supplied with contacts 140, 142, respectively, in a conventional manner. An n+ region 144 in n− well region 126 provides a well contact for a tunneling junction 146 for removal of electrons from floating gate 138. A contact 148 is provided for the n+ region 144. First n− well 124 and second n− well 126 are separated by a channel stop 150 formed of STI or LOCOS. Floating gate 138 extends over the channel stop 150 to a region over and abutting n+ region 144 and may partially overlap n+ region 144. An insulator such as a gate oxide layer 136 also separates floating gate 138 from n+ region 144, as shown.

Figure 26:
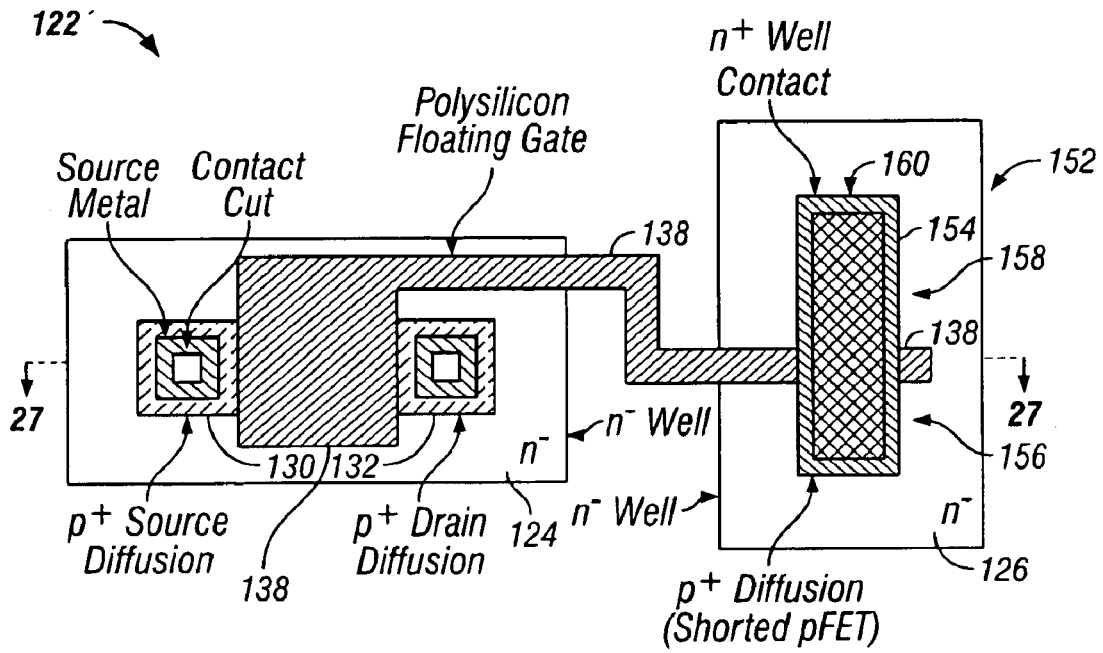
FIGS. 26 and 27 are, respectively, a top plan view and a side elevational cross-section of a single-layer polysilicon version of a device in accordance with an embodiment of the present invention. This device corresponds to the embodiment of FIGS. 24 and 25 except that a shorted pFET is used as the tunneling junction.
Figure 27:
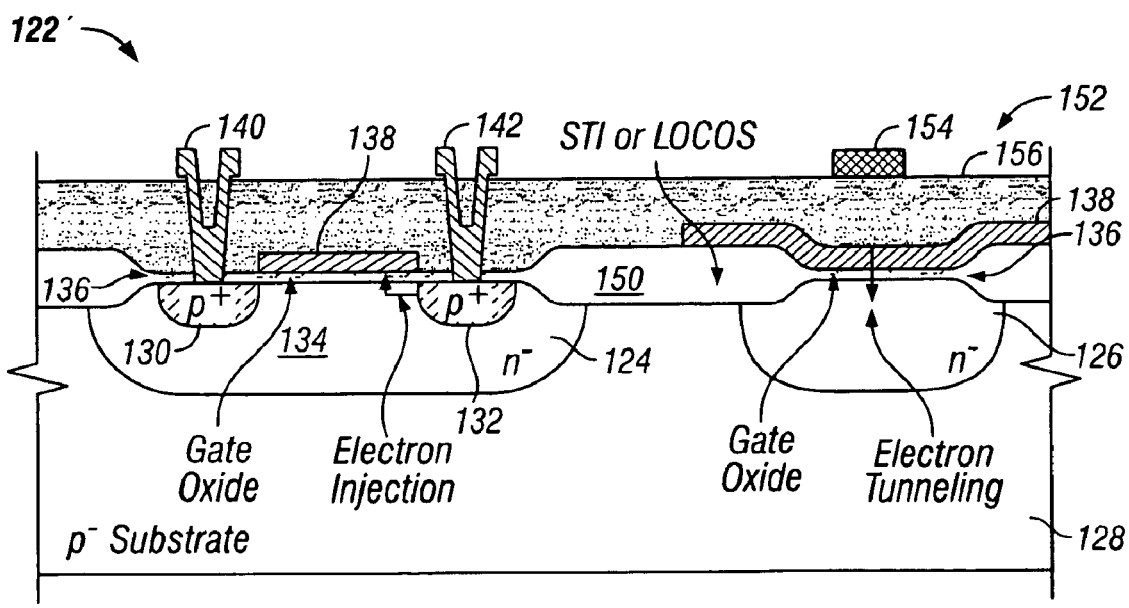

FIGS. 26 and 27 are, respectively, a top plan view and a side elevational cross-section of a single-layer polysilicon version of a device 122' in accordance with the present invention. This device corresponds to device 122 of FIGS. 24 and 25 except that a shorted pFET is used as the tunneling junction. Where possible, this description will use the same reference numbers as are used in the description of FIGS. 24 and 25. As in FIGS. 24 and 25, this is a single poly, three-terminal device. The cross-sectional drawing of FIG. 27 is taken along line 27—27 of FIG. 26. In accordance with this version, a pair of n− wells 124, 126 are formed in a p− doped substrate 128. In the first n− well 124 are disposed a pair of p+ doped regions 130, 132 which act as source and drain, respectively. A channel 134 is formed between source 130 and drain 132. IHEI occurs near drain 132. An insulator such as a silicon gate oxide layer 136 separates channel 134 from polysilicon layer 138 which serves as a floating gate. No control gate is required or provided in this embodiment. As a result, no second polysilicon layer is required and the fabrication process is, accordingly, simplified. Source 130 and drain 132 are supplied with contacts 140, 142, respectively, in a conventional manner.

The device differs from that of FIGS. 24 and 25 as follows. The electron tunneling junction 152 is a shorted pFET disposed in n− well 126 having its source, drain and well contacts shorted together with conductor 154 which may be a metallization layer and also serves as a contact. Source 156 and drain 158 are formed in p+ regions of n− well 126 and well contact 160 is an n+ region of n− well 126. Floating gate 138 is disposed under conductor 154 and separated therefrom by an insulator layer 156. Floating gate 138 is separated from n− well by a layer of insulator such as gate oxide layer 136. First n− well 124 and second n− well 126 are separated by a channel stop 150 formed of STI or LOCOS. Floating gate 138 extends over the channel stop 150 to the tunneling junction 152 as shown.

Figure 28:
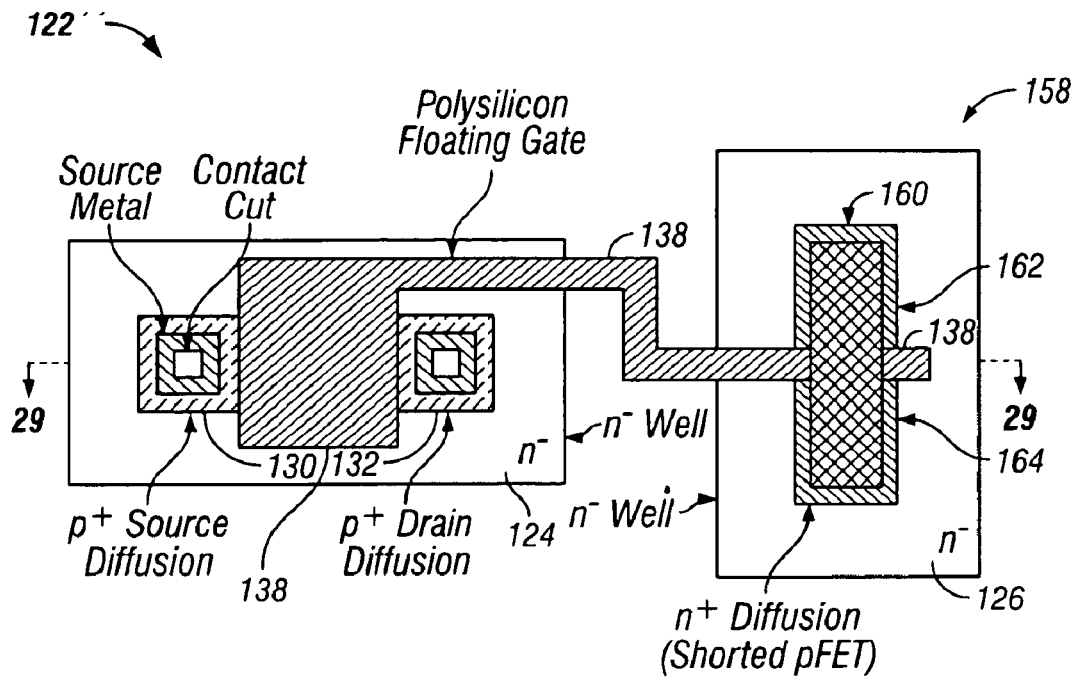
FIGS. 28 and 29 are, respectively, a top plan view and a side elevational cross-section of a single-layer polysilicon version of a device in accordance with an embodiment of the present invention. This device corresponds to the embodiment of FIGS. 26 and 27 except that a shorted nFET is used as the tunneling junction.
Figure 29:
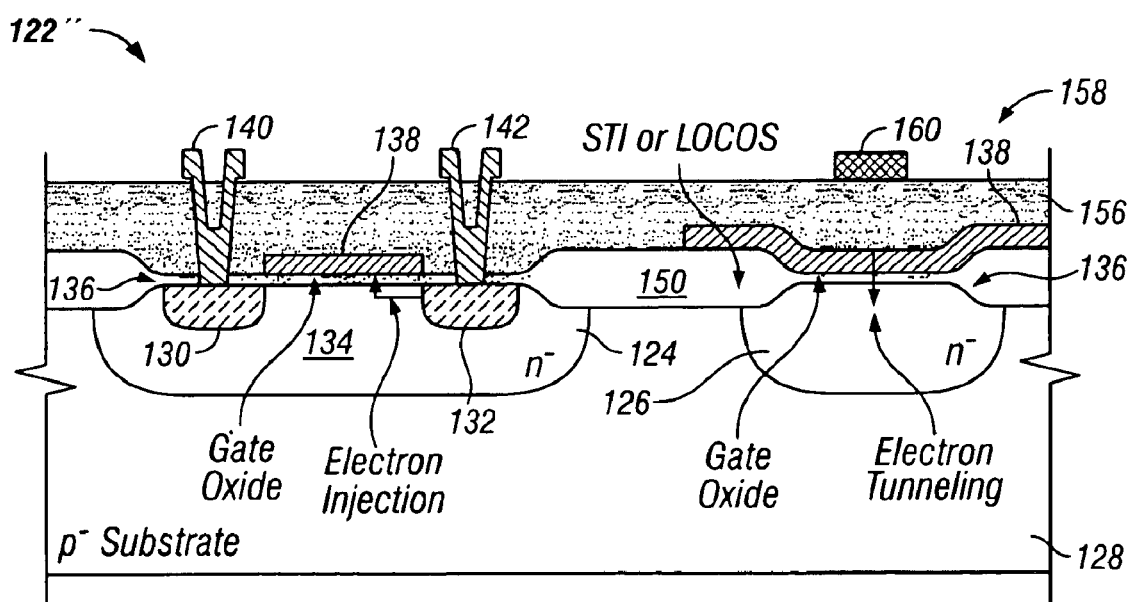

FIGS. 28 and 29 are, respectively, a top plan view and a side elevational cross-section of a single-layer polysilicon version of a device 122" in accordance with the present invention. This device corresponds to device 122' of FIGS. 26 and 27 except that a shorted nFET is used as the tunneling junction. Where possible, this description will use the same reference numbers as are used in the description of FIGS. 26 and 27. As in FIGS. 26 and 27, this is a single poly, three-terminal device. The cross-sectional drawing of FIG. 29 is taken along line 29—29 of FIG. 28. In accordance with this version, a pair of n− wells 124, 126 are formed in a p− doped substrate 128. In the first n– well 124 are disposed a pair of p+ doped regions 130, 132 which act as source and drain, respectively. A channel 134 is formed between source 130 and drain 132. IHEI occurs near drain 132. An insulator such as a silicon gate oxide layer 136 separates channel 134 from polysilicon layer 138 which serves as a floating gate. No control gate is required or provided in this embodiment. As a result, no second polysilicon layer is required and the fabrication process is, accordingly, simplified. Source 130 and drain 132 are supplied with contacts 140, 142, respectively, in a conventional manner.

The device differs from that of FIGS. 26 and 27 as follows. The electron tunneling junction 158 is a shorted nFET disposed in n– well 126 having its source and drain shorted together with conductor 160 which may be a metallization layer and also serves as a contact. Source 162 and drain 164 are formed in n+ regions of n– well 126. Floating gate 138 is disposed under conductor 160 and separated therefrom by an insulator layer 156. Floating gate 138 is separated from n– well by a layer of insulator such as gate oxide layer 136. First n– well 124 and second n– well 126 are separated by a channel stop 150 formed of STI or LOCOS. Floating gate 138 extends over the channel stop 150 to the tunneling junction 152 as shown.

Figure 30:
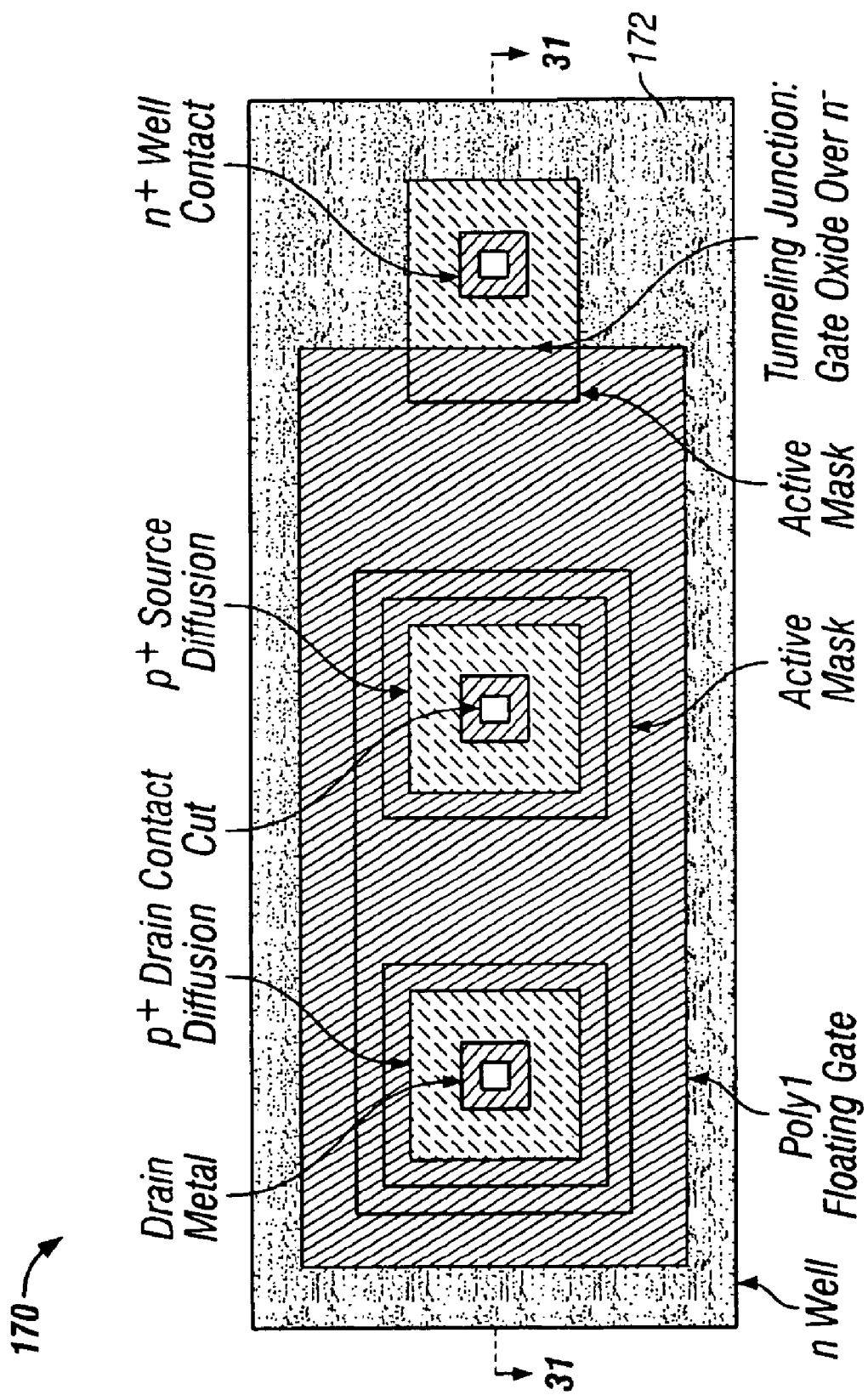
FIGS. 30 and 31 are, respectively, a top plan view and a side elevational cross-section of a single-layer polysilicon version of a device in accordance with an embodiment of the present invention. This version provides three terminals.
Figure 31:
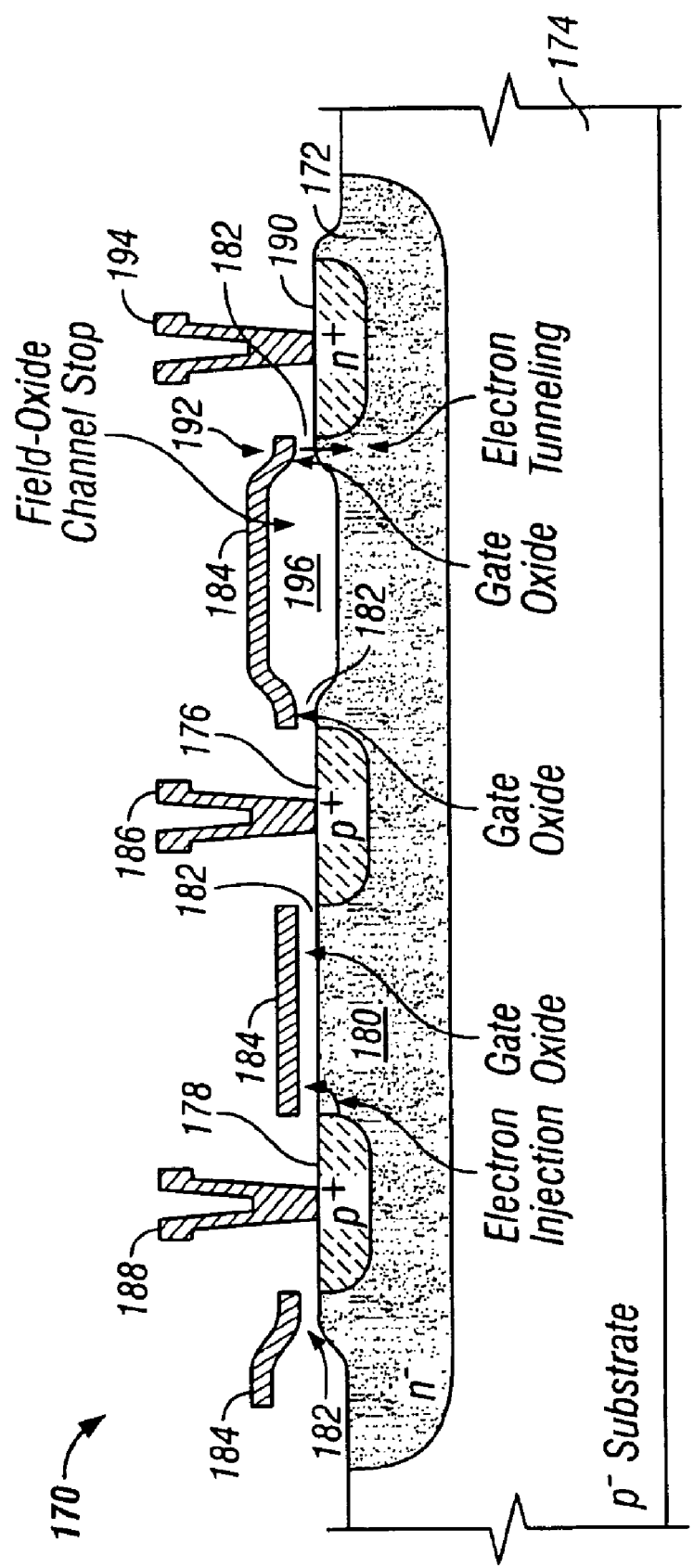

FIGS. 30 and 31 are, respectively, a top plan view and a side elevational cross-section of a single-layer polysilicon version of a device 170 in accordance with an embodiment of the present invention. This version provides three terminals. The cross-sectional drawing of FIG. 31 is taken along line 31—31 of FIG. 30. In accordance with this version, a single n– doped well 172 is formed in a p– doped substrate 174. In the n– well 172 are disposed a pair of p+ doped regions 176, 178 which act as drain and source, respectively. A channel 180 is formed between source 178 and drain 176. IHEI occurs near drain 176. An insulator such as a silicon gate oxide layer 182 separates channel 180 from polysilicon (poly) layer 184 which serves as a floating gate. There is no control gate in this embodiment and a second poly layer is not used or required. Source 176 and drain 178 are supplied with contacts 186 and 188, respectively, in a conventional manner. An n+ region 190 in n– well region 174 provides a well contact for a tunneling junction 192 for removal of electrons from floating gate 184. A contact 194 is provided for the n+ region 190. Drain region 178 and the tunneling junction 192 are separated by a channel stop 196 formed of STI or LOCOS. Floating gate 184 extends over the channel stop 196 and may extend over a portion of n+ region 190. An insulator such as gate oxide layer 182 separates floating gate 184 from n– well 172, as shown.

Figure 32:
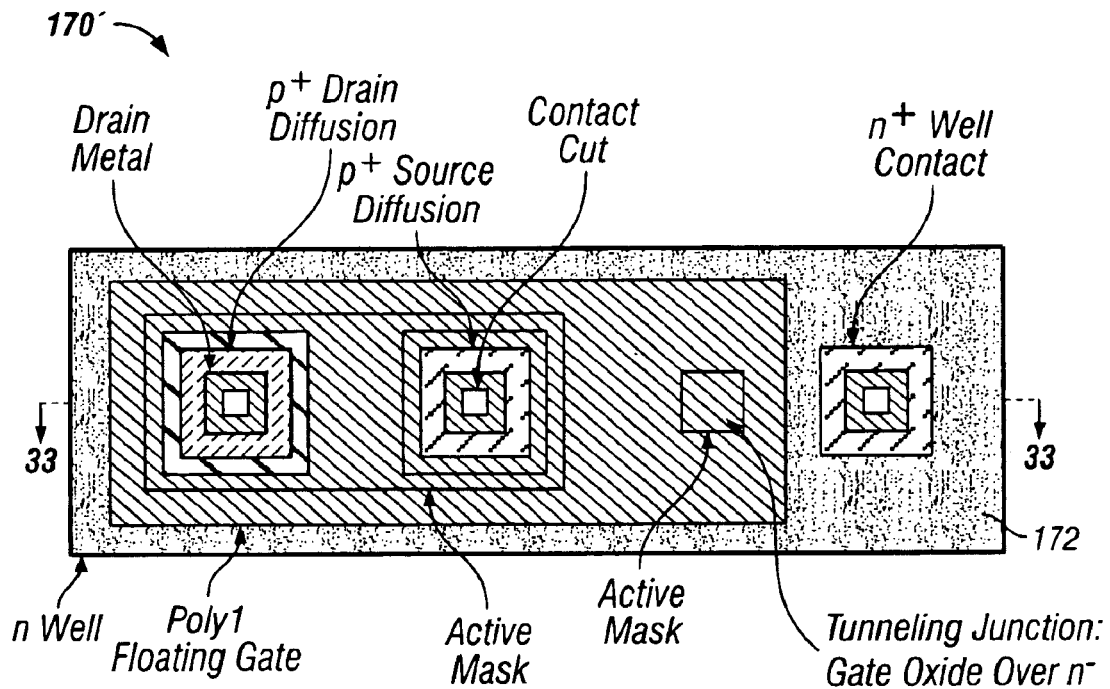
FIGS. 32 and 33 are, respectively, a top plan view and a side elevational cross-section of a single-layer polysilicon version of a device in accordance with an embodiment of the present invention. This version provides three terminals and utilizes a bowl-shaped tunneling junction.
Figure 33:
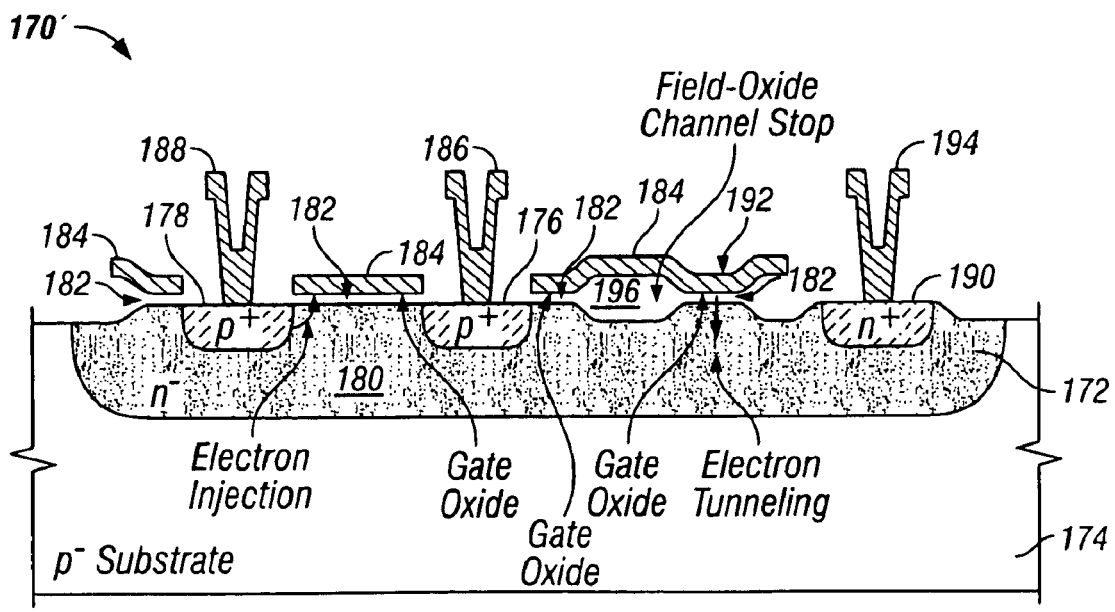

FIGS. 32 and 33 are, respectively, a top plan view and a side elevational cross-section of a single-layer polysilicon version of a device 170' in accordance with an embodiment of the present invention. This version provides three terminals and utilizes a bowl-shaped tunneling junction. The cross-sectional drawing of FIG. 33 is taken along line 33—33 of FIG. 32. This device corresponds to device 170 of FIGS. 30 and 31 except that it uses a bowl-shaped tunneling junction and contains related modifications. Where possible, this description will use the same reference numbers as are used in the description of FIGS. 30 and 31. In accordance with this version, a single n– doped well 172 is formed in a p– doped substrate 174. In the n– well 172 are disposed a pair of p+ doped regions 176, 178 which act as drain and source, respectively. A channel 180 is formed between source 178 and drain 176. IHEI occurs near drain 176. An insulator such as a silicon gate oxide layer 182 separates channel 180 from polysilicon (poly) layer 184 which serves as a floating gate. There is no control gate in this embodiment and a second poly layer is not used or required. Source 178 and drain 176 are supplied with contacts 186 and 188, respectively, in a conventional manner. An n+ region 190 in n– well region 174 provides a well contact for a bowl-shaped tunneling junction 192 for removal of electrons from floating gate 184. A contact 194 is provided for the n+ region 190. Drain region 178 and the tunneling junction 192 are separated by a channel stop 196 formed of STI or LOCOS. Floating gate 184 extends over the channel stop 196 and does not extend over any portion of n+ region 190 in this embodiment. An insulator such as gate oxide layer 182 separates floating gate 184 from n– well 172, as shown.

Figure 34:
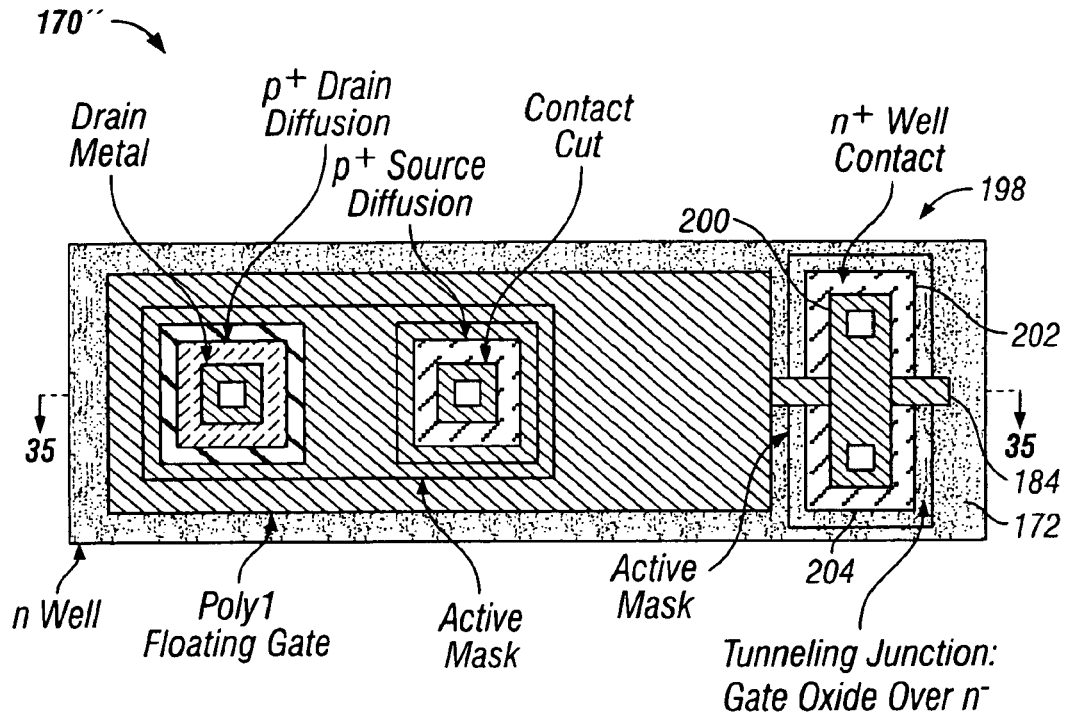
FIGS. 34 and 35 are, respectively, a top plan view and a side elevational cross-section of a single-layer polysilicon version of a device in accordance with an embodiment of the present invention. This version provides three terminals and utilizes a shorted nFET as the tunneling junction.
Figure 35:
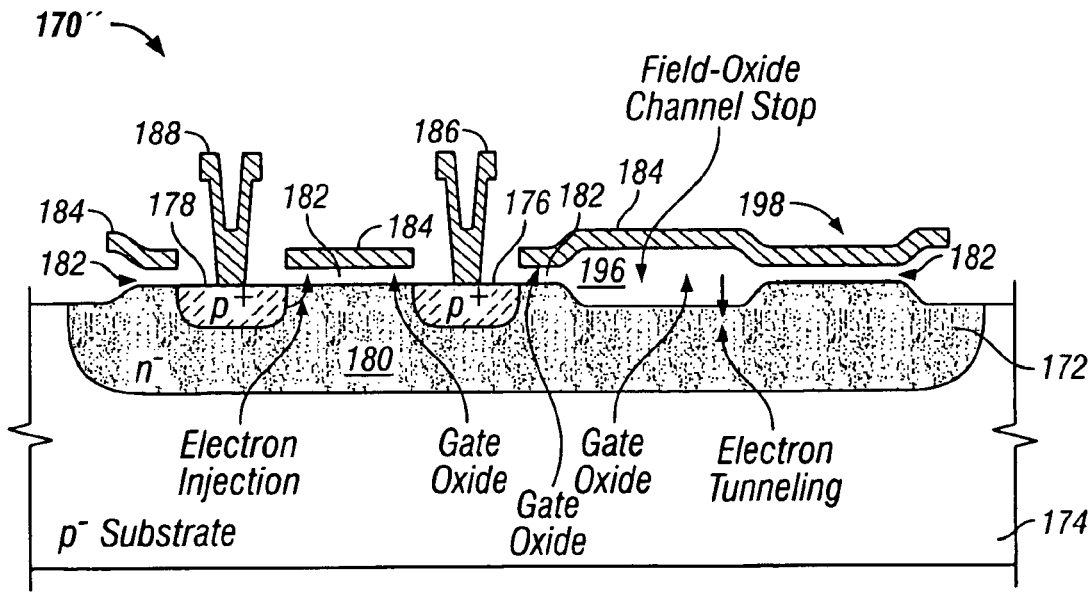

FIGS. 34 and 35 are, respectively, a top plan view and a side elevational cross-section of a single-layer polysilicon version of a device 170" in accordance with an embodiment of the present invention. This version provides three terminals and utilizes a shorted nFET as the tunneling junction. The cross-sectional drawing of FIG. 35 is taken along line 35—35 of FIG. 34. This device corresponds to device 170' of FIGS. 32 and 33 except that it uses a shorted nFET as the tunneling junction and contains related modifications. Where possible, this description will use the same reference numbers as are used in the description of FIGS. 32 and 33. In accordance with this version, a single n– doped well 172 is formed in a p– doped substrate 174. In the n– well 172 are disposed a pair of p+ doped regions 176, 178 which act as drain and source, respectively. A channel 180 is formed between source 178 and drain 176. IHEI occurs near drain 176. An insulator such as a silicon gate oxide layer 182 separates channel 180 from polysilicon (poly) layer 184 which serves as a floating gate. There is no control gate in this embodiment and a second poly layer is not used or required. Source 178 and drain 176 are supplied with contacts 186 and 188, respectively, in a conventional manner.

The device differs from that of FIGS. 32 and 33 as follows. The electron tunneling junction 198 is a shorted nFET disposed in n– well 172 having its source and drain shorted together with conductor 200 which may be a metallization layer and may also serve as a contact, if desired. Source 202 and drain 204 are formed in n+ regions of n– well 172. Floating gate 184 is disposed under conductor 200 and separated therefrom by an insulator layer (not shown in this embodiment but shown in the FIGS. 28/29 embodiment as layer 156). Floating gate 184 is separated from n– well 172 by a layer of insulator such as gate oxide layer 182. Drain region 176 and the tunneling junction 198 are separated by a channel stop 196 formed of STI or LOCOS. Floating gate 184 extends over the channel stop 196 and extends between the conductor layer 200 and n– well 172 as shown in the FIGS. 28/29 embodiment. An insulator such as gate oxide layer 182 separates floating gate 184 from n– well 172, as shown and a conventional insulation layer (156 in FIGS. 28/29 embodiment) insulated floating gate 184 from conductor 200.

Figure 36:
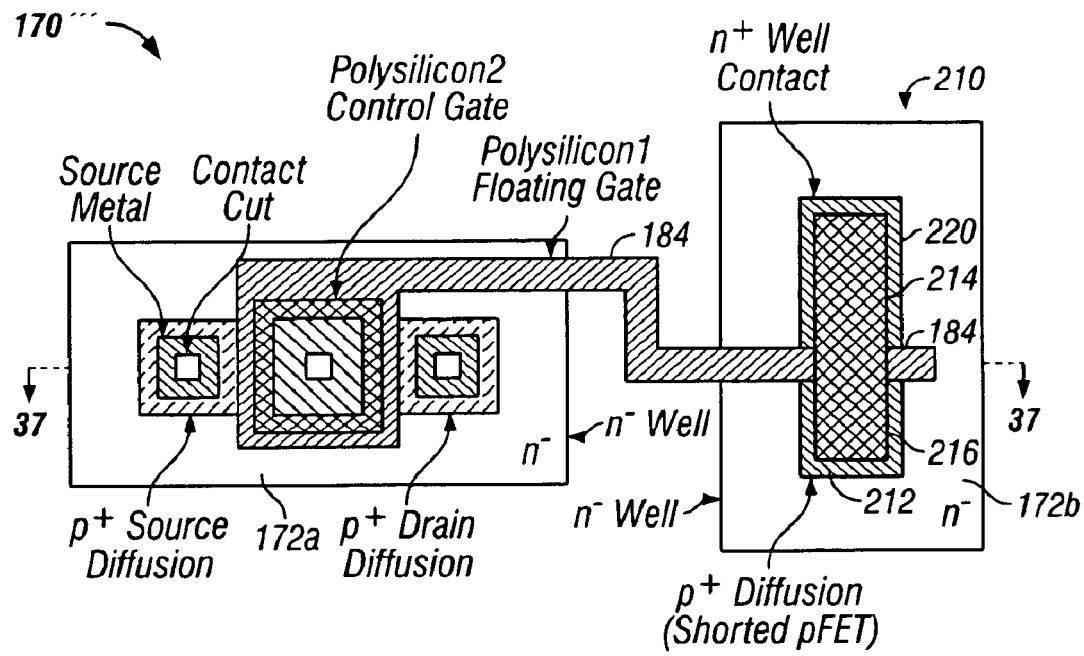
FIGS. 36 and 37 are, respectively, a top plan view and a side elevational cross-section of a double-layer polysilicon version of a device in accordance with an embodiment of the present invention. This version provides four terminals and utilizes a shorted pFET as the tunneling junction.
Figure 37:
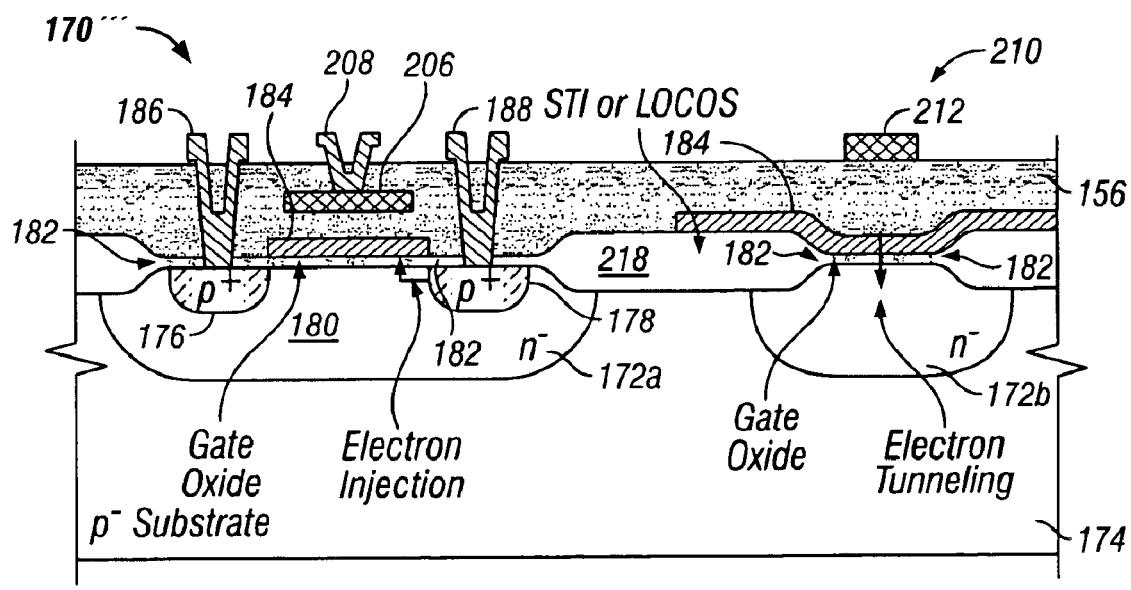

FIGS. 36 and 37 are, respectively, a top plan view and a side elevational cross-section of a double-layer polysilicon version of a device 170''' in accordance with an embodiment of the present invention. This version provides four terminals and utilizes a shorted pFET as the tunneling junction. It is implemented in a double poly process. The cross-sectional drawing of FIG. 37 is taken along line 37—37 of FIG. 36. This device employs a shorted pFET as the tunneling junction, a double poly layer and a pair of n– wells. Where possible, this description will use the same reference numbers as are used in the description of FIGS. 34 and 35. In accordance with this version, a pair of n− doped wells 172*a* and 172*b* are formed in a p− doped substrate 174. In the first n− well 172*a* are disposed a pair of p+ doped regions 176, 178 which act as source and drain, respectively. A channel 180 is formed between source 176 and drain 178. IHEI occurs near drain 178. An insulator such as a silicon gate oxide layer 182 separates channel 180 from first polysilicon (poly) layer 184 which serves as a floating gate. A control gate 206 may be formed from a second poly layer. Control gate 206 is provided with a contact 208 in a conventional manner. Source 176 and drain 178 are supplied with contacts 186 and 188, respectively, in a conventional manner. A conventional insulation layer 156 formed, for example, by thermally grown or deposited silicon oxide, insulates control gate 206 from floating gate 184.

The electron tunneling junction 210 is a shorted pFET (as in the FIGS. 26/27 embodiment) disposed in n− well 172*b* having its p+ source and p+ drain shorted together with conductor 212 which may be a metallization layer and may also serve as a contact, if desired. n+ well contact 220 is also shorted with source 214 and drain 216. Source 214 and drain 216 are formed in n+ regions of n− well 172*b*. Floating gate 184 is disposed under conductor 212 and separated therefrom by insulator layer 156. Floating gate 184 is separated from n− well 172*b* by a layer of insulator such as gate oxide layer 182. Wells 172*a* and 172*b* are separated by a channel stop 218 formed of STI or LOCOS. Floating gate 184 extends over the channel stop 218 and extends between the conductor layer 212 and n− well 172*b* as shown.

Figure 38:
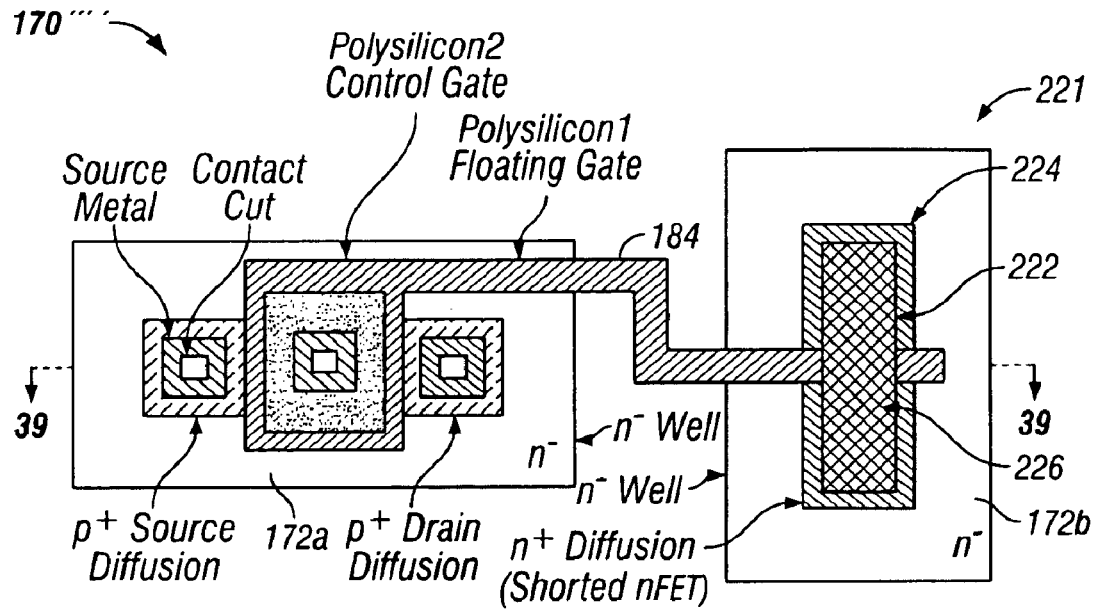
FIGS. 38 and 39 are, respectively, a top plan view and a side elevational cross-section of a double-layer polysilicon version of a device in accordance with an embodiment of the present invention. This version provides four terminals and utilizes a shorted nFET as the tunneling junction.
Figure 39:
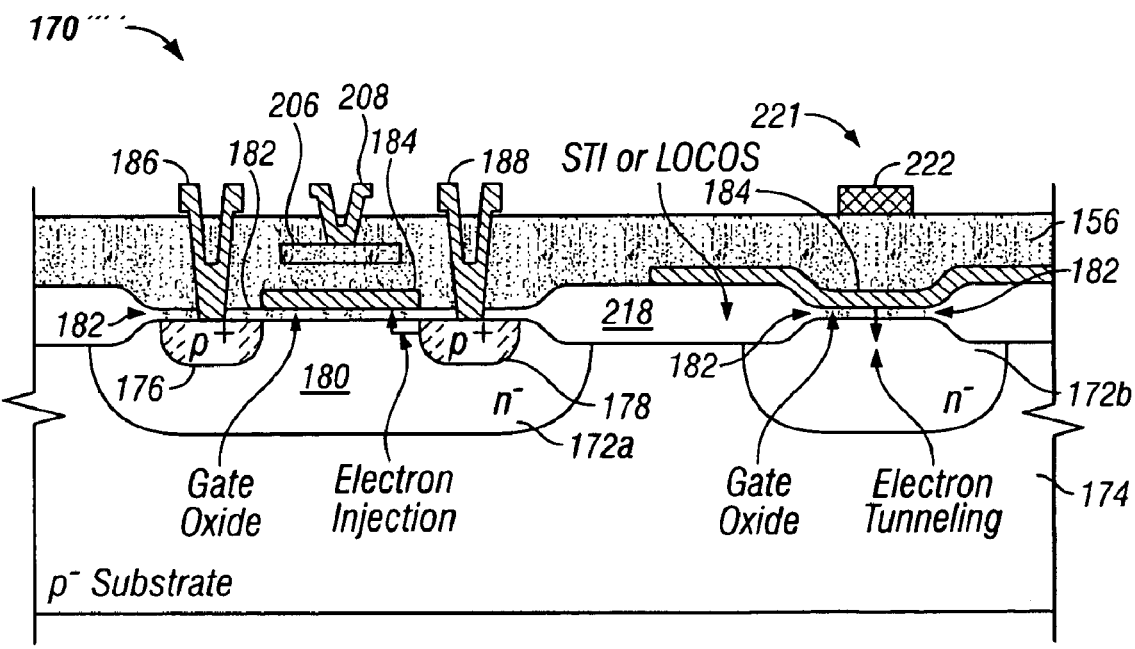

FIGS. 38 and 39 are, respectively, a top plan view and a side elevational cross-section of a double-layer polysilicon version of a device 170"" in accordance with an embodiment of the present invention. This version provides four terminals and utilizes a shorted nFET as the tunneling junction. It is implemented in a double poly process. The cross-sectional drawing of FIG. 39 is taken along line 39—39 of FIG. 38. In accordance with this embodiment, a pair of n− doped wells 172*a* and 172*b* are formed in a p− doped substrate 174. In the first n− well 172*a* are disposed a pair of p+ doped regions 176, 178 which act as source and drain, respectively. A channel 180 is formed between source 176 and drain 178. IHEI occurs near drain 178. An insulator such as a silicon gate oxide layer 182 separates channel 180 from first polysilicon (poly) layer 184 which serves as a floating gate. A control gate 206 may be formed from a second poly layer. Control gate 206 is provided with a contact 208 in a conventional manner. Source 176 and drain 178 are supplied with contacts 186 and 188, respectively, in a conventional manner. A conventional insulation layer 156 formed, for example, by thermally grown or deposited silicon oxide, insulates control gate 206 from floating gate 184.

The electron tunneling junction 221 is a shorted nFET (as in the FIGS. 28/29 embodiment) disposed in n− well 172*b* having its n+ source 224 and n+ drain 226 shorted together with conductor 222 which may be a metallization layer and may also serve as a contact, if desired. Source 224 and drain 226 are formed in n+ regions of n− well 172*b*. Floating gate 184 is disposed under conductor 222 and separated therefrom by insulator layer 156. Floating gate 184 is separated from n− well 172*b* by a layer of insulator such as gate oxide layer 182. Wells 172*a* and 172*b* are separated by a channel stop 218 formed of STI or LOCOS. Floating gate 184 extends over the channel stop 218 and extends between the conductor layer 212 and n− well 172*b* as shown.

Turning now to FIGS. 40–47 are a number of embodiments of the present invention where the control gate capacitance is implemented separately.

Figure 40:
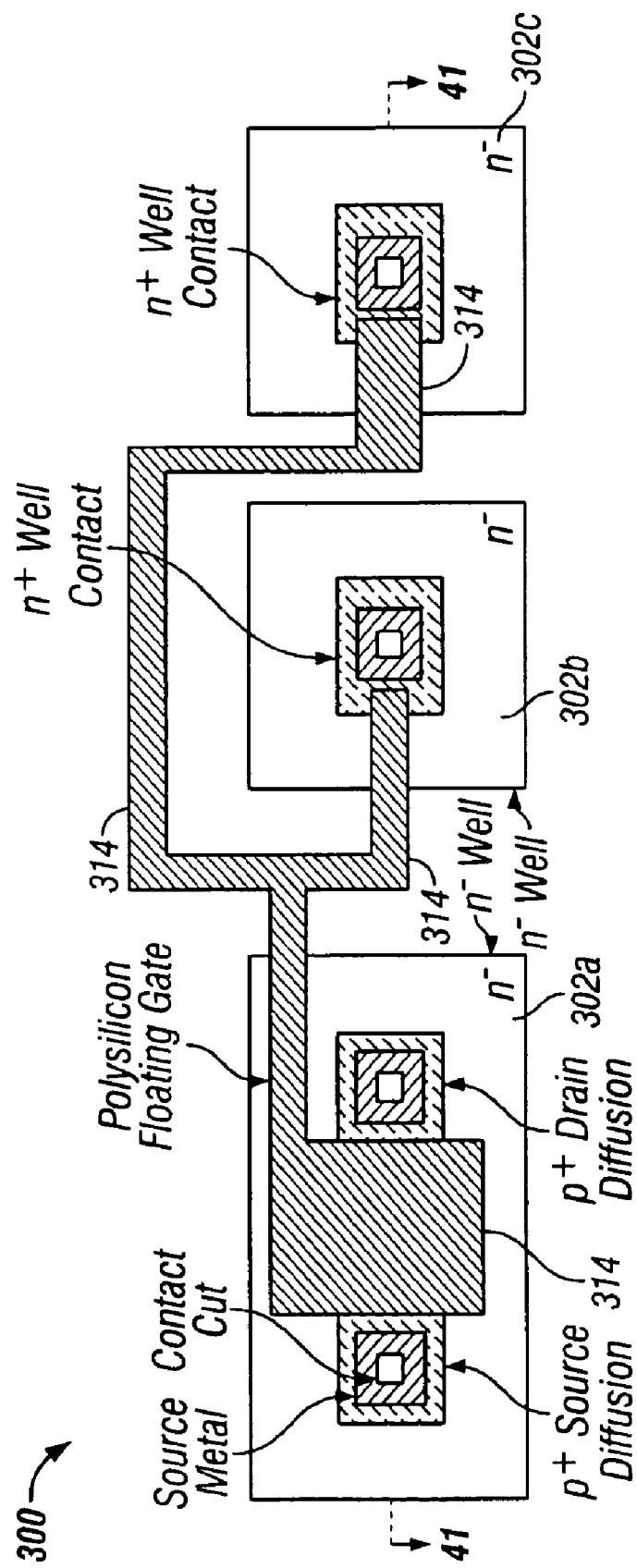
FIGS. 40 and 41 are, respectively, a top plan view and a side elevational cross-section of a single-layer polysilicon version of a device in accordance with an embodiment of the present invention. This version provides four terminals and utilizes a three-n– well approach to provide a separate control capacitor.
Figure 41:
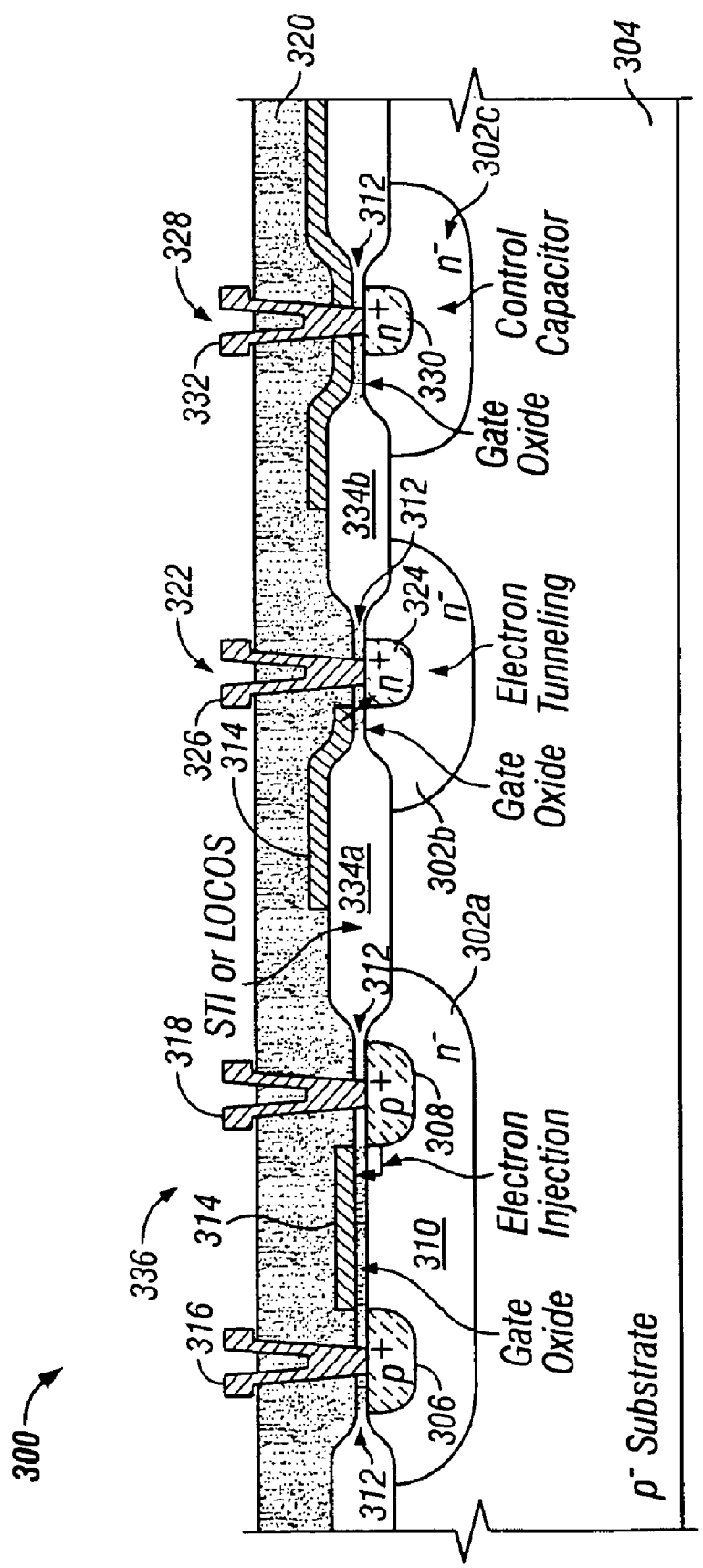

FIGS. 40 and 41 are, respectively, a top plan view and a side elevational cross-section of a single-layer polysilicon version of a device 300 in accordance with an embodiment of the present invention. This version provides four terminals and utilizes a three-n− well approach to provide a separate control capacitor between the floating gate and the n− well 302*c*. The cross-sectional drawing of FIG. 41 is taken along line 41—41 of FIG. 40. In accordance with this embodiment, three n− doped wells 302*a*, 302*b* and 302*c* are formed in a p− doped substrate 304. In the first n− well 302*a* are disposed a pair of p+ doped regions 306, 308 which act as source and drain, respectively. A channel 310 is formed between source 306 and drain 308. IHEI occurs near drain 308. An insulator such as a silicon gate oxide layer 312 separates channel 310 from the polysilicon (poly) layer 314 which serves as a floating gate. No control gate is provided in this embodiment. Source 306 and drain 308 are supplied with contacts 316 and 318, respectively, in a conventional manner. A conventional insulation layer 320 is formed over floating gate 314, for example by thermally grown or deposited silicon oxide.

An electron tunneling junction 322 is provided in second well 302*b* and includes an n+ region 324. Region 324 is separated from floating gate 314 by an insulator such as layer 312 (silicon gate oxide) and is provided with a contact 326.

A separate control capacitor 328 is provided in third well 302*c* and includes an n+ region 330. Region 330 is provided with a contact 332. Floating gate 314 overlies at least a portion of well 302*c* to provide capacitance.

Wells 302*a*, 302*b* and 302*c* are separated from one another by channel stops 334*a* and 334*b* formed of STI or LOCOS. Floating gate 314 extends over the channel stops 334*a* and 334*b* as shown to couple together the electron injection portion of the device 336, the electron tunneling portion of the device 322 and the control capacitor portion of the device 328, as shown. It is also possible to arrange the various components differently on the substrate, as for example by having the control capacitor portion 328 disposed between the electron injection portion 336 and the electron tunneling portion 322, or by placing the electron injection portion 336 between the electron tunneling portion 322 and the control capacitor portion 328.

Figure 42:
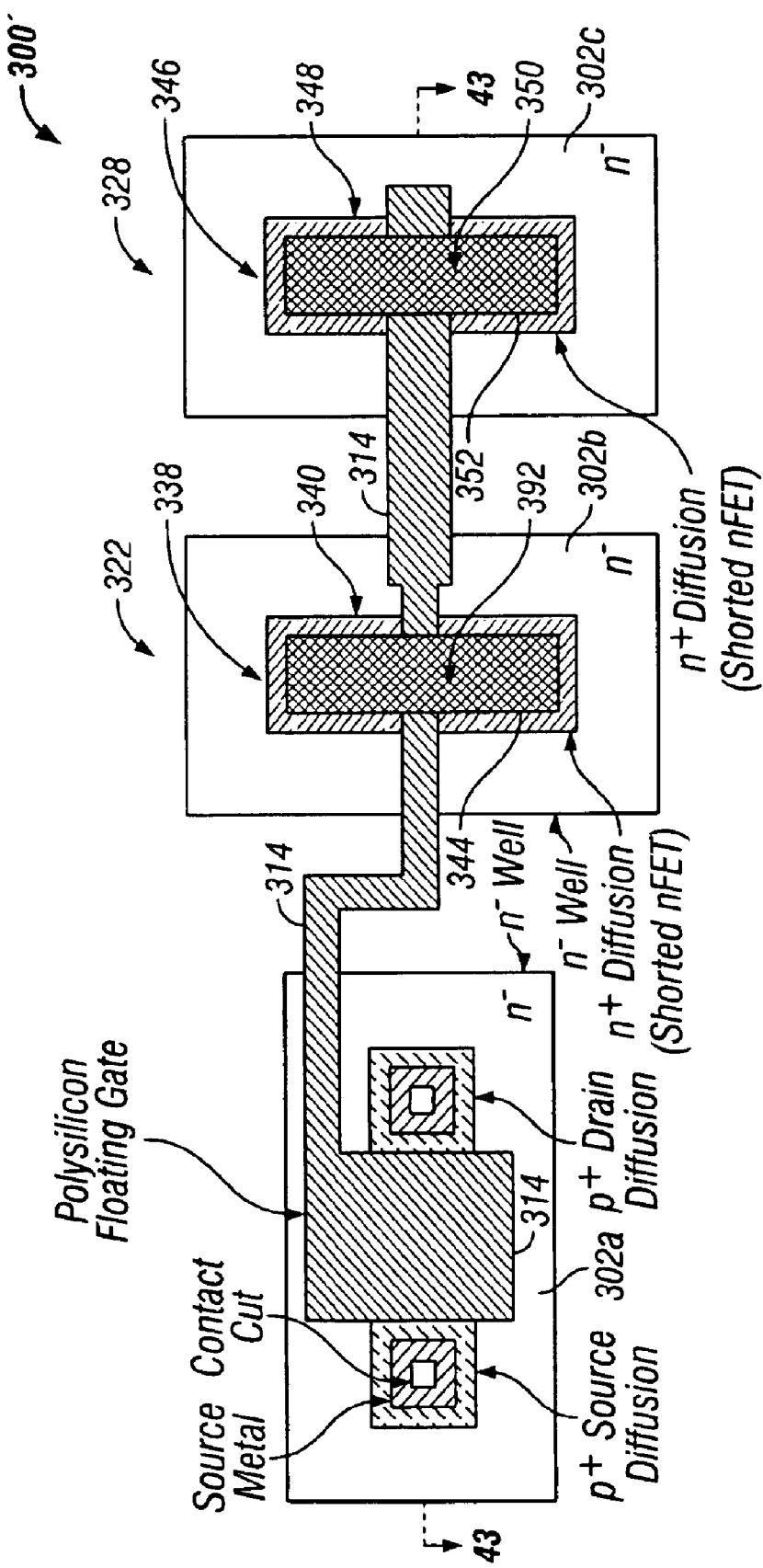
FIGS. 42 and 43 are, respectively, a top plan view and a side elevational cross-section of a single-layer polysilicon version of a device in accordance with an embodiment of the present invention. This version provides four terminals and utilizes a three-n– well approach to provide a separate control capacitor.
Figure 43:
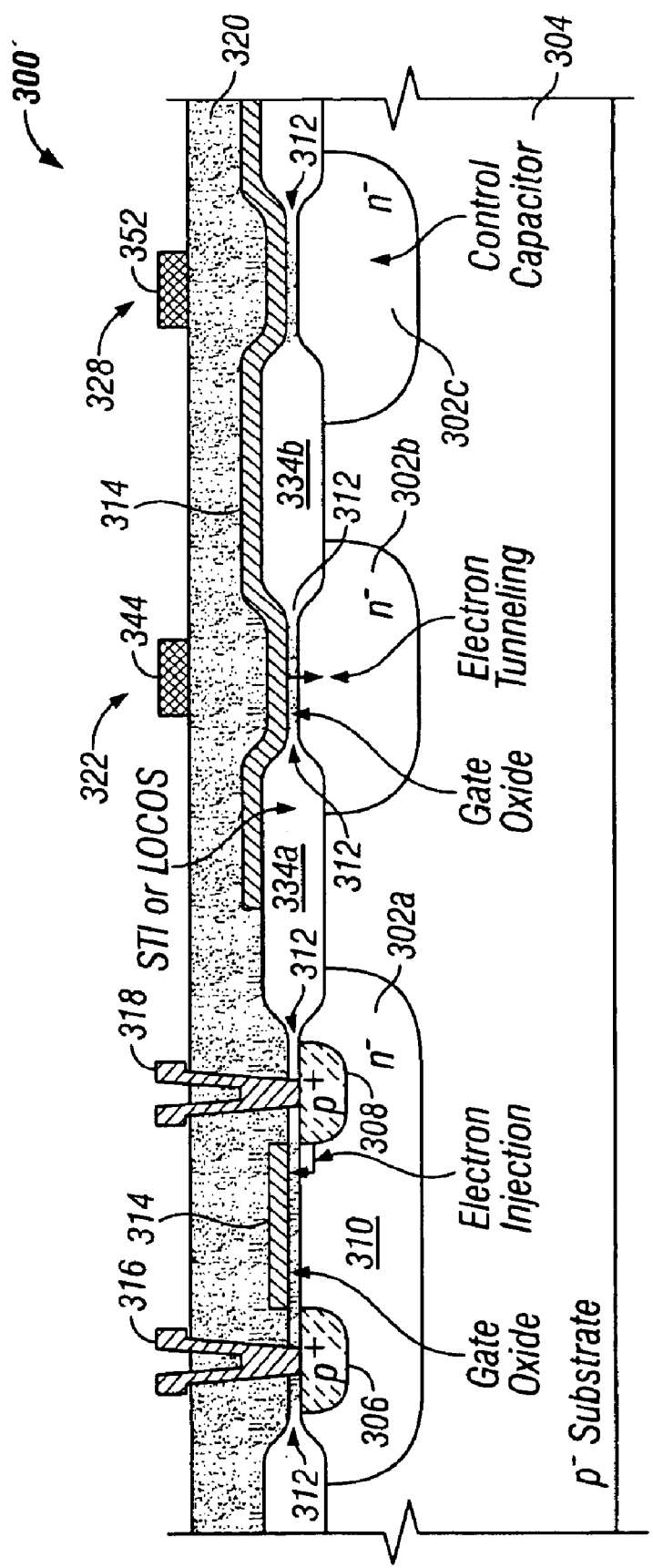

FIGS. 42 and 43 are, respectively, a top plan view and a side elevational cross-section of a single-layer polysilicon version of a device 300' in accordance with an embodiment of the present invention. This version provides four terminals and utilizes a three-n− well approach to provide a separate control capacitor between the floating gate and the n− well 302*c* as in the embodiment of FIGS. 40 and 41. In this embodiment, one or more of the electron tunneling portion 322 and the control capacitor portion 328 are implemented with a shorted nFET. The cross-sectional drawing of FIG. 43 is taken along line 43—43 of FIG. 42. In accordance with this embodiment, three n− doped wells 302*a*, 302*b* and 302*c* are formed in a p− doped substrate 304. In the first n− well 302*a* are disposed a pair of p+ doped regions 306, 308 which act as source and drain, respectively. A channel 310 is formed between source 306 and drain 308. IHEI occurs near drain 308. An insulator such as a silicon gate oxide layer 312 separates channel 310 from the polysilicon (poly) layer 314 which serves as a floating gate. No control gate is provided in this embodiment. Source 306 and drain 308 are supplied with contacts 316 and 318, respectively, in a conventional manner. A conventional insulation layer 320 is formed over floating gate 314, for example by thermally grown or deposited silicon oxide.

An electron tunneling junction 322 is provided in second well 302b and includes a shorted nFET transistor 338 having an n+ drain region 340, an n+ source region 342, and a shorting conductor 344 which also acts as a contact and shorts together the drain and source connections. Floating gate 314 is arranged to be separated from second well 302b by a gate oxide layer 312 to permit tunneling of electrons off of floating gate 314.

A separate control capacitor 328 is provided in third well 302c and includes a shorted nFET transistor 346 having a n+ drain region 348, an n+ source region 350, and a shorting conductor 352 which also acts as a contact and shorts together the drain and source connections. Floating gate 314 is arranged to be separated from third well 302c by a gate oxide layer 312 to provide the dielectric for the capacitor 328. Floating gate 314 overlies at least a portion of well 302c to provide capacitance.

In alternative embodiments, the capacitor sections 328 of the FIGS. 42/43 embodiments may be exchanged for those of the FIGS. 40/41 embodiments and/or the electron tunneling sections 322 may be so exchanged so that both are not implemented with a shorted nFET.

Wells 302a, 302b and 302c are separated from one another by channel stops 334a and 334b formed of STI or LOCOS. Floating gate 314 extends over the channel stops 334a and 334b as shown to couple together the electron injection portion of the device 336, the electron tunneling portion of the device 322 and the control capacitor portion of the device 328, as shown. It is also possible to arrange the various components differently on the substrate, as for example by having the control capacitor portion 328 disposed between the electron injection portion 336 and the electron tunneling portion 322, or by placing the electron injection portion 336 between the electron tunneling portion 322 and the control capacitor portion 328.

Figure 44:
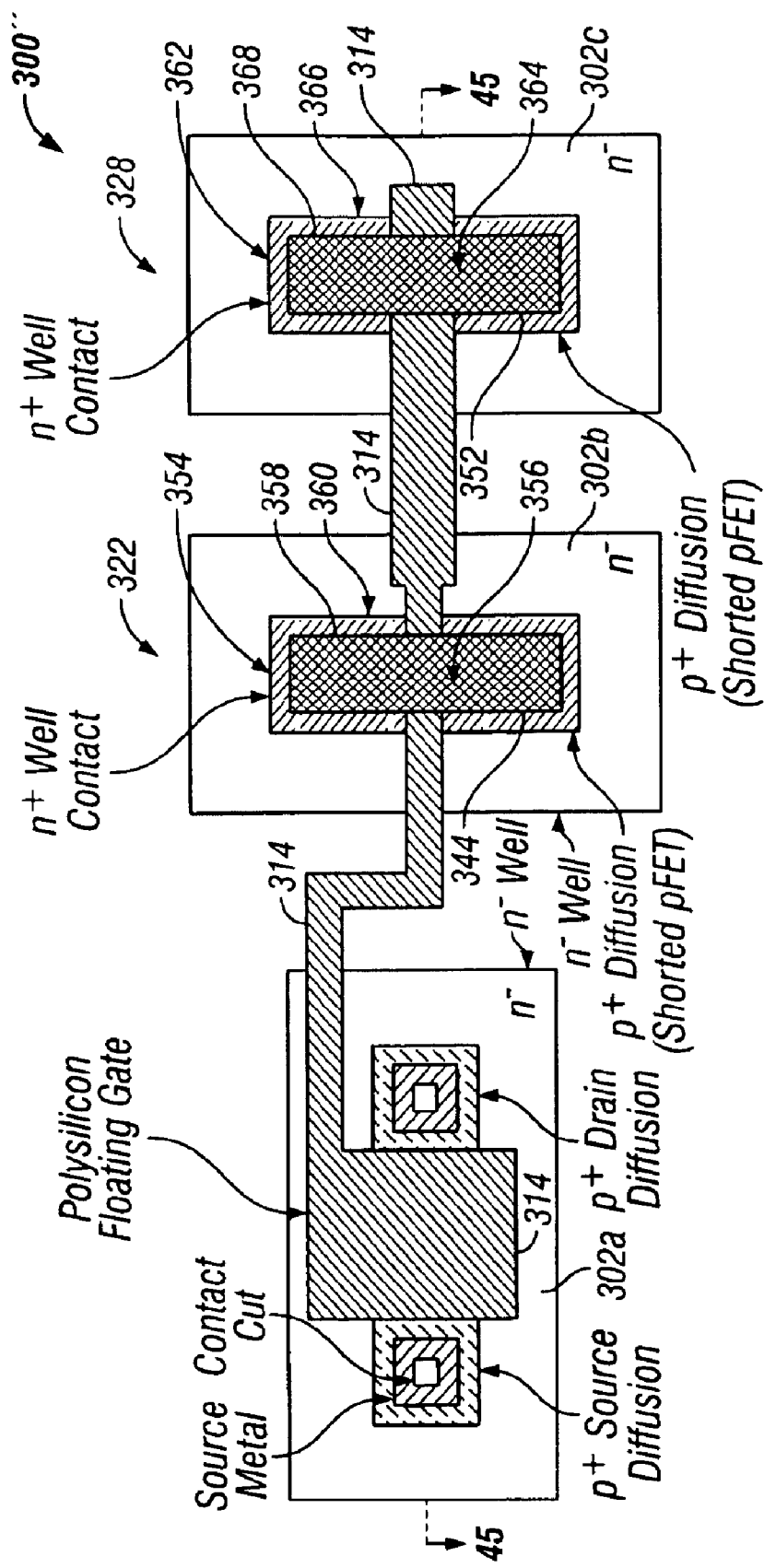
FIGS. 44 and 45 are, respectively, a top plan view and a side elevational cross-section of a single-layer polysilicon version of a device in accordance with an embodiment of the present invention. This version provides four terminals and utilizes a three-n– well approach to provide a separate control capacitor.
Figure 45:
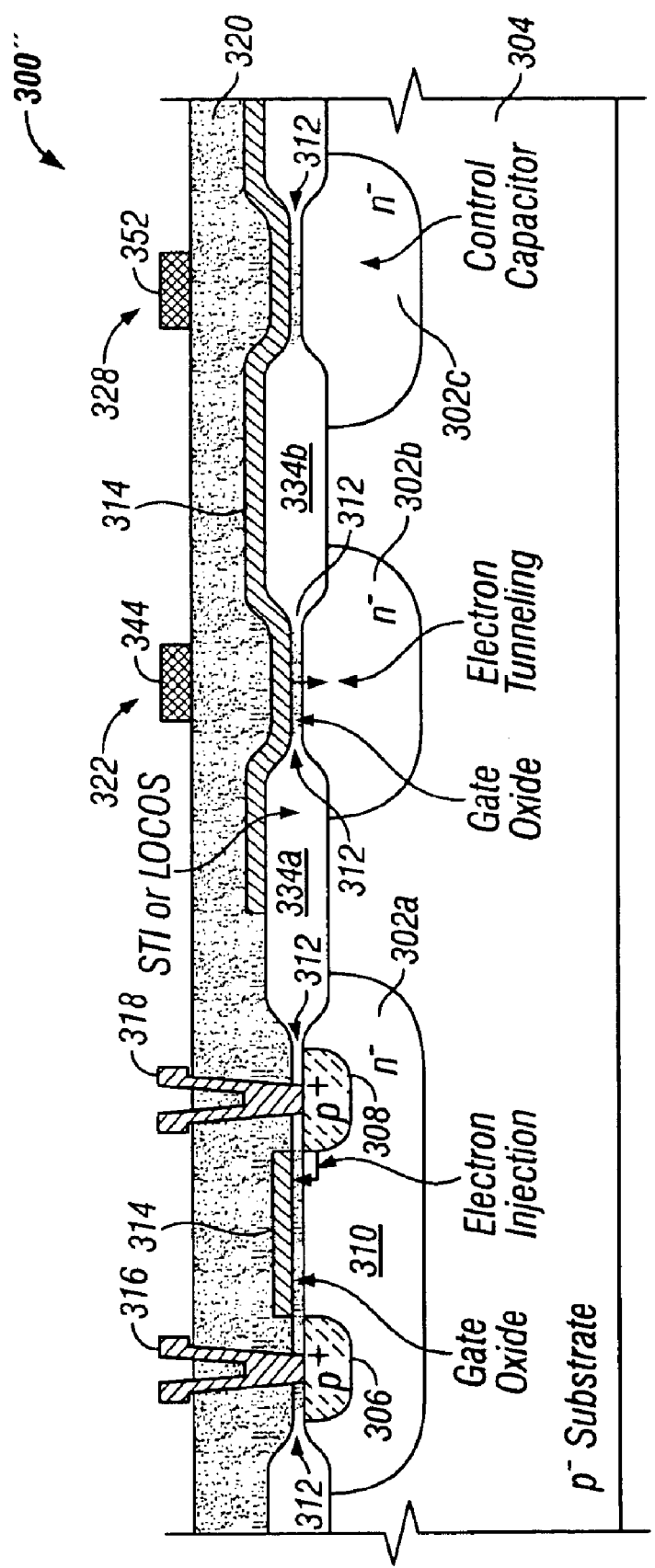

FIGS. 44 and 45 are, respectively, a top plan view and a side elevational cross-section of a single-layer polysilicon version of a device 300" in accordance with an embodiment of the present invention. This version provides four terminals and utilizes a three-n– well approach to provide a separate control capacitor between the floating gate and the n– well 302c as in the embodiment of FIGS. 42 and 43. In this embodiment, one or more of the electron tunneling portion 322 and the control capacitor portion 328 are implemented with a shorted pFET. The cross-sectional drawing of FIG. 45 is taken along line 45—45 of FIG. 44. In accordance with this embodiment, three n– doped wells 302a, 302b and 302c are formed in a p– doped substrate 304. In the first n– well 302a are disposed a pair of p+ doped regions 306, 308 which act as source and drain, respectively. A channel 310 is formed between source 306 and drain 308. IHEI occurs near drain 308. An insulator such as a silicon gate oxide layer 312 separates channel 310 from the polysilicon (poly) layer 314 which serves as a floating gate. No control gate is provided in this embodiment. Source 306 and drain 308 are supplied with contacts 316 and 318, respectively, in a conventional manner. A conventional insulation layer 320 is formed over floating gate 314, for example by thermally grown or deposited silicon oxide.

An electron tunneling junction 322 is provided in second well 302b and includes a shorted pFET transistor 354 having a p+ drain region 356, a p+ source region 358, an n+ well connection 360 and a shorting conductor 344 which also acts as a contact and shorts together the drain, source and well connections. Floating gate 314 is arranged to be separated from second well 302b by a gate oxide layer 312 to permit tunneling of electrons off of floating gate 314.

A separate control capacitor 328 is provided in third well 302c and includes a shorted pFET transistor 362 having a p+ drain region 364, a p+ source region 366, an n+ well connection 368 and a shorting conductor 352 which also acts as a contact and shorts together the drain, source and well connections. Floating gate 314 is arranged to be separated from third well 302c by a gate oxide layer 312 to provide the dielectric for the capacitor 328. Floating gate 314 overlies at least a portion of well 302c to provide capacitance.

In alternative embodiments, the capacitor sections 328 of the FIGS. 44/45 embodiments may be exchanged for those of the FIGS. 40/41 and/or FIGS. 42/43 embodiments and/or the electron tunneling sections 322 may be so exchanged so that both need not be implemented with a shorted pFET. Thus any of these versions may be used, as desired.

Wells 302a, 302b and 302c are separated from one another by channel stops 334a and 334b formed of STI or LOCOS. Floating gate 314 extends over the channel stops 334a and 334b as shown to couple together the electron injection portion of the device 336, the electron tunneling portion of the device 322 and the control capacitor portion of the device 328, as shown. It is also possible to arrange the various components differently on the substrate, as for example by having the control capacitor portion 328 disposed between the electron injection portion 336 and the electron tunneling portion 322, or by placing the electron injection portion 336 between the electron tunneling portion 322 and the control capacitor portion 328.

Figure 46:
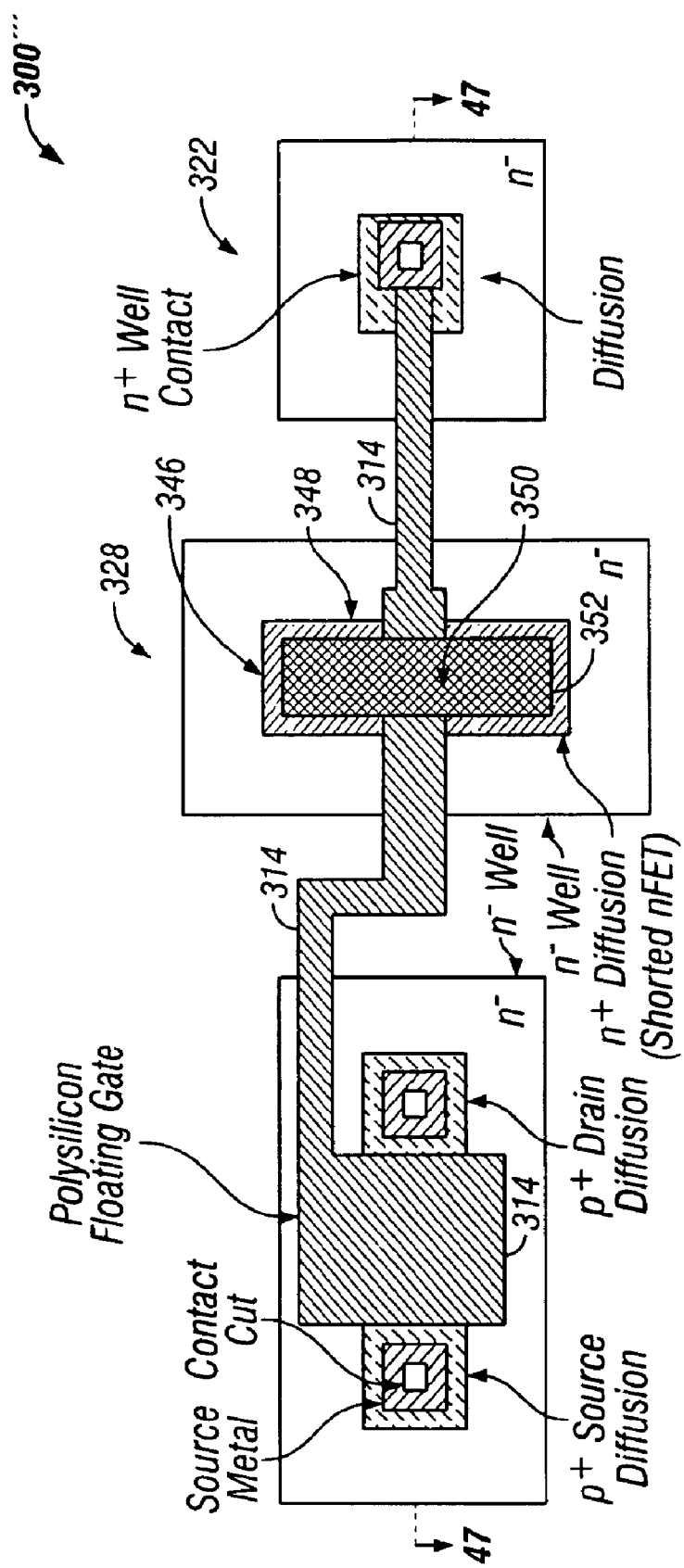
FIGS. 46 and 47 are, respectively, a top plan view and a side elevational cross-section of a single-layer polysilicon version of a device in accordance with an embodiment of the present invention. This version provides four terminals and utilizes a three-n– well approach to provide a separate control capacitor.
Figure 47:
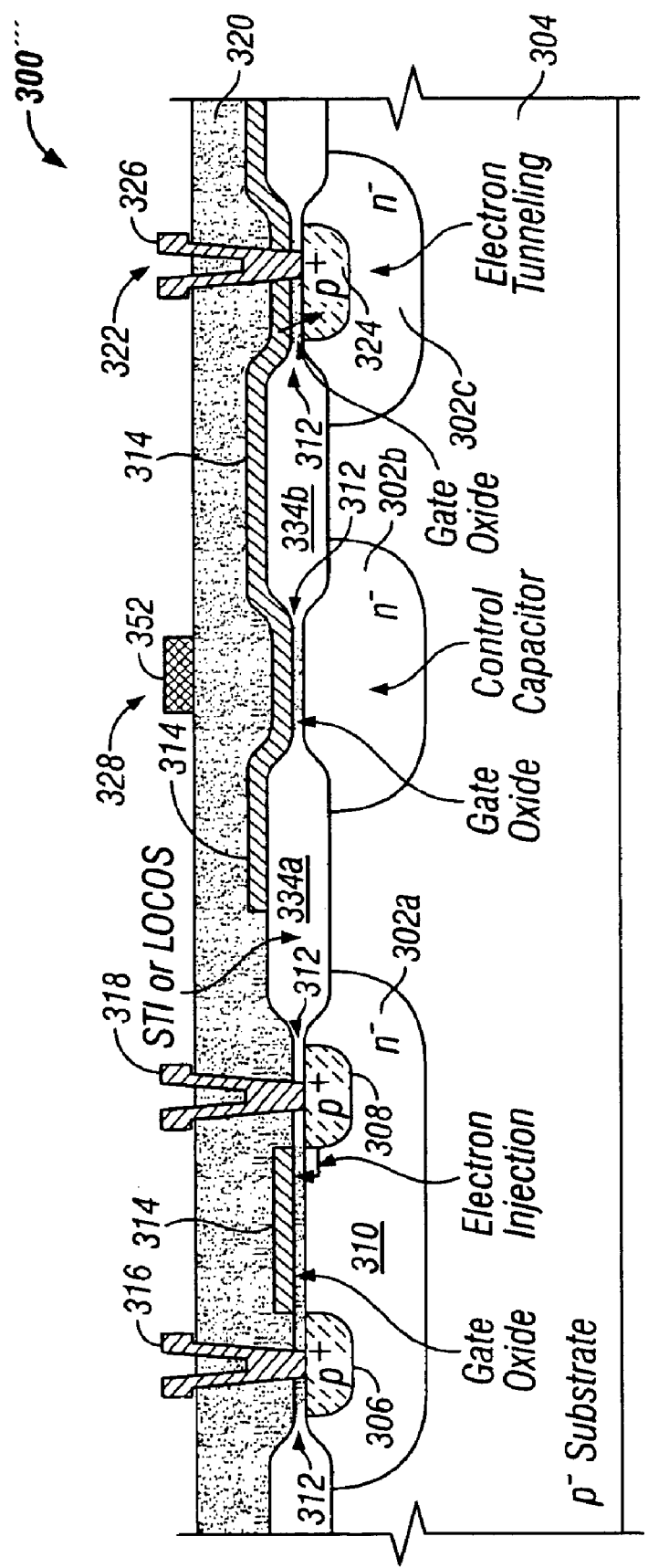

FIGS. 46 and 47 are, respectively, a top plan view and a side elevational cross-section of a single-layer polysilicon version of a device 300'" in accordance with an embodiment of the present invention. This version provides four terminals and utilizes a three-n– well approach to provide a separate control capacitor between the floating gate and the n– well 302c as in the embodiment of FIGS. 44 and 45. In this embodiment, the electron tunneling portion 322 is implemented as an n+ region in an n– well and the control capacitor portion 328 is with a shorted nFET. The cross-sectional drawing of FIG. 47 is taken along line 47—47 of FIG. 46. In accordance with this embodiment, three n– doped wells 302a, 302b and 302c are formed in a p– doped substrate 304. In the first n– well 302a are disposed a pair of p+ doped regions 306, 308 which act as source and drain, respectively. A channel 310 is formed between source 306 and drain 308. IHEI occurs near drain 308. An insulator such as a silicon gate oxide layer 312 separates channel 310 from the polysilicon (poly) layer 314 which serves as a floating gate. No control gate is provided in this embodiment. Source 306 and drain 308 are supplied with contacts 316 and 318, respectively, in a conventional manner. A conventional insulation layer 320 is formed over floating gate 314, for example by thermally grown or deposited silicon oxide.

An electron tunneling junction 322 is provided in third well 302c and includes an n+ region 324. Region 324 is separated from floating gate 314 by an insulator such as layer 312 (silicon gate oxide) to permit tunneling of electrons off of floating gate 314 and is provided with a contact 326.

A separate control capacitor 328 is provided in second well 302b and includes a shorted nFET transistor 346 having a n+ drain region 348, an n+ source region 350, and a shorting conductor 352 which also acts as a contact and shorts together the drain and source connections. Floating gate 314 is arranged to be separated from third well 302c by a gate oxide layer 312 to provide the dielectric for the capacitor 328. Floating gate 314 overlies at least a portion of well 302c to provide capacitance.

Wells 302a, 302b and 302c are separated from one another by channel stops 334a and 334b formed of STI or LOCOS. Floating gate 314 extends over the channel stops 334a and 334b as shown to couple together the electron injection portion of the device 336, the electron tunneling portion of the device 322 and the control capacitor portion of the device 328, as shown. It is also possible to arrange the various components differently on the substrate, as for example by having the control capacitor portion 328 disposed between the electron injection portion 336 and the electron tunneling portion 322, or by placing the electron injection portion 336 between the electron tunneling portion 322 and the control capacitor portion 328.

Figure 48:
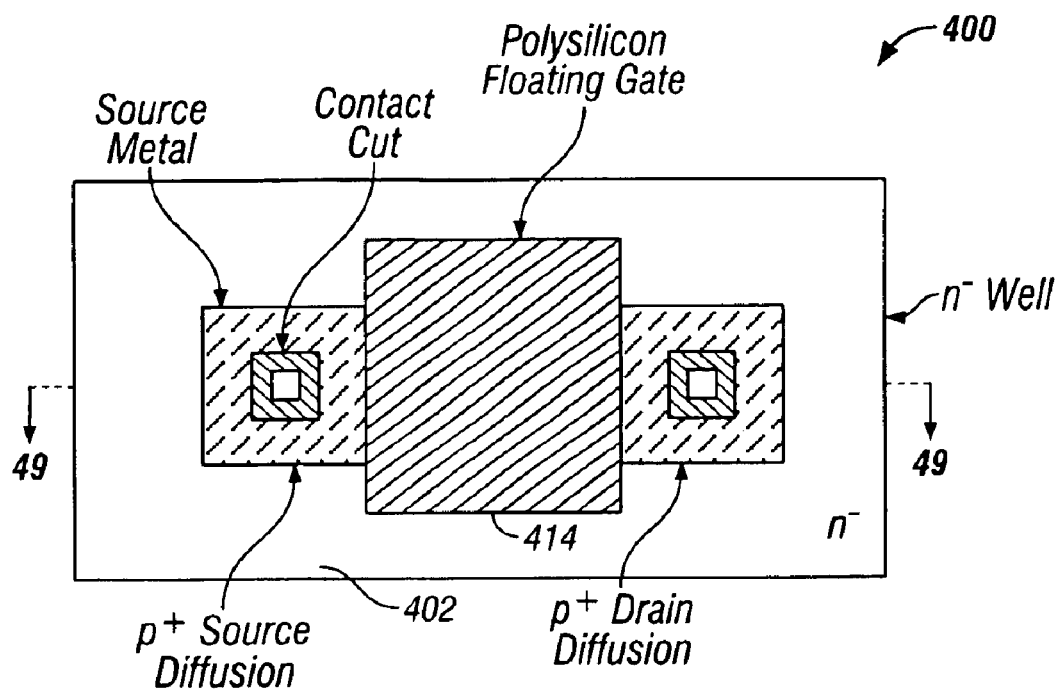
FIGS. 48 and 49 are, respectively, a top plan view and a side elevational cross-section of a single-layer polysilicon version of a device in accordance with an embodiment of the present invention. This version provides two terminals and utilizes a single-n– well approach. The tunneling junction is implemented using either ultraviolet or high-temperature erasure.
Figure 49:
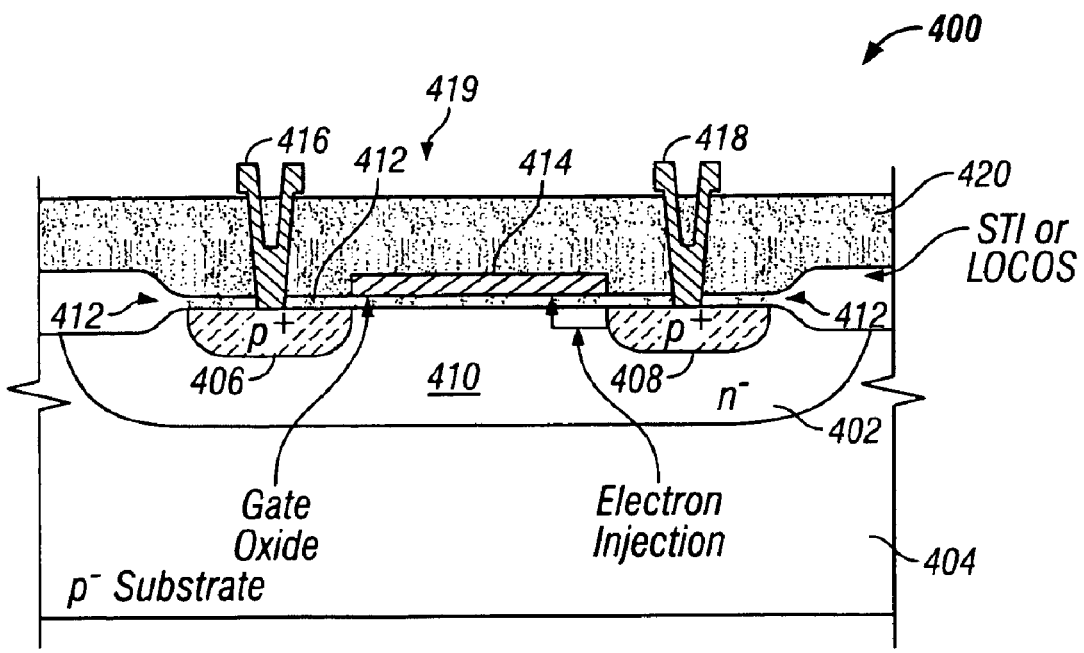

FIGS. 48 and 49 are, respectively, a top plan view and a side elevational cross-section of a single-layer polysilicon version of a device 400 in accordance with an embodiment of the present invention. This version provides two terminals and utilizes a single-n– well approach. The tunneling junction is implemented using either ultraviolet or high-temperature erasure. In this embodiment, electrons are removed from the gate by heating them or UV-erasing them as with well-known UV-eraseable Programmable Read Only Memories (PROMs). The cross-sectional drawing of FIG. 49 is taken along line 49—49 of FIG. 48. In accordance with this embodiment, a single n– doped well 402 is formed in a p– doped substrate 404. In the n– well 402 are disposed a pair of p+ doped regions 406, 408 which act as source and drain, respectively. A channel 410 is formed between source 406 and drain 408. IHEI occurs near drain 408. An insulator such as a silicon gate oxide layer 412 separates channel 410 from the polysilicon (poly) layer 414 which serves as a floating gate. No polysilicon control gate is provided in this embodiment. Source 406 and drain 408 are supplied with contacts 416 and 418, respectively, in a conventional manner. A conventional insulation layer 420 is formed over floating gate 414, for example by thermally grown or deposited silicon oxide. A window 419 may be provided in insulation layer 420 for photonic erasure of floating gate 414 in a conventional manner. It is also possible to combine this embodiment with the separate control capacitor element of some of the previous embodiments, if desired.

Figure 50:
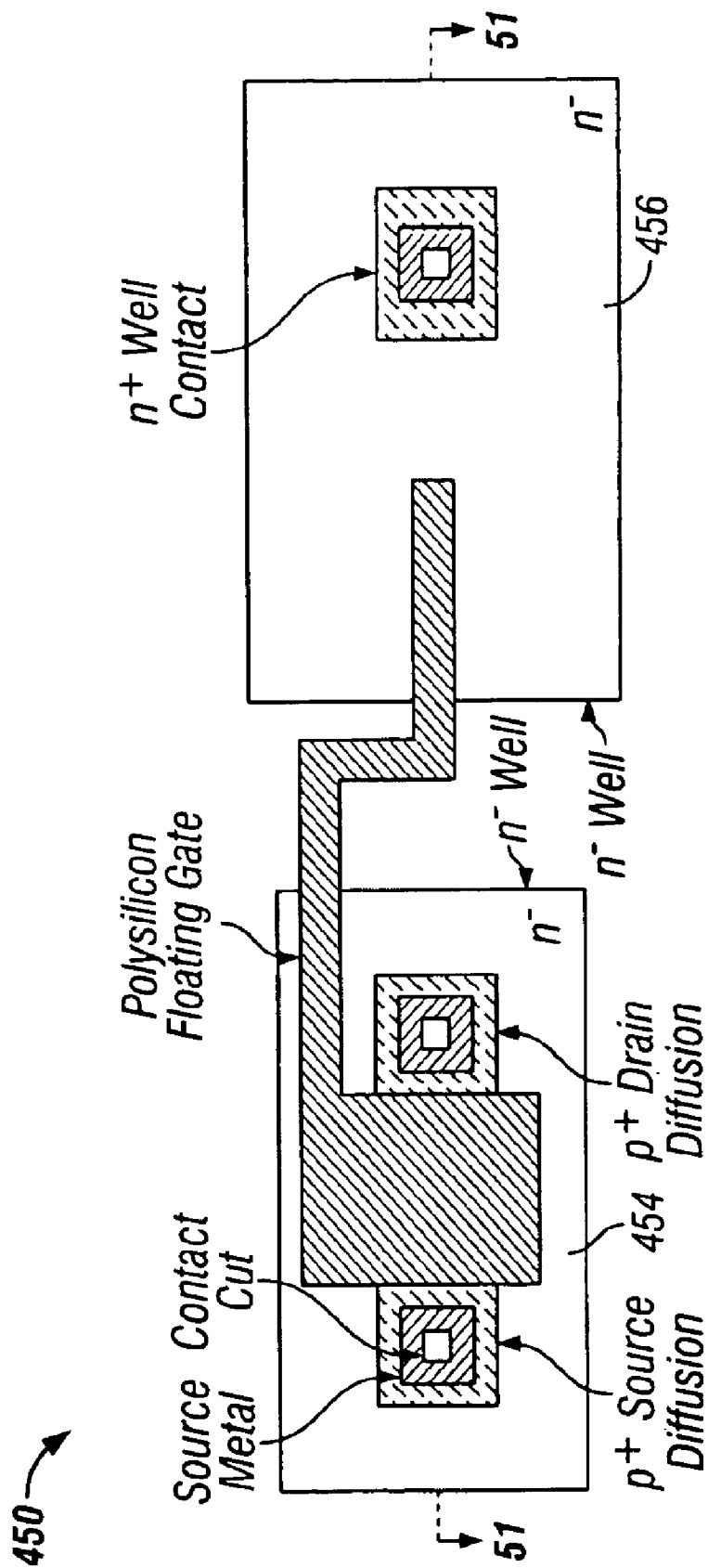
FIGS. 50 and 51 are, respectively, a top plan view and a side elevational cross-section of a single-layer polysilicon version of a device in accordance with an embodiment of the present invention. This version provides three terminals and utilizes a bowl-shaped tunneling junction.
Figure 51:
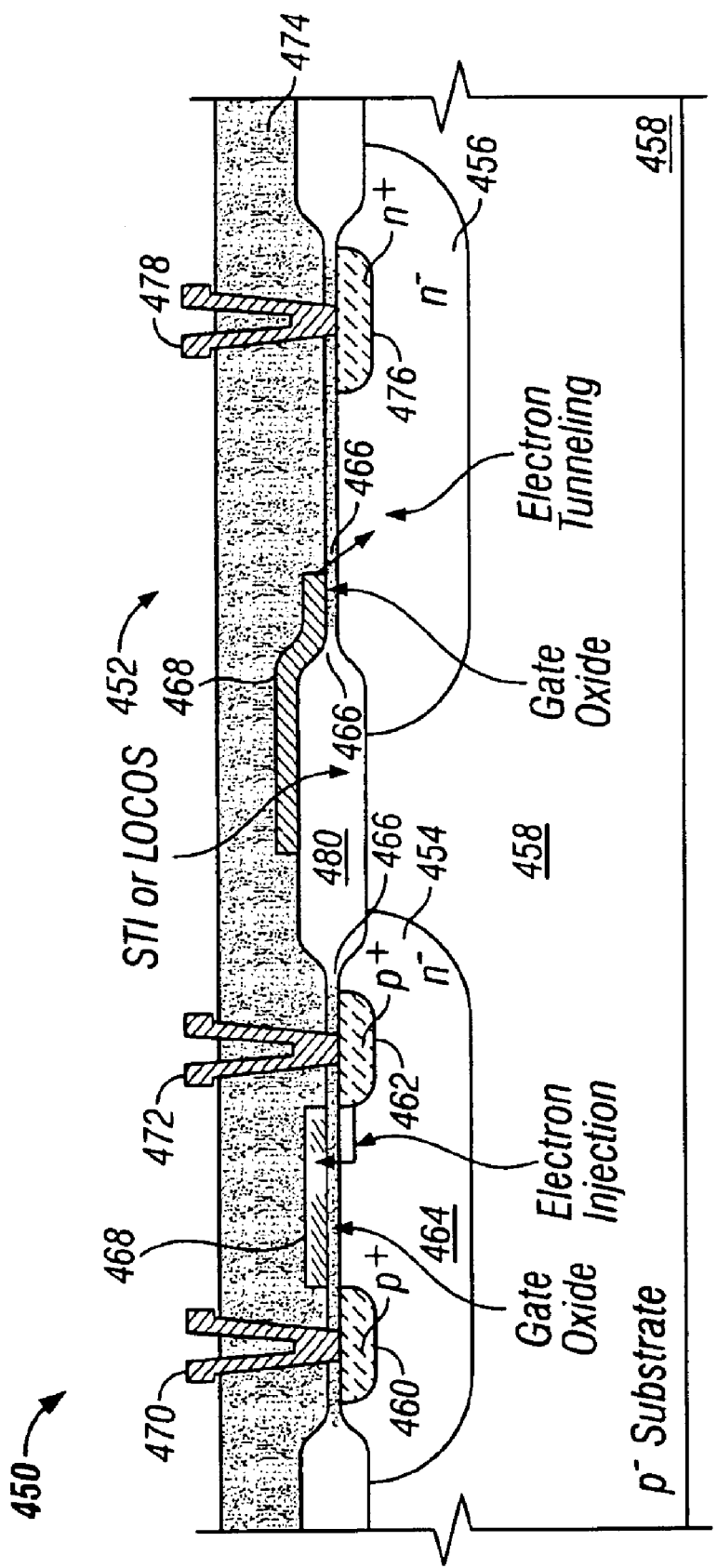

FIGS. 50 and 51 are, respectively, a top plan view and a side elevational cross-section of a single-layer polysilicon version of a device 450 in accordance with one embodiment of the present invention. This version provides three terminals and utilizes a bowl-shaped tunneling junction 452 in two n– wells. The cross-sectional drawing of FIG. 51 is taken along line 51—51 of FIG. 50. In accordance with this embodiment, a first and second n– well 454, 456 are formed in a p– doped substrate 458. In the first n– well 454 are disposed a pair of p+ doped regions 460, 462 which serve as a source and a drain, respectively. A channel 464 is formed between source 460 and drain 462. IHEI occurs near drain 462. An insulator such as a silicon dioxide gate oxide layer 466 separates channel 464 from the polysilicon layer 468 which serves as a floating gate. No control gate is provided in this embodiment. Source 460 and drain 462 are supplied with contacts 470 and 472, respectively, in a conventional manner. A conventional insulation layer 474 is formed over floating gate 468, for example by thermally grown or deposited silicon dioxide.

A bowl-shaped tunneling junction 452 is provided in second n– well 456 and includes an n+ doped region 476 and a contact 478. Floating gate 468 is arranged to be separated from second n– well 456 by a gate oxide layer 466 to permit tunneling of electrons off of floating gate 468 and into n– well 456. Floating gate 468 overlies at least a portion of n– well 456 but need not overlie n+ doped region 476. First n– well 454 and second n– well 456 are separated, as in several other embodiments described herein, by an STI or LOCOS channel stop 480.

Figure 52:
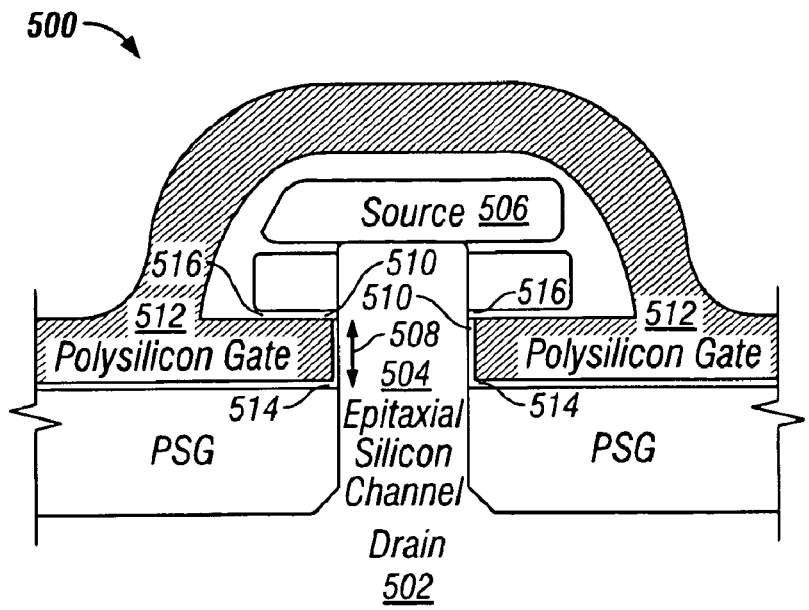
FIG. 52 illustrates a vertical replacement gate MOSFET device which may be used to fabricate some of the floating gate structures referred to herein.

FIG. 52 illustrates a vertical replacement gate MOSFET device 500 which may be used to fabricate some of the floating gate devices referred to herein. In this device, the transistor is formed vertically, rather than in a planar structure. In this structure, the drain 502 is located below the channel 504 and the source 506 is located above the channel 504. The gate length 508, is controlled by film thickness rather than lithography. This MOS device may also be used to fabricate floating gate devices as described above. The processing steps are summarized as follows. First, a trench is etched in a stack composed of two layers of phosphosilicate glass (PSG) separated by oxide. The trench is then filled with epitaxially grown silicon doped with boron (p type) to form the channel 504. The oxide between the two layers of PSG is a sacrificial layer whose thickness determines the gate length. This oxide is then removed, exposing the channel on two sides where the gate oxide 510 is then grown on the exposed silicon channel. Then the space left by the removal of the sacrifical oxide is replaced by amorphous silicon doped with phosphorous and recrystallized with a thermal processing step to form the gate 512. Silicon nitride layers 514, 516 insulate the gate 512 from adjacent structures.

Figure 53:
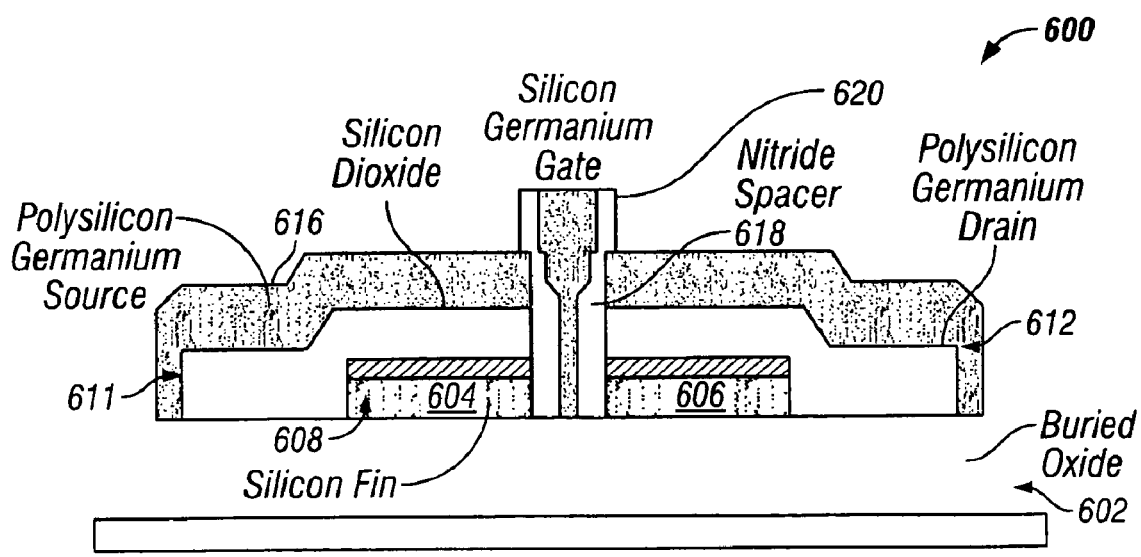
FIG. 53 depicts a FinFET device which may be used to fabricate some of the floating gate structures referred to herein.

FIG. 53 depicts a FinFET device 600 which may be used to fabricate some of the floating gate structures referred to herein. This device is fabricated using an insulating substrate 602 such as SOI (silicon on insulator). A thin silicon film 604 is placed on the insulating substrate and then silicon dioxide 606 is deposited. This structure is then etched to create a narrow fin 608. Once this step is completed, the source 610 and drain 612 are formed by depositing silicon-germanium 614 followed by more oxide 616. A nitride spacer 618 is then deposited and etched over part of the fin 608. Finally, the gate 620 is formed over the remaining exposed fin by deposition. In this manner, the gate forms a fork-like structure over the channel, creating a dual-gate FET. This device may also be used in floating gate applications.

Finally, CMOS silicon-on-sapphire (SOS) and silicon-on-insulator (SOI) technologies may also be used to fabricate floating gate devices. Both technologies use insulating substrate materials for isolating individual devices. In these approaches, an insulating material, typically silicon dioxide, is placed over the substrate material (either sapphire in SOS or silicon in SOI, and potentially other materials as will now be apparent to those of ordinary skill in the art). A thin silicon layer is then placed on top of the oxide. Transistors are then fabricated in a similar fashion to bulk CMOS processes. Floating gate devices may be used in these processes as well.

While embodiments and applications of this invention have been shown and described, it would be apparent to those skilled in the art having the benefit of this disclosure that many more modifications than mentioned above are possible without departing from the inventive concepts herein. For example, it is to be noted that while the present invention may be implemented in a single well single poly process and will work with low voltage processes (e.g., <=3 volts), the invention is not so limited and can be implemented in processes that support multiple polysilicon layers, multiple wells, and/or in higher voltage devices. Furthermore, the concept of an n– well as used herein is intended to encompass not only conventional n– well devices, but also NLDD (N-type Lightly Doped Drain)

devices and other lightly doped, or isolated structures that increase the reliable gate-drain and drain-source voltages of the device so that it, in effect, behaves like a conventional n-well device in this respect. Finally, those of ordinary skill in the art will now recognize that floating gates may be fabricated in a number of ways other than by heavily doped polycrystalline silicon. For example, they may be fabricated of metal or other conductors. The invention, therefore, is not to be restricted except in the spirit of the appended claims.

What is claimed is:

1. A floating gate semiconductor device comprising:
   a p− type substrate;
   a p+ type source region and a p+ type drain region disposed in a first n− type well region of said substrate;
   a channel disposed between said source region and said drain region;
   a first insulator disposed adjacent said channel;
   a floating gate disposed adjacent said insulator and electrically insulated from said channel by said insulator; and
   an n type tunneling region, said floating gate extending over of at least a portion of said tunneling region and electrically insulated therefrom by a second insulator, wherein said tunneling region is disposed in a second n− type well region of said substrate.

2. The device in accordance with claim 1, wherein said first well region and said well region are separated from one another by a channel block.

3. A device in accordance with claim 2, further comprising a first electrical contact electrically coupled to said drain region, a second electrical contact electrically coupled to said source region and a third electrical contact electrically coupled to said tunneling region.

4. A device in accordance with claim 3, wherein said channel block comprises a deposited silicon oxide.

5. A device in accordance with claim 3, wherein said channel block comprises a thermally grown silicon oxide.

6. A floating gate semiconductor device comprising:
   a p− substrate;
   a p+ type source region and a p+ type drain region disposed in a first n− type well region of said substrate;
   a channel disposed between said source region and said drain region;
   a first insulator disposed adjacent said channel;
   a floating gate disposed adjacent said insulator and electrically insulated from said channel by said insulator; and
   an n type tunneling region, said floating gate extending over at least a portion of said tunneling region and electrically insulated therefrom by a second insulator, wherein said tunneling region is disposed in an n+ doped region which is, in turn, disposed within a second n− type well region of said substrate.

7. A floating gate device, comprising:
   a semiconductor substrate;
   a first n− well disposed in said substrate;
   a second n− well disposed in said substrate;
   a first p+ region disposed in said first n− well;
   a second p+ region disposed in said first n− well;
   a channel region disposed between said first p+ region and said second p+ region;
   an insulator disposed above said channel;
   a floating gate disposed above said insulator;
   an insulator disposed over said floating gate;
   a first contact coupled to said first p+ region;
   a second contact coupled to said second p+ region;
   an n+ region disposed in said second n− well;
   a third contact coupled to said n+ region; and
   a portion of said floating gate disposed over at least a portion of said second n− well.

8. A floating gate device, comprising:
   a substrate;
   an n− well disposed in said substrate;
   a first p+ region disposed in said n− well;
   a second p+ region disposed in said n− well;
   a floating gate formed of polycrystalline silicon, the device including only a single layer of polycrystalline silicon;
   a first electrical contact coupled to said first p+ region; and
   a tunneling junction implemented with an n+ region disposed in an n− well.

9. The floating gate device in accordance with claim 8, wherein the n+ region is disposed in the same n− well as the first and second p+ regions.

10. The floating gate device in accordance with claim 9 wherein the tunneling junction is bowl shaped.

11. The floating gate device in accordance with claim 8, wherein the n+ region is disposed in an n− well distinct from the n− well in which are disposed the first and second p+ regions.

12. The floating gate device in accordance with claim 11 wherein the tunneling junction is bowl shaped.

13. The floating gate device in accordance with claim 8, wherein said tunneling junction is implemented with a shorted nFET.

14. The floating gate device in accordance with claim 8, wherein said tunneling junction is implemented with a shorted pFET.

15. The floating gate device in accordance with claim 8, wherein said floating gate is coupled to a MOSCAP.

16. A floating gate semiconductor device comprising:
   a p− type region;
   a p+ source region and a p+ type drain region disposed in a first n− type region of said p− type region;
   a channel disposed between said source region and said drain region;
   a first insulator disposed adjacent said channel;
   a floating gate disposed adjacent said insulator and electrically insulated from said channel by said insulator; and
   an n type tunneling region, said floating gate extending over at least a portion of said tunneling region and electrically insulated therefrom by a second insulator, wherein said tunneling region is disposed in a second n− type region of said p− type region.

17. The device in accordance with claim 16, wherein said first well region and said second well region are separated from one another by a channel block.

18. A device in accordance with claim 17, wherein said channel block comprises a deposited silicon oxide.

19. A device in accordance with claim 17, wherein said channel block comprises a thermally grown silicon oxide.

20. A floating gate semiconductor device comprising:
   a p− type region;
   a p+ type source region and a p+ type drain region disposed in a first n− type region which is, in turn, disposed within said p− type region;

a channel disposed between said source region and said drain region;

a first insulator disposed adjacent said channel.

21. A device in accordance with claim 20, further comprising a first electrical contact electrically coupled to said drain region, a second electrical contact electrically coupled to said source region and a third electrical contact electrically coupled to said tunneling region.

22. A floating gate device, comprising:

a first region of semiconductor material;

a first n− region disposed in said first region of semiconductor material;

a second n− region disposed in said first region of semiconductor material;

a first p+ region disposed in said first n− region;

a second p+ region disposed in said first n− region;

a channel region disposed between said first p+ region and second p+ region;

an insulator disposed adjacent said channel;

a floating gate disposed adjacent said insulator;

an insulator disposed adjacent said floating gate;

a first contact coupled to said first p+ region;

a second contact coupled to said second p+ region;

an n+ region disposed in said second n− region;

a third contact coupled to said n+ region; and a portion of said floating gated disposed to overlap at least a portion of said second n− region.

23. The floating gate device in accordance with claim 22 wherein said n+ region forms a tunneling junction that is bowl shaped.

24. A floating gate device comprising:

a semiconductor substrate;

an n− region disposed in said substrate;

a first p+ region disposed in said n− region;

a second p+ region disposed in said n− region;

a floating gate formed of polycrystalline silicon, the device including only a single layer of polycrystalline silicon;

a first electrical contact coupled to said first p+ region;

a second electrical contact coupled to said second p+ region; and a tunneling junction implemented with an n+ region disposed in an n− region.

25. The floating gate device in accordance with claim 24, wherein the n+ region is disposed in the same n− region as the first and second p+ regions.

26. The floating gate device in accordance with claim 24, wherein the n+ region is disposed in an n− region distinct from the n− region in which are disposed the first and second p+ regions.

27. The floating gate device in accordance with claim 24, wherein said tunneling junction is implemented with a shorted nFET.

28. The floating gate device in accordance with claim 24, wherein said tunneling junction is implemented with a shorted pFET.

29. The floating gate device in accordance with claim 24, wherein said floating gate is coupled to a MOSCAP.

30. The floating gate device in accordance with claim 24 wherein the tunneling junction is bowl shaped.

* * * * *